(12) United States Patent
Özis et al.

(10) Patent No.: US 7,203,629 B2
(45) Date of Patent: Apr. 10, 2007

(54) MODELING SUBSTRATE NOISE COUPLING USING SCALABLE PARAMETERS

(75) Inventors: Dicle Özis, Seattle, WA (US); Kartikeya Mayaram, Corvallis, OR (US); Terri Fiez, Corvallis, OR (US)

(73) Assignee: State of Oregon Acting by and Through the Oregon State Board of Higher Education on Behalf of Oregon State University, Corvallis, OR (US)

( * ) Notice: Subject to any disclaimer, the term of this patent is extended or adjusted under 35 U.S.C. 154(b) by 518 days.

(21) Appl. No.: 10/683,575

(22) Filed: Oct. 9, 2003

(65) Prior Publication Data

US 2004/0117162 A1 Jun. 17, 2004

Related U.S. Application Data

(60) Provisional application No. 60/422,145, filed on Oct. 28, 2002, provisional application No. 60/417,518, filed on Oct. 9, 2002.

(51) Int. Cl.
*G06F 17/10* (2006.01)
*G06F 17/50* (2006.01)
(52) U.S. Cl. .................. 703/2; 703/14; 716/2
(58) Field of Classification Search .............. 703/2, 703/13, 14, 16; 716/4, 19, 2; 700/121; 702/57
See application file for complete search history.

(56) References Cited

U.S. PATENT DOCUMENTS

| 6,725,185 B2* | 4/2004 | Clement | 703/14 |
| 6,895,344 B2* | 5/2005 | Ramaswamy | 702/57 |
| 6,941,258 B2* | 9/2005 | Van Heijningen et al. | 703/16 |
| 7,016,820 B2* | 3/2006 | Kimura et al. | 703/2 |
| 2001/0029601 A1* | 10/2001 | Kimura et al. | 716/19 |

OTHER PUBLICATIONS

Becer et al., M. Analysis of Noise Avoidance Techniques in DSM Interconnects Using a Complete Crosstalk Noise Model, Proceedings of the Conference on Design, Automation and Test in Europe, IEEE Computer Society, Mar. 2002, pp. 1-8.*

Costa et al., J.P. Precorrected-DCT Techniques for Modeling and Simulation of Substrate Coupling in Mixed-Signal IC, Proceedings of the 1998 IEEE International Symposium on Circuits and Systems, vol. 6, May-Jun. 1998, pp. 358-362.*

Koukab et al., A. HspeedEx: A High Speed Extractor for Substrate Noise Analysis in Complex Mixed-Signal SOC, IEEE, Proceedings of the 39th Design Automation Conference, Jun. 2002, pp. 767-770.*

(Continued)

*Primary Examiner*—Russell Frejd
(74) *Attorney, Agent, or Firm*—Klarquist Sparkman, LLP

(57) ABSTRACT

Methods and apparatus for substrate modeling are disclosed. In one disclosed method, for example, the substrate modeling comprises determining scalable Z parameters associated with at least two substrate contacts, constructing a matrix of the scalable Z parameters for the at least two substrate contacts, and calculating an inverse of the matrix to determine resistance values associated with the at least two substrate contacts. Computer-readable media containing computer-executable instructions for causing a computer system to perform any of the described methods are also disclosed.

69 Claims, 30 Drawing Sheets

OTHER PUBLICATIONS

Chou et al., M. Multilevel Integral Equation Methods for the Extraction of Substrate Coupling Parameters in Mixed-Signal IC's, IEEE, Design Automation Conference, Jun. 1998, pp. 20-25.*

Blalack et al., "Experimental Results and Modeling of Noise Coupling in a Lightly Doped Substrate," IEEE IEDM 96, pp. 623-626 (1996).

Blalack, "Switching Noise in Mixed-Signal Integrated Circuits," Department of Electrical Engineering, Stanford University, 3 pp. from http://cis.stanford.edu/icl/wooley-grp/tallis/tallis.html (accessed on Feb. 18, 2004).

Blalack et al., "The Effects of Switching Noise on an Oversampling A/D Converter," 1995 IEEE International Solid-State Circuits Conference, pp. 200-201, 367 (1995).

Charbon et al., "Substrate Optimization Based on Semi-Analytical Techniques," IEEE Trans. Computer-Aided Design of Integrated Circuits and Systems, vol. 18, No. 2, pp. 172-190 (Feb. 1999).

Costa et al., "Efficient Techniques for Accurate Modeling and Simulation of Substrate Coupling in Mixed-Signal IC's," IEEE Trans. Computer-Aided Design, vol. 18, No. 5, pp. 597-607 (May 1999).

Gharpurey et al., "Modeling and Analysis of Substrate Coupling in Integrated Circuits," IEEE 1995 Custom Integrated Circuits Conference, pp. 125-128 (1995).

Gharpurey et al., "Modeling and Analysis of Substrate Coupling in Integrated Circuits," IEEE Journal of Solid-State Circuits, vol. 31, No. 3, pp. 344-353 (Mar. 1996).

Hewlett Packard, "S-Parameter Techniques for Faster, More Accurate Network Design," Test & Measurement Application Note 95-1 (1997).

Joardar, "A Simple Approach to Modeling Cross-Talk in Integrated Circuits," IEEE Journal of Solid-State Circuits, vol. 29, No. 10, pp. 1212-1219 (Oct. 1994).

Johnson et al., "Chip Substrate Resistance Modeling Technique for Integrated Circuit Design," IEEE Transactions on Computer-Aided Design, vol. CAD-3, No. 2, pp. 126-134 (Apr. 1984).

Kwan et al., "Simulation and Analysis of Substrate Coupling in Realistically-Large Mixed-A/D Circuits," IEEE Symposium on VLSI Circuits Digest of Technical Papers, pp. 184-185 (1996).

Merrill et al., "Effect of Substrate Material on Crosstalk in Mixed Analog/Digital Integrated Circuits," IEEE IEDM 94, pp. 433-436 (1994).

Mitra et al., "A Methodology for Rapid Estimation of Substrate-Coupled Switching Noise," IEEE 1995 Custom Integrated Circuits Conference, pp. 129-132 (1995).

Öziç, Dicle "An Efficient Modeling Approach for Substrate Noise Coupling Analysis with Multiple Contacts in Heavily Doped CMOS Processes," Masters Thesis, Oregon State University, OR, 93 pp. (2002).

Öziç, et al., "A Comprehensive Geometry-Dependent Macromodel for Substrate Noise Coupling in Heavily Doped CMOS Processes," IEEE 2002 Custom Integrated Circuits Conference, pp. 497-500 (2002).

Öziç, et al., "An Efficient Modeling Approach for Substrate Noise Coupling Analysis," IEEE ISAS, pp. 237-240 (May 2002).

Pfost et al., "Modeling Substrate Effects in the Design of High-Speed Si-Bipolar IC's," IEEE Journal of Solid-State Circuits, vol. 31, No. 10, pp. 1493-1501 (Oct. 1996).

Pun et al., "Experimental Results and Simulation of Substrate Noise Coupling via Planar Spiral Inductor in RF ICs," IEEE IEDM 97, pp. 325-328 (1997).

Raskin et al., "Coupling Effects in High-Resistivity Simox Substrates for VHF and Microwave Applications," Proceedings 1995 IEEE International SOI Conference, pp. 62-63 (Oct. 1995).

Raskin et al., "Substrate Crosstalk Reduction Using SOI Technology," IEEE Transactions on Electron Devices, vol. 44, No. 12, pp. 2252-2261 (Dec. 1997).

Sadate, "A Substrate Noise Coupling Model for Lightly Doped CMOS Processes," Masters Thesis, Oregon State University, OR, 56 pp. (2001).

Samavedam et al., "A Scalable Substate Noise Coupling Model for Mixed-Signal ICs," IEEE Transactions on Computer-Aided Design of Integrated Circuits and Systems, pp. 128-131 (1999).

Silveira et al., "Efficient Reduced-Order Modeling of Frequency-Dependent Coupling Inductances Associated with 3-D Interconnect Structures," IEEE/ACM Proc. DAC, pp. 376-380 (Jun. 1995).

Smedes et al., "Boundary Element Methods for 3D Capacitance and Substate Resistance Calculations in Inhomogeneous Media in a VLSI Layout Verification Package," Advances in Engineering Software, vol. 20, No. 1, pp. 19-27 (1994).

Smedes et al., "Layout Extraction of 3D Models for Interconnect and Substrate Parasitics," ESSDERC '95 25th European Solid State Device Research Conference, 4 pp. (Sep. 1995).

Stanisic et al., "Addressing Substrate Coupling in Mixed-Mode IC's: Simulation and Power Distribution Synthesis," IEEE Journal of Solid-State Circuits, vol. 29, No. 3, pp. 226-238 (Mar. 1994).

Su et al., "Experimental Results and Modeling Techniques for Substrate Noise in Mixed-Signal Integrated Circuits," IEEE Journal of Solid-State Circuits, vol. 28, No. 4, pp. 420-430 (Apr. 1993).

van Genderen et al., "Modeling Substrate Coupling Effects using a Layout-to-Circuit Extraction Program," Proceedings of the ProRISC Workshop on Circuits, Systems, and Signal Processing, pp. 173-178 (1997).

Verghese et al., "Computer-Aided Design Considerations for Mixed-Signal Coupling in RF Integrated Circuits," IEEE Journal of Solid-State Circuits, vol. 33, No. 3, pp. 314-323 (Mar. 1998).

Verghese et al., "Fast Parasitic Extraction for Substrate Coupling in Mixed-Signal ICs," IEEE 1995 Custom Integrated Circuits Conference, pp. 121-124 (1995).

Verghese et al., "Verification Techniques for Substrate Coupling and Their Application to Mixed-Signal IC Design," IEEE Journal of Solid-State Circuits, vol. 31, No. 3, pp. 354-355 (Mar. 1996).

Viviani et al., "Extended Study of Crosstalk in SOI-SIMOX Substrates," IEEE IEDM 95, pp. 713-716 (1995).

Wemple et al., "Mixed-Signal Switching Noise Analysis Using Voronoi-Tessellated Substrate Macromodels," 32nd Design Automation Conference, 6 pp. (1995).

* cited by examiner

FIG. 8
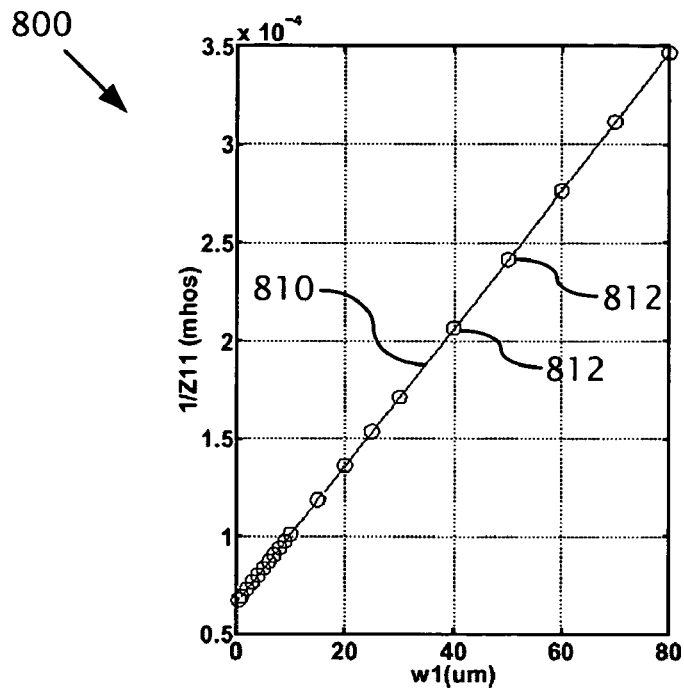
FIGS. 9A-D
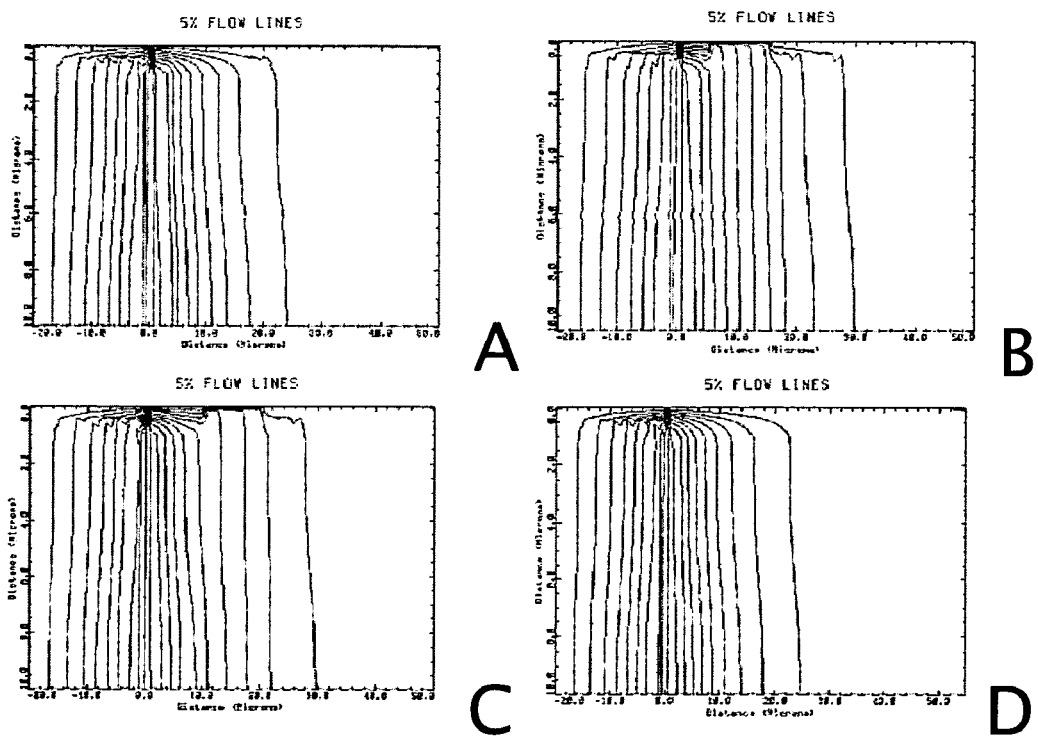

FIG. 18
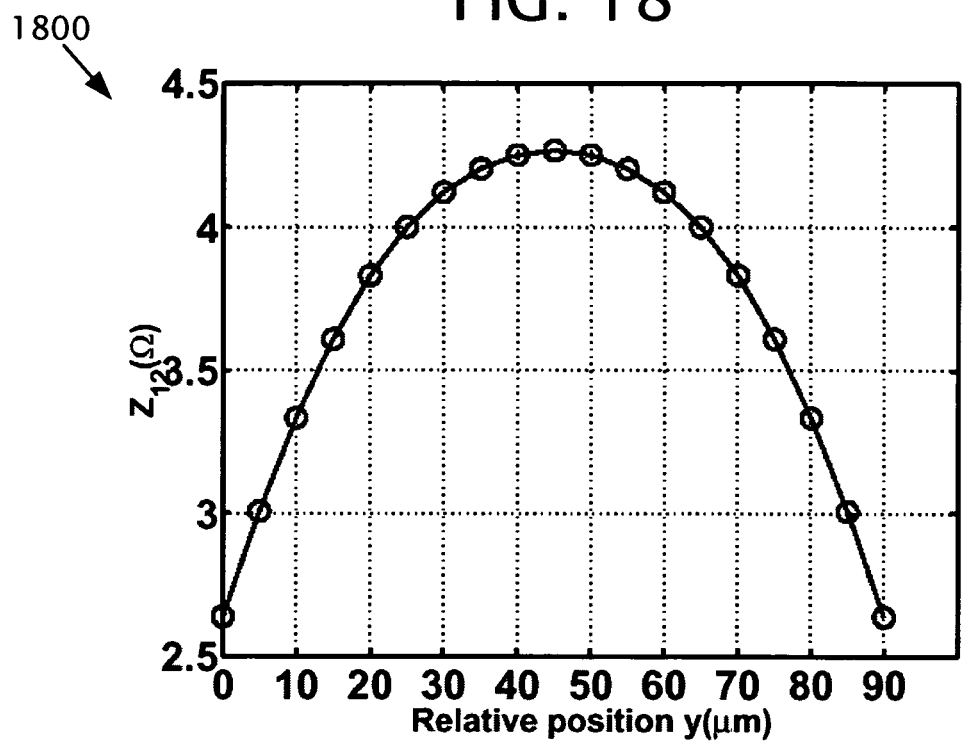
FIGS. 19A-C
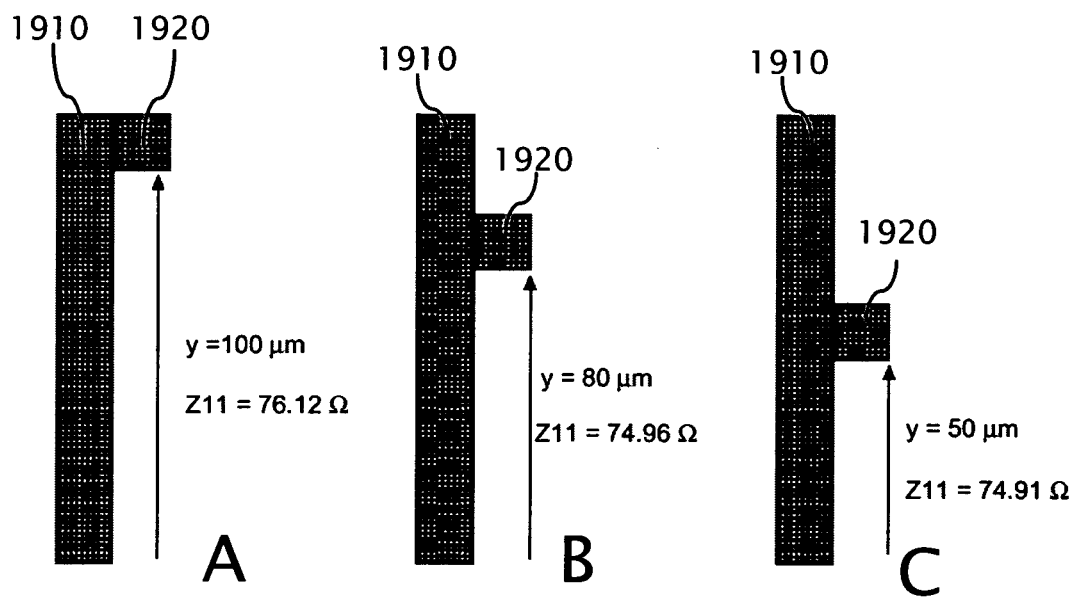

FIG. 36A (PRIOR ART)
FIG. 36B
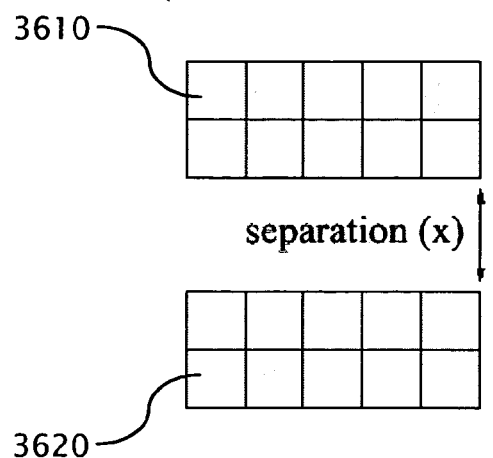
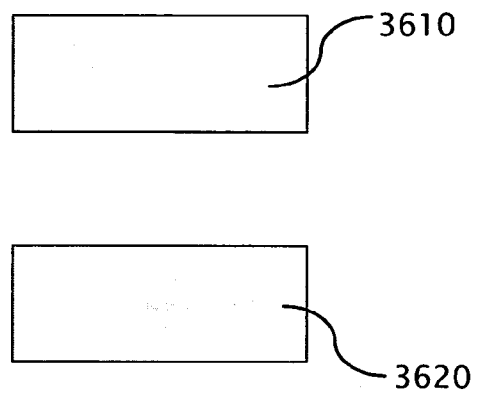
FIG. 37A
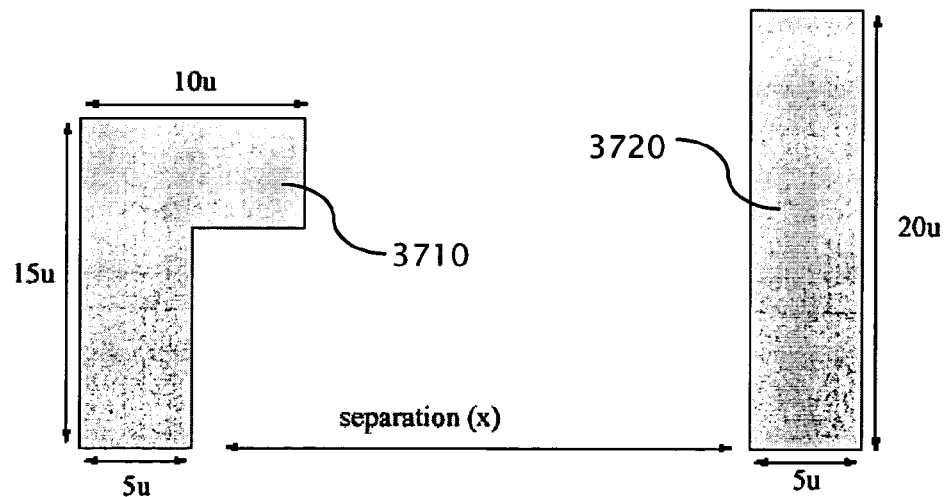

MODELING SUBSTRATE NOISE COUPLING USING SCALABLE PARAMETERS

CROSS REFERENCE TO RELATED APPLICATION

This application claims the benefit of U.S. Provisional Application No. 60/417,518, filed Oct. 9, 2002, and U.S. Provisional Application No. 60/422,145, filed Oct. 28, 2002, both of which are incorporated herein by reference.

BACKGROUND

In modern integrated-circuit design, it is possible to integrate digital, analog, and RF circuitry onto a single chip. As a result of such integration, however, digital circuitry can inject noise through the common substrate that affects the sensitive analog and RF circuitry. This substrate noise coupling can severely degrade the performance of noise-sensitive circuits. Accordingly, substrate-noise-coupling analysis is becoming an important part of the design flow of integrated circuits. Typically, the effects of substrate coupling at low frequencies (e.g., up to 2–3 GHz) can be verified by computing the substrate resistances between all circuit parts that inject noise into the substrate or that are sensitive to noise.

Some of the most commonly used methods to analyze substrate noise coupling involve costly trial-and-error procedures due to the lack of an efficient substrate-network extractor for practical circuits. Consequently, integrated-circuit designs are often delayed and engineering time increased. To solve this problem, other techniques have been proposed for computing substrate noise coupling.

For instance, some known techniques involve a detailed numerical analysis of substrate noise coupling. In one approach, a device simulator is used to obtain a full numerical simulation of currents and potentials in the substrate. In this method, the entire substrate is discretized, or meshed, into smaller data points, thereby creating large resistance and capacitance matrices. The mesh definition plays an important role in this technique because it involves a tradeoff between accuracy and computational efficiency. Consequently, this technique is impractical for large circuit designs.

Another known method for calculating the substrate network is the so-called boundary-element method ("BEM"). The BEM requires meshing only for the contacts and results in a small, but dense, Z matrix. In order to calculate substrate resistances, the inverse Z matrix has to be computed. Dense matrix inversion, however, has a computational complexity of $O(N^3)$ where N is the matrix dimension. Consequently, this method is computationally intensive for large circuit designs.

Another technique (the "preprocessed BEM"), involves first obtaining Z parameters from polynomial curve fitting. This method provides a simpler estimation of Z parameters, but requires models for different geometries and spacings to be computed and stored in a design-tool library. These libraries have to be adapted to each process. Accordingly, the preprocessed BEM is not efficient for large designs.

An alternate approach to these methods uses a scalable resistance-based model for substrate-resistance extraction. In one such approach, a scalable resistance-based model is used to predict substrate noise coupling between contacts in a heavily doped or lightly doped CMOS process. This scalable model, however, was developed for two contacts using a two-port resistive model, and cannot be used for multiple contacts or account for three-dimensional variations in contact architecture.

SUMMARY

In view of the issues and concerns described above, various substrate modeling methods and apparatus are disclosed. One of the disclosed methods comprises determining scalable Z parameters associated with at least two substrate contacts, constructing a matrix of the scalable Z parameters for the at least two substrate contacts, and calculating an inverse of the matrix to determine resistance values associated with the at least two substrate contacts. The substrate can be a heavily doped substrate or a lightly doped substrate. In some embodiments, the matrix is an N×N matrix, where N is the number of contacts. In other embodiments, the act of determining comprises dividing a first contact into smaller portions (e.g., rectangular or square portions), and determining respective Z parameters between the smaller portions and a second contact. In still other embodiments, three scalable Z parameters are determined for a first contact and a second contact of the at least two contacts. For example, a first of the scalable Z parameters can be a ratio of an open-circuit voltage at the first contact to an input current at the first contact, a second of the scalable Z parameters can be a ratio of an open-circuit voltage at the second contact to an input current at the second contact, and a third of the scalable Z parameters can be a ratio of an open-circuit voltage at the first contact to a source current at the second contact. In other embodiments, at least one of the scalable Z parameters is a function of contact area and contact perimeter, or at least one of the Z parameters is a function of contact geometry and contact separation. In yet another embodiment, the scalable Z parameters comprise a first set of scalable Z parameters associated with resistances between the at least two substrate contacts and a groundplane, and a second set of scalable Z parameters associated with cross-coupling resistances between the at least two substrate contacts. The scalable Z parameters of the first set can be based on a first model equation and the scalable Z parameters of the second set can be based on a second model equation. For example, in one embodiment, the first model equation can be $$Z = \frac{1}{K_1 \text{Area} + K_2 \text{Perimeter} + K_3},$$

wherein Z is a ratio of an open-circuit voltage to input current for a selected contact with other contacts being open circuits, Area is an area of the selected contact, Perimeter is a perimeter of the selected contact, and $K_1$, $K_2$, and $K_3$ are parameters that are dependent on substrate properties and, in one certain embodiment, can be determined by curve fitting based on a simulation. In another embodiment, in which the substrate is a lightly doped substrate, the first model equation is $$Z = \frac{1}{K_1 \text{Perimeter} + K_2},$$

wherein Z is a ratio of an open-circuit voltage to an input current for a selected contact with other contacts being open circuits, Perimeter is a perimeter of the selected contact, and $K_1$ and $K_2$ are parameters that are dependent on substrate properties and, in one certain embodiment, can be determined by curve fitting based on a simulation. In still another embodiment, the second model equation for a selected pair of contacts having a fixed relative position y is $$Z=\alpha e^{-\beta x},$$

wherein Z is a ratio of an open-circuit voltage at a first contact to a source current at a second contact, x is a separation between the first contact and the second contact, a is a value of Z when x is zero, and β is a parameter that is dependent on substrate properties and, in one certain embodiment, can be determined by curve fitting based on a simulation or a measurement. In one alternative of this embodiment, the first contact and the second contact have a same size. In yet another embodiment, the second model equation for a selected pair of contacts having a fixed separation x is $$Z=ay^2+by+c,$$

wherein Z is a ratio of an open-circuit voltage at a first contact to a source current at a second contact, y is a relative position between the first contact and the second contact, and a, b, and c are scalable parameters that substantially depend on contact dimensions and, in one certain embodiment, can be at least partially determined by curve fitting based on a simulation or a measurement. In one alternative of this embodiment, a size of the first contact is different than a size of the second contact. In still another embodiment, the second model equation for a selected pair of contacts is $$Z=[ay^2+by+c]e^{-\beta(x-x_a)},$$

wherein Z is a ratio of an open-circuit voltage at a first contact to a source current at a second contact, y is a relative position between the first contact and the second contact, a, b, and c are scalable parameters for the substrate that depend on contact dimensions, x is a separation between the first contact and the second contact, $x_a$ is a value of x used in determining a, b, and c, and β is a parameter that is dependent on substrate properties. In a certain embodiment, at least one of the parameters a, b, c or β is determined by curve fitting based on a simulation. In one alternative of this embodiment, a size of the first contact is different than a size of the second contact. In yet another embodiment in which the substrate is a lightly doped substrate, the second model equation for a selected pair of contacts having a fixed relative position y is $$Z=\alpha K_0(\beta x),$$

wherein Z is a ratio of an open-circuit voltage at a first contact to a source current at a second contact, $K_0$ is a 0th-order Bessel function of the second kind, x is a separation between the first contact and the second contact, and α and β are parameters that are dependent on substrate properties. In another embodiment in which the substrate is lightly doped, the second model equation for a selected pair of contacts predicts a value Z as a function of a separation x between the first contact and the second contact, wherein Z is a ratio of an open-circuit voltage at a first contact to a source current at a second contact, and log(Z) has a linear behavior when x is greater than a certain value and an asymptotic-like behavior when x is less than the certain value.

Another disclosed method of substrate modeling comprises determining scalable parameters associated with at least two substrate contacts (where at least one of the scalable parameters is scalable with a contact perimeter), constructing a matrix of the scalable parameters for the at least two substrate contacts, and calculating an inverse of the matrix to determine resistance values associated with the at least two substrate contacts. In one embodiment, the scalable parameters are Z parameters. In another embodiment, at least one of the scalable parameters is scalable with a contact separation. The scalable parameters can comprise a first set of scalable parameters associated with resistances between the at least two substrate contacts and a groundplane, and a second set of scalable parameters associated with cross-coupling resistances between the at least two substrate contacts.

Yet another disclosed method of substrate modeling comprises determining scalable parameters associated with at least three substrate contacts, constructing a matrix of the scalable parameters representative of the at least three substrate contacts, and calculating resistance values associated with the at least three substrate contacts from the matrix. In one embodiment of this method, the scalable parameters are Z parameters.

Methods for determining a scalable Z parameter for a contact in a substrate, wherein the scalable Z parameter is associated with a resistance between the contact and a groundplane, are also disclosed. The methods comprise modeling the Z parameter as a function of contact area and contact perimeter (the function comprising at least one coefficient that is dependent on properties of the substrate), obtaining a plurality of sample data points for the Z parameter in the substrate (the sample data points being obtained for a range of contact sizes), and determining values of the multiple coefficients such that the function produces a curve that fits the sample data points. In one embodiment, the range of contact sizes is from about 2.4 μm to about 100 μm. In another embodiment, the contacts are square or rectangular. In still another embodiment, at least a portion of the sample data points are obtained from a simulation. In one particular embodiment, the function is $$Z=\frac{1}{K_1 \text{Area} + K_2 \text{Perimeter} + K_3},$$

wherein Z is a ratio of an open-circuit voltage to input current for the contact with all other contacts in the substrate being open circuits, Area is the contact area, Perimeter is the contact perimeter, and $K_1$, $K_2$, and $K_3$ are coefficients that are dependent on the properties of the substrate.

Methods for determining a scalable Z parameter for a pair of contacts in a substrate, wherein the scalable Z parameter is associated with a cross-coupling resistance between a first contact and a second contact of the pair of contacts, are also disclosed. The methods comprise modeling the Z parameter as a function of a separation x between the first contact and the second contact (the function including multiple coefficients, wherein at least one of the multiple coefficients is dependent on properties of the substrate), obtaining a plurality of sample data points for the Z parameter (the sample data points being obtained for a range of separations x between the first contact and the second contact), and determining values of the multiple coefficients such that the function produces a curve that fits the sample data points. In one embodiment, the first contact and the second contact have a same size. In another embodiment, the range of separations x comprises values of x substantially equal to or greater then 10 µm. In yet another embodiment, the range of separations x is from about 10 µm to about 120 µm. In still another embodiment, at least a portion of the sample data points are obtained from a simulation. In one particular embodiment, the function is $$Z=\alpha e^{-\beta x},$$

wherein Z is a ratio of an open-circuit voltage at the first contact to a source current at the second contact, $\alpha$ is a value of Z for $x_0$, and $\beta$ is a parameter that is dependent on the properties of the substrate. In an alternative of this embodiment, a can be determined from $$\alpha = \frac{1}{K_1 \text{Area} + K_2 \text{Perimeter} + K_3},$$

wherein Area is a combined contact area, Perimeter is a perimeter of the combined contact, and $K_1$, $K_2$, and $K_3$ are coefficients that are dependent on the properties of the substrate. In another alternative of this embodiment, $K_1$, $K_2$, and $K_3$ are determined by curve fitting $\alpha$ to a plurality of data points obtained for a range of different Area and Perimeter values.

Other methods for determining a scalable Z parameter for a pair of contacts in a substrate, wherein the scalable Z parameter is associated with a cross-coupling resistance between a first contact and a second contact of the pair of contacts, are also disclosed. The methods comprise modeling the Z parameter as a function of a relative position y between the first contact and the second contact where the first contact has a greater dimension than the second contact along a y axis (the function including multiple coefficients, wherein at least one of the multiple coefficients is scalable with dimensions of the first contact), obtaining a plurality of sample data points for the Z parameter (the sample data points being calculated for a range of positions y of the second contact relative to the first contact), and determining values of the multiple coefficients such that the function produces a curve that fits the sample data points. In one embodiment, the range of positions y is from substantially zero to a length of the first contact along its y axis. In another embodiment, the plurality of data points are obtained for a contact having an area between about 2.4 µm and 100 µm. In still another embodiment, at least a portion of the sample data points are obtained from a simulation. In one particular embodiment, the function is $$Z=ay^2+by+c,$$

wherein Z is a ratio of an open-circuit voltage at the first contact to a source current at the second contact, y is a relative position between the first contact and the second contact, and a, b, and c are scalable coefficients for the substrate that depend on contact dimensions. In an alternative of this embodiment, c is found by $$c=\alpha e^{-\beta x_a}$$

wherein a is a value of Z for $x_0$, $\beta$ is a coefficient that is dependent on substrate properties, and $x_a$ is a separation between the first contact and the second contact. In another alternative of this embodiment, the pair of contacts is an original pair of contacts, and a, b, and c are scaleable for a new pair of contacts by a ratio of $a_{new}/\alpha$, where $\alpha_{new}$ is a value of $\alpha$ for the new pair of contacts and $\alpha$ is a value of $\alpha$ for the original pair of contacts.

Still other methods for determining a scalable Z parameter for a pair of contacts in a substrate, wherein the Z parameter is associated with a cross-coupling resistance between a first contact and a second contact of the pair of contacts, are also disclosed. The methods comprise modeling the scalable Z parameter as a function of a separation x between the first contact and the second contact and as a function of a relative position y between the first contact and the second contact where the first contact has a greater dimension than the second contact along a y axis (the function including multiple coefficients, wherein at least one of the multiple coefficients is scalable with dimensions of the first contact and at least one of the multiple coefficients is dependent on substrate properties), obtaining a first set of sample data points for the Z parameter (the first set of sample data points being obtained for a range of relative positions y of the second contact relative to the first contact for a fixed separation x), obtaining a second set of sample data points for the Z parameter (the second set of sample data points being obtained for a range of separations x for a fixed relative position y of the second contact), and determining values of the multiple coefficients such that the function produces a curve that fits the sample data points. In one particular embodiment, the function is $$Z=[ay^2+by+c]e^{-\beta(x-x_a)},$$

wherein Z is a ratio of the open-circuit voltage at the first contact to the source current at the second contact, y is a relative position between the first contact and the second contact, a, b, and c are scalable parameters for the substrate that depend on contact dimensions, x is a separation between the first contact and the second contact, $x_a$ is a value of x used in determining a, b, and c, and $\beta$ is a parameter that is dependent on the properties of the substrate.

Computer-readable medium storing computer-executable instructions for causing a computer system to perform any of the disclosed methods are also disclosed.

These and other features are set forth below with reference to the accompanying drawings.

BRIEF DESCRIPTION OF THE DRAWINGS

FIG. 8 is a graph showing simulated values of $1/Z_{11}$ as a function of contact width for the exemplary heavily doped substrate of FIG. 7.

FIG. 9A is a first image showing current-flow lines from a simulator for an exemplary heavily doped substrate having a single contact.

FIG. 9B is a second image showing current-flow lines from a simulator for the heavily doped substrate of FIG. 9A having two contacts with a separation of 5 µm.

FIG. 9C is a third image showing current-flow lines from a simulator for the heavily doped substrate of FIG. 9A having two contacts with a separation of 10 µm.

FIG. 9D is a fourth image showing current-flow lines from a simulator for the heavily doped substrate of FIG. 9A having two contacts with a separation of 40 µm.

FIG. 18 is a graph of $Z_{12}$ as a function of relative position y for the contacts shown in FIG. 17 showing values calculated by a three-dimensional simulator and values predicted by an exemplary Z-parameter model.

FIG. 19A is a block diagram illustrating two exemplary contacts having a separation x of zero and a relative position y of 100 µm.

FIG. 19B is a block diagram illustrating the exemplary contacts of FIG. 19A with a relative position y of 80 µm.

FIG. 19C is a block diagram illustrating the exemplary contacts of FIG. 19A with a relative position y of 50 µm.

FIG. 36A is a block diagram showing two exemplary contacts as they are subdivided into smaller portions according to a known method.

FIG. 36B is a block diagram showing the two exemplary contacts from FIG. 36A as they are used in an exemplary Z-parameter model.

FIG. 37A is a block diagram showing an exemplary pair of contacts used to compare a known method with an exemplary Z-parameter model.

DETAILED DESCRIPTION

Disclosed below are representative methods and apparatus for modeling substrate noise coupling. The disclosed methods should not be construed as limiting in any way. Instead, the present disclosure is directed toward novel and nonobvious features and aspects of the various disclosed embodiments, alone and in various combinations and subcombinations with one another. The methods are not limited to any specific aspects or features, or combinations thereof, nor do the methods require that any one or more specific advantages be present or problems be solved.

Although the operations of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the disclosed flow charts typically do not show the various ways in which the disclosed methods can be used in conjunction with other methods. Additionally, the detailed description sometimes uses terms like "determine" and "provide" to describe the disclosed methods. These terms are high-level abstractions of the actual operations that are performed. The actual operations that correspond to these terms will vary depending on the particular implementation and are readily discernible by one of ordinary skill in the art.

As more fully described below, the disclosed embodiments can be applied to a wide variety of fabrication processes, including CMOS processes. Further, some of the methods described herein can be implemented in software, stored on a computer-readable medium, and executed on a computer. Some of the disclosed methods, for example, can be implemented in an electronic-design-automation ("EDA") tool, such as a design and verification tool, which includes a user interface configured to input and output substrate parameters and other design information. Such methods can be executed on a single computer or on a networked computer (e.g., via the Internet, a wide-area network, a local-area network, a client-server network, or other such network). For clarity, only selected aspects of software-based implementations are described. Other details that are well known in the art are omitted. For the same reason, computer hardware is not described in further detail.

General Description

Figure 1:
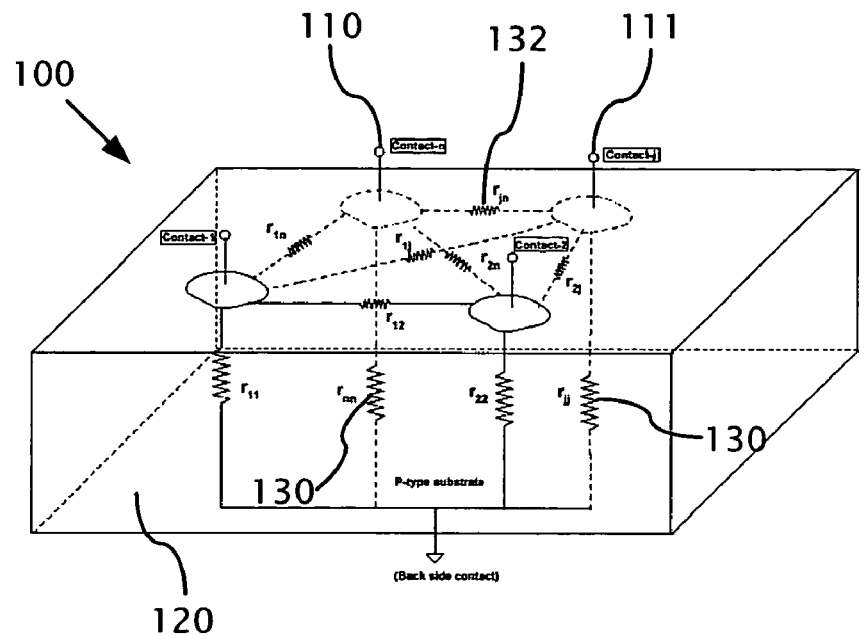
FIG. 1 is a block diagram schematically showing an exemplary substrate network having more than two contacts.
Figures 2A, 2B:
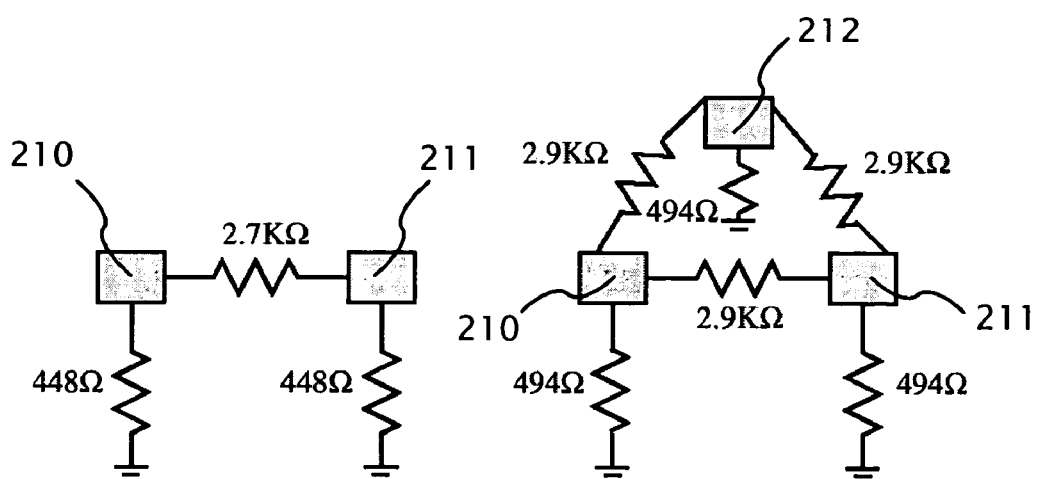
FIG. 2A is a block diagram showing a resistive network for two exemplary contacts.
FIG. 2B is a block diagram showing the resistive network of FIG. 2A with three contacts.

FIG. 1 is a block diagram showing an exemplary substrate 100 having multiple contacts 110. As can be seen in FIG. 1, the overall substrate-coupling-resistance network is a complex one. A contact 110 has an effective resistance 130 to a backplane conductor 120 as well as an effective cross-coupling resistance 132 to another contact 111. Two-port resistance-based models are generally unable to calculate resistance networks such as that of FIG. 1. Such models typically do not account for resistance changes associated with more than two contacts. As an example, consider a two-port resistive-network formulation derived for a 3-contact case. FIG. 2A shows simulated resistance values for two identical contacts 210, 211 at a separation of 10 µm. As shown in FIG. 2B, the addition of an identical third 212 contact at a 10 µm separation from the contacts 210, 211 alters all the resistance values of the network. According to the two-port resistance-based models, the resistance values in FIG. 2B should be identical to the values in FIG. 2A. Therefore, the two-port resistance model is inadequate for networks having more than two contacts.

To overcome this and other deficiencies, certain embodiments of the disclosed methods use scalable Z parameters that relate a voltage applied to a first contact and an associated current at a second contact. In general, for an arbitrary pair of contacts j and m, an associated Z parameter, denoted as "$Z_{jm}$," is a ratio of an open-circuit voltage at the contact j to the source current at the contact m. In other words, the Z parameter relating contacts j and m is the open-circuit voltage at contact j ($V_j$) divided by a source current at contact m ($I_m$), or, $$Z_{jm} = \frac{V_j}{I_m} \quad (1)$$

Generally, the parameter $Z_{jm}$ does not change due to other contacts when the separation between the additional contacts is greater than a certain value. For example, in certain substrates considered herein, the parameter $Z_{jm}$ does not change if additional contacts are separated by at least 10 µm. A contact j also has a parameter $Z_{jj}$ associated with a groundplane. The parameter $Z_{jj}$ can be defined as a ratio of open-circuit voltage at the contact j to a current at the contact j, with all other contacts considered as open circuits.

Figure 3:
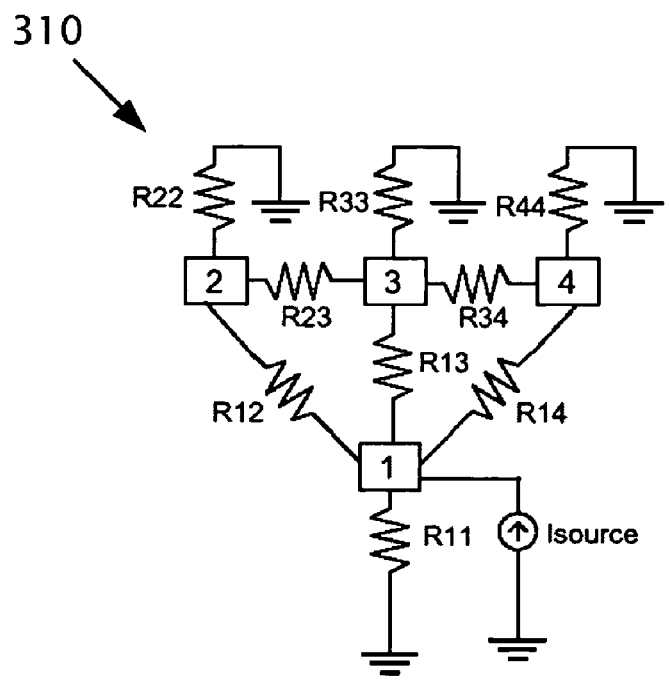
FIG. 3 is a block diagram showing a three-contact resistive network using a Z-parameter formulation.
Figure 4:
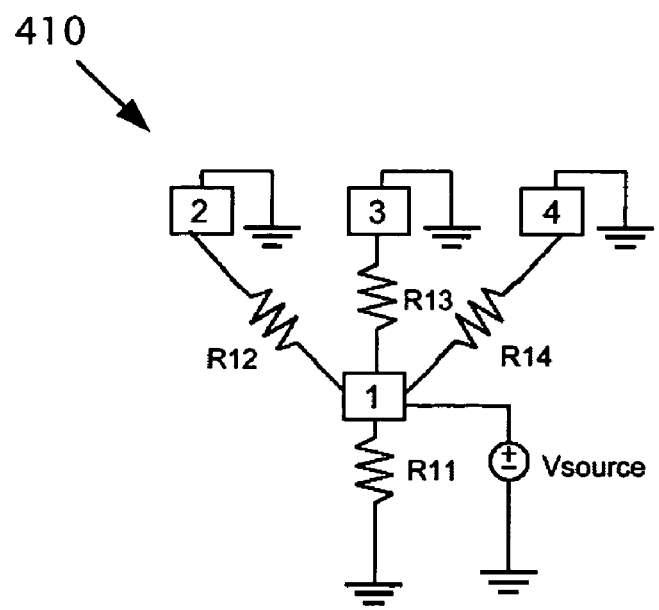
FIG. 4 is a block diagram showing the three-contact resistive network of FIG. 3 using a Y-parameter formulation.

Although Y parameters are related to Z parameters, Y parameters are unsuitable for describing the substrate network. Y parameters are short-circuit parameters. Thus, for every Y-parameter measurement, the substrate network is altered because one or more circuit nodes are grounded. Moreover, a Y-parameter formulation does not take into account cross-coupling resistances between two grounded nodes, and resistances from grounded nodes to the backplane. FIGS. 3 and 4 illustrate the difference between the resistive networks for Z-parameter and Y-parameter formulations for a four-contact example. In FIG. 3, a Z-parameter formulation 310 is shown for an exemplary four-contact network. As can be seen, the Z-parameter formulation 310 includes resistances from each contact to the backplane and cross-coupling resistances between each pair. In FIG. 4, a Y-parameter formulation 410 is shown for the same network. In FIG. 4, resistors $R_{22}$, $R_{33}$, $R_{44}$, $R_{23}$ and $R_{34}$ are eliminated as they are interconnected grounded nodes.

Figure 5:
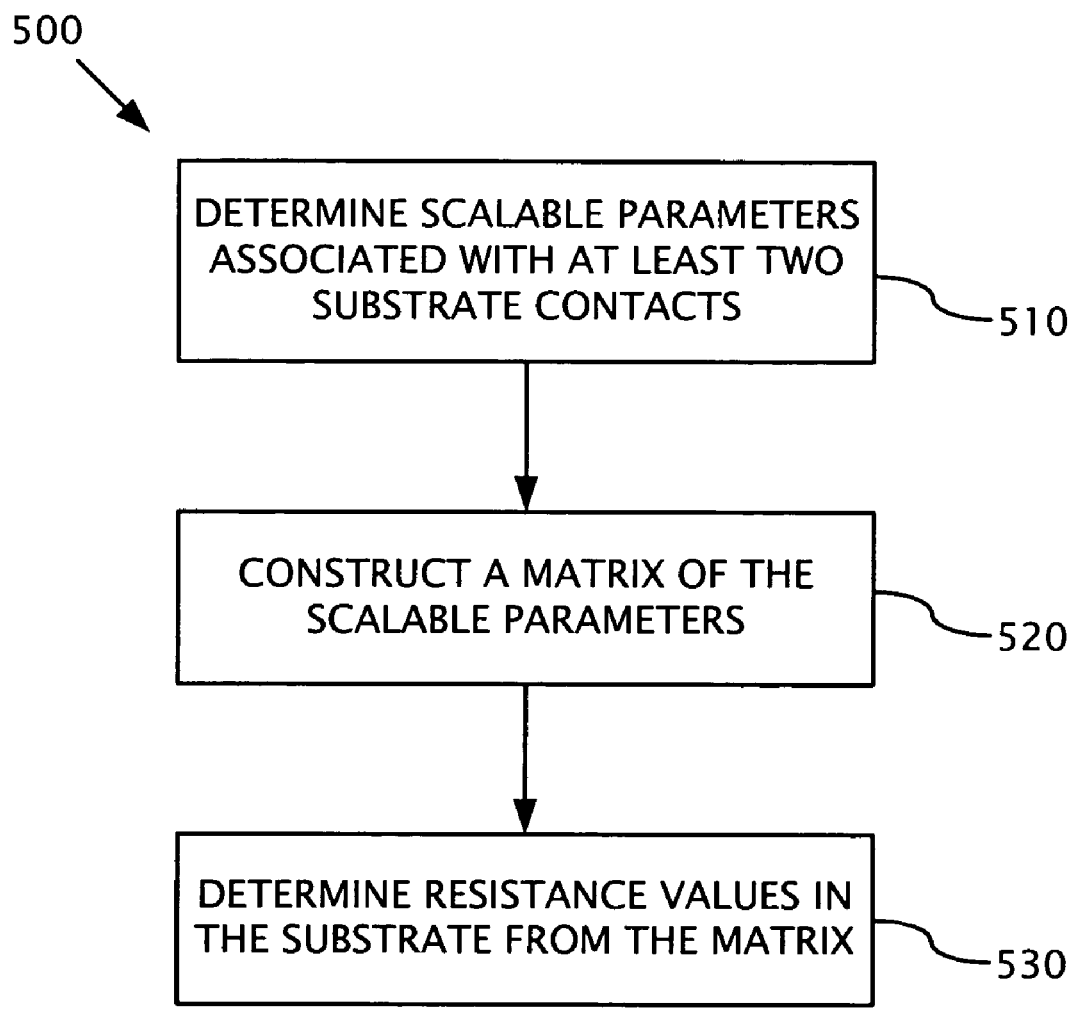
FIG. 5 is a flowchart of an exemplary method of determining noise coupling in a substrate.

FIG. 5 is a flowchart 500 showing one representative embodiment of a general method for calculating substrate noise coupling in a network having two or more contacts. In process block 510, scalable parameters (e.g., Z parameters) are determined for two or more contacts in the substrate. For instance, in one exemplary embodiment, Z parameters are calculated for the multiple contacts in the network. In process block 520, a matrix of the scalable parameters is constructed. In one particular embodiment, the matrix is an N×N matrix, where N is a number of contacts in the network. For example, matrix entries corresponding to two contacts j and m can be included in such an N×N matrix as:

$$Z = \begin{bmatrix} \cdot & \cdot & \cdot & \cdot & \cdot & \cdot & \cdot & \cdot \\ \cdot & z_{jj} & \cdot & \cdot & z_{jm} & \cdot & \cdot & \cdot \\ \cdot & \cdot & \cdot & \cdot & \cdot & \cdot & \cdot & \cdot \\ \cdot & \cdot & \cdot & \cdot & \cdot & \cdot & \cdot & \cdot \\ \cdot & z_{jm} & \cdot & \cdot & z_{mm} & \cdot & \cdot & \cdot \\ \cdot & \cdot & \cdot & \cdot & \cdot & \cdot & \cdot & \cdot \\ \cdot & \cdot & \cdot & \cdot & \cdot & \cdot & \cdot & \cdot \end{bmatrix} \quad (2)$$

In process block 530, resistance values are determined from the scalable parameter matrix. In one embodiment, for instance, the inverse of the matrix is calculated and used to determine the resistance values. The resulting resistance values are indicative of substrate noise coupling and can be evaluated by a designer or design tool to determine whether any modifications should be made to the design.

Modeling Substrate Noise Coupling in Heavily Doped Substrates

In order to explain how multiple, three-dimensional geometries influence the calculation of scalable parameters in a heavily doped substrates, an examination of representative Z-parameter models in two dimensions is helpful. Two-dimensional models for substrate noise coupling based on Z parameters can be developed using two-dimensional device simulators, such as MEDICI, Version 2000.2.0, available from Synopsys Corporation. In general, the use of a simulator provides accurate results, allows a user to define nonhomogenous substrate layers, and provides insight into substrate-coupling mechanisms for different fabrication processes. As described above, simulators are computationally intensive and impractical for large designs. Two-dimensional device simulators typically use process information, such as doping concentrations, layer thicknesses, and the size and separation of the injecting and sensing contacts. Further, certain two-dimensional simulators (e.g., MEDICI) can generate current-flow lines, equipotential lines, and Y or Z parameters from the process information.

Figure 6:
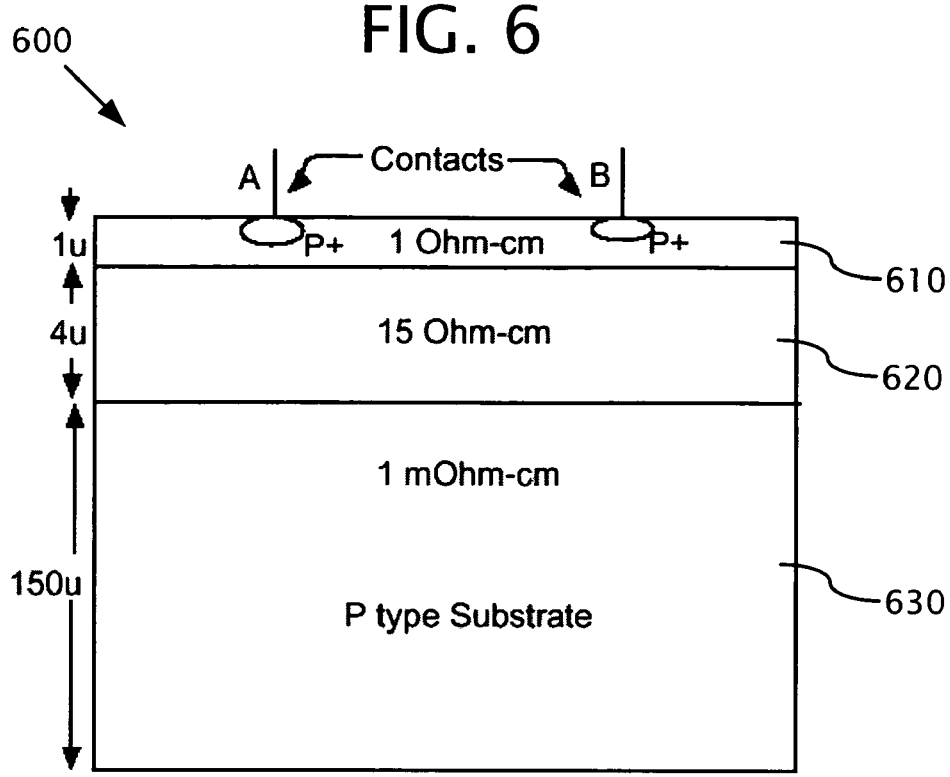
FIG. 6 is a block diagram schematically showing a first exemplary heavily doped substrate.

For purposes of illustrating a representative two-dimensional Z-parameter model, reference is made to an exemplary heavily doped substrate process. This substrate process is used for illustrative purposes only and should not be construed as limiting the disclosed technology. Instead, the disclosed principles and methods can be applied to any substrate process. For example, as more fully explained below, the disclosed principles and methods can be extended to lightly doped substrates. FIG. 6 shows a heavily doped substrate 600 comprising a heavily doped p$^+$ channel-stop implant layer 610, a lightly doped epi layer 612, and a heavily doped p$^+$ bulk region 614. The resistivities and thicknesses for these layers are shown in FIG. 6. For purposes of this disclosure, the symbol "u" is sometimes used to indicate micrometers.

Figure 7:
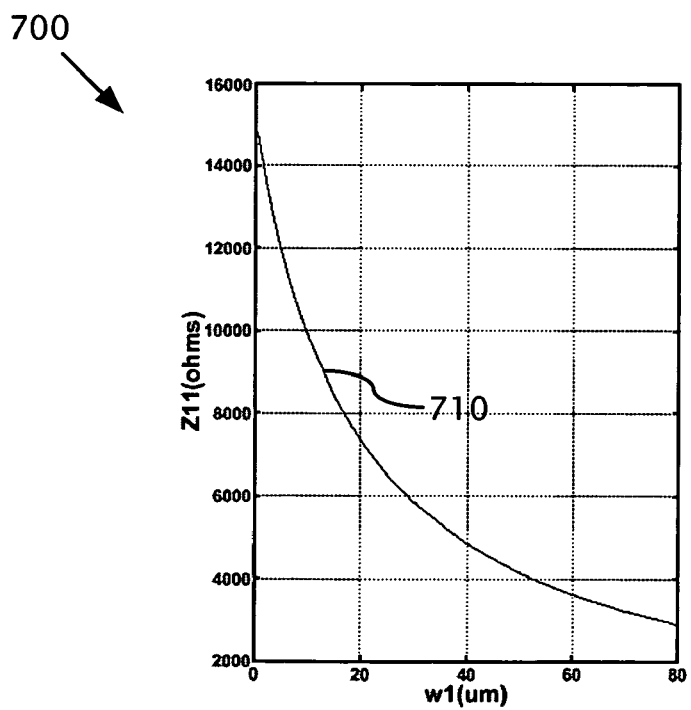
FIG. 7 is a graph showing simulated values of $Z_{11}$ as a function of a contact width in an exemplary heavily doped substrate.

FIG. 7 shows a graph 700 of $Z_{11}$ as a function of contact width $w_1$ in a range of 0.5 µm to 80 µm. FIG. 8 shows a graph 800 of $1/Z_{11}$ as a function of $w_1$. As can be seen by curve 710 in FIG. 7 (based on data from a two-dimensional simulation), an exponential relationship exists between $Z_{11}$ and contact width. Similarly, curve 810 in FIG. 8 shows a linear relationship between $1/Z_{11}$ and the contact width. According to one exemplary method, this relationship is modeled using the following the linear equation:

$$\frac{1}{Z_{11}} = a + bw_1, \quad (3)$$

wherein a and b are process parameters that can be obtained from curve fitting, and $w_1$ is the contact width. For example, for the exemplary substrate profile shown in FIG. 6, the following values were obtained:

$$a = 6.5942 \times 10^{-5} \frac{1}{\Omega} \quad b = 3.5092 \frac{1}{\Omega m}. \quad (4)$$

Data points 812 in FIG. 8 show simulated values of $1/Z_{11}$ at selected widths $w_1$, whereas curve 810 shows predicted values of $1/Z_{11}$ for an arbitrary width $w_1$. As can be seen from FIG. 8, the model of Equation (3) closely approximates the data extracted from the two-dimensional simulation.

Another aspect of modeling $Z_{11}$ is to determine the influence of neighboring contacts on $Z_{11}$. FIGS. 9A–9D show current-flow lines for different separations between two contacts in an exemplary substrate substantially similar to the substrate shown in FIG. 6. The current-flow lines shown in FIGS. 9A–9D provide insight into the relationship between $Z_{11}$ and the contact locations. In particular, FIG. 9A shows two-dimensional simulation results for an exemplary single contact, FIG. 9B shows two exemplary contacts at a 5 μm separation, FIG. 9C shows the contacts at a 10 μm separation, and FIG. 9D shows the contacts at a 40 μm separation. For each of these simulations, injector-contact size was $w_1=0.5$ μm and sensor-contact size as $w_2=10$ μm. From the two-dimensional simulation, the following Z parameter values were obtained: for FIG. 9A, $Z_{11}=14.79$ KΩ; for FIG. 9B, $Z_{11}=13.05$ KΩ; for FIG. 9C, $Z_{11}=14.18$ KΩ; and for FIG. 9D, $Z_{11}=14.79$ KΩ. As can be seen in FIGS. 9A–9D, current distribution is a function of sensor-contact separation. Consequently, values of $Z_{11}$ also depend on separation. In FIG. 9D, the current-flow lines (current distribution) are substantially the same as in the single-contact case. Thus, for separations larger than a certain value (in the illustrated substrate, about 10 μm), the injector contact behaves as a single contact, and $Z_{11}$ is unaffected by a neighboring contact. For instance, in this example, the value of $Z_{11}$ for a selected contact is within about 1% of its isolated value for 20 μm or greater separation from other contacts and is within 10% of the isolated value for separations of 10 μm or more from other contacts. Accordingly, in one exemplary embodiment, the $Z_{11}$ model described above is used for contacts separated from other contacts by about 10 μm or larger. In other embodiments, however, the separation for which this $Z_{11}$ model is used can be different (because of different substrate characteristics, a different desired accuracy, or for other reasons).

Figure 10:
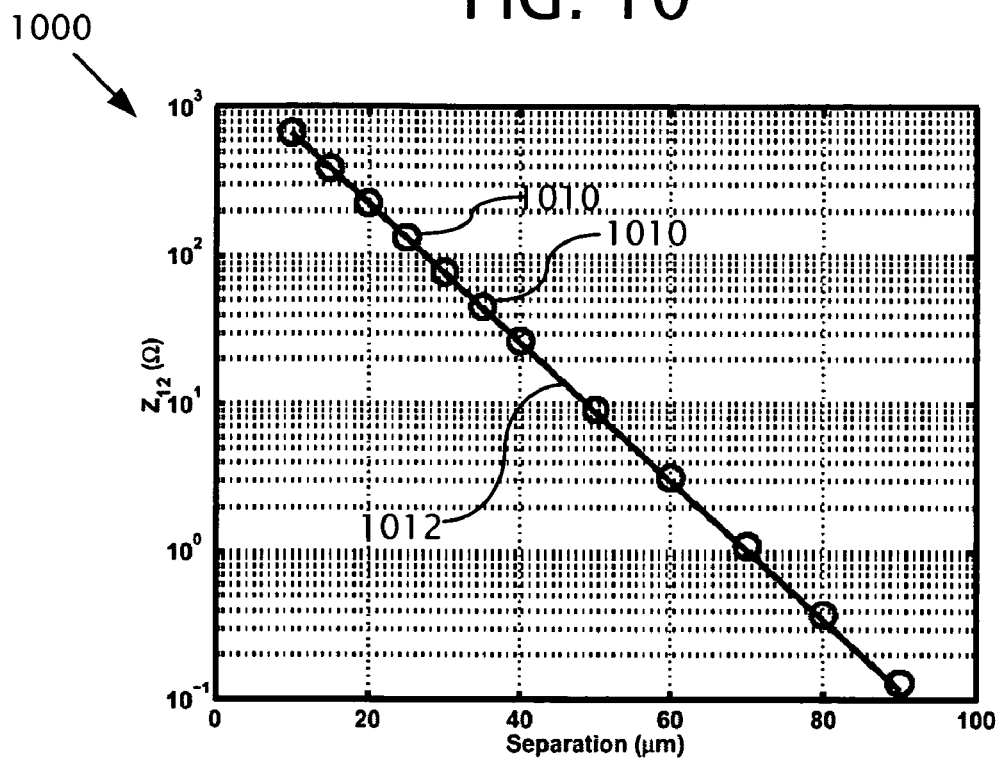
FIG. 10 is a logarithmic graph of $Z_{12}$ as a function of contact separation showing values calculated by a two-dimensional simulator and values predicted by an exemplary Z-parameter model.

FIG. 10 shows a logarithmic graph 1000 for values of $Z_{12}$ for various separations between source and sensor contacts. In particular, graph 1000 shows data points 1010 obtained from a two-dimensional simulator. From FIG. 10, it can be seen that $Z_{12}$ is an exponential function of separation that can be modeled as, for example:

$$Z_{12} = \alpha e^{-\beta x} \quad (5)$$

wherein α and β are process parameters obtained from curve fitting. Curve 1012 in FIG. 10 was plotted according to Equation (5) and shows good agreement with data points 1010.

Figure 11:
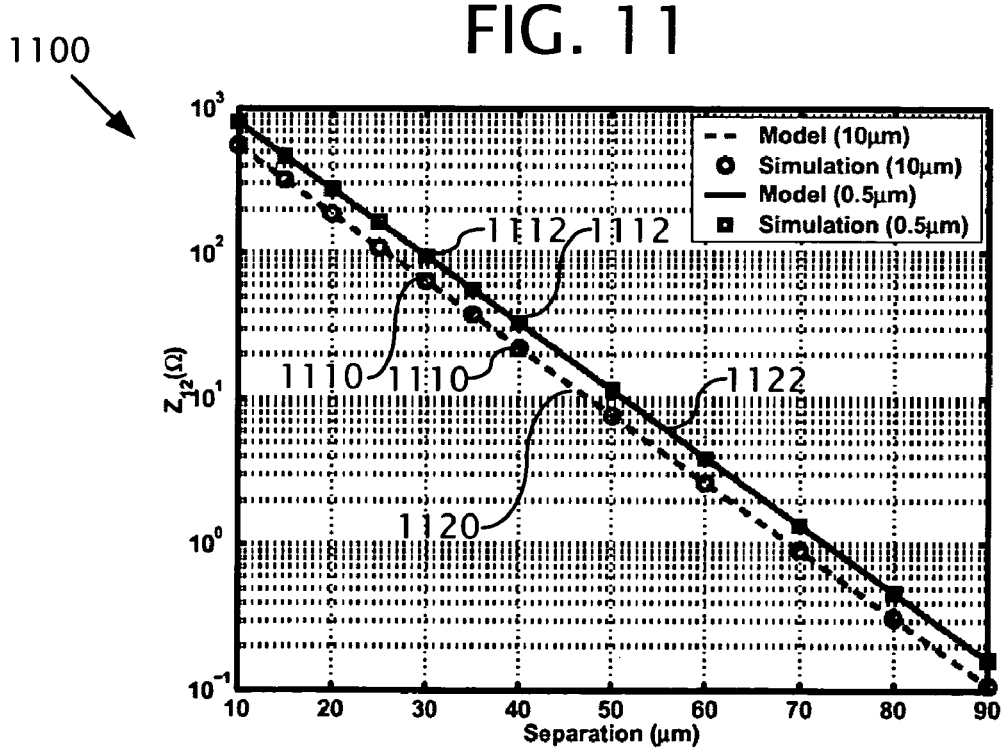
FIG. 11 is a logarithmic graph of $Z_{12}$ as a function of contact separation showing values calculated by a two-dimensional simulator and values predicted by an exemplary Z-parameter model for separations of 10 µm and 0.5 µm.

FIG. 11 is a logarithmic graph 1100 of $Z_{12}$ as a function of contact separation. In particular, graph 1100 shows data points 1110, 1112 that correspond to simulation results for contact widths of 10 μm and 0.5 μm, respectively, and curves 1120, 1122 that correspond to values predicted by Equation (5). From FIG. 11, it can be seen that β (the slope of curves 1120, 1122) is substantially independent of the contact widths. For example, the values of α and β obtained for the exemplary heavily doped substrate shown in FIG. 6 are:

$$\alpha = 233 \text{ Ω} \quad \beta = 1.0666 \times 10^5 \frac{1}{m}. \quad (6)$$

The cross-coupling resistance values predicted by the disclosed Z-parameter model can be verified by comparing the resistance values obtained from the model with simulated values. The two-port Y parameters for the substrate model are given by:

$$Y = \begin{bmatrix} y_{11} & y_{12} \\ y_{21} & y_{22} \end{bmatrix} = \frac{1}{|Z|} \begin{bmatrix} Z_{22} & -Z_{12} \\ -Z_{21} & Z_{11} \end{bmatrix} = \begin{bmatrix} G_{11}+G_{12} & -G_{12} \\ -G_{21} & G_{21}+G_{22} \end{bmatrix} \quad (7)$$

Therefore, $$G_{12} = -y_{12} = \frac{Z_{12}}{|Z|} \quad (8)$$

which gives, $$R_{12} = \frac{|Z|}{Z_{12}} = \frac{|Z|}{Z_{21}} \quad (9)$$

wherein |Y| is a determinant of the Z matrix. The Y, Z, G and R matrices are symmetric because the resistive network between the contacts is a reciprocal network.

Table 1 below shows the $R_{12}$ values for different separations (x) and contact widths calculated using the Z-parameter model described above and using a two-dimensional simulator.

TABLE 1

Comparison of Z-parameter model and simulation $R_{12}$ values

| Source Width (μm) | Sensor Width (μm) | $R_{12}$ (x = 10 μm) | | $R_{12}$ (x = 40 μm) | | $R_{12}$ (x = 100 μm) | |
|---|---|---|---|---|---|---|---|
| | | Model | Sim. | Model | Sim. | Model | Sim. |
| 0.5 | 0.5 | 39.2 KΩ | 38.7 KΩ | 1.08 MΩ | 1.04 MΩ | 659 MΩ | 591 MΩ |
| 0.5 | 5 | 40 KΩ | 38.6 KΩ | 1.08 MΩ | 1.04 MΩ | 651 MΩ | 590 MΩ |
| 0.5 | 100 | 43.1 KΩ | 38.6 KΩ | 1.08 MΩ | 1.04 MΩ | 649 MΩ | 590 MΩ |
| 2 | 5 | 40.2 KΩ | 38.5 KΩ | 1.08 MΩ | 1.04 MΩ | 649 MΩ | 589 MΩ |
| 5 | 5 | 40.6 KΩ | 38.5 KΩ | 1.08 MΩ | 1.04 MΩ | 647 MΩ | 588 MΩ |
| 10 | 100 | 41.9 KΩ | 38.5 KΩ | 1.04 MΩ | 1.04 MΩ | 628 MΩ | 588 MΩ |

Table 1 shows that the largest difference between the resistance values predicted by the Z-parameter-based model and the simulated results is 11.66% for a separation of 10 μm, while for the 40 μm and 100 μm separations, the errors are 3.8% and 11.5%, respectively.

Although the two-dimensional model is useful to illustrate the relevant substrate-coupling mechanisms, it cannot account for the influence of three-dimensional geometries on substrate noise coupling. A scalable, three-dimensional, Z-parameter model can be produced using a three-dimensional simulator (e.g., MOMENTUM EM, Advanced Design System 1.5, from Agilent Technologies). A typical three-dimensional simulator allows a user to define different contact shapes and produces an N-port, S-parameter output file, wherein N is a number of contacts in the layout.

Z parameters can be calculated from S parameters in the following manner. The S and Y parameters for a 2-port network are given by:

$$b_1 = S_{11}a_1 + S_{12}a_2, i_1 = Y_{11}V_1 + Y_{12}V_2$$

$$b_2 = S_{12}a_1 + S_{22}a_2, i_2 = Y_{12}V_1 + Y_{22}V_2 \qquad (10)$$

Substituting for $a_{ij}$ and $b_{ij}$ in terms of the port voltages and currents in the S-parameter equation:

$$\frac{V_1 - Z_0 i_1}{2\sqrt{Z_0}} = S_{11}\left(\frac{V_1 + Z_0 i_1}{2\sqrt{Z_0}}\right) + S_{12}\left(\frac{V_2 + Z_0 i_2}{2\sqrt{Z_0}}\right) \qquad (11)$$

and $$\frac{V_2 - Z_0 i_2}{2\sqrt{Z_0}} = S_{21}\left(\frac{V_1 + Z_0 i_1}{2\sqrt{Z_0}}\right) + S_{22}\left(\frac{V_2 + Z_0 i_2}{2\sqrt{Z_0}}\right). \qquad (12)$$

From Equation (11):

$$Z_0 i_1 + S_{11} Z_0 i_1 + S_{12} Z_0 i_2 = V_1 - S_{11} V_1 - S_{12} V_2.$$

From Equation (12):

$$Z_0 i_2 + S_{21} Z_0 i_1 + S_{22} Z_0 i_2 = V_2 - S_{21} V_1 - S_{12} V_2.$$

Then, $$Z_0 \begin{bmatrix} S_{11}+1 & S_{12} \\ S_{21} & S_{22}+1 \end{bmatrix}\begin{bmatrix} i_1 \\ i_2 \end{bmatrix} = \begin{bmatrix} 1-S_{11} & -S_{12} \\ -S_{21} & 1-S_{22} \end{bmatrix}\begin{bmatrix} V_1 \\ V_2 \end{bmatrix} \Rightarrow \qquad (15)$$

$$Z_0(S+I)\begin{bmatrix} i_1 \\ i_2 \end{bmatrix} = (I-S)\begin{bmatrix} V_1 \\ V_2 \end{bmatrix}$$

$$\begin{bmatrix} i_1 \\ i_2 \end{bmatrix} = \frac{1}{Z_0}(S+I)^{-1}(I-S)\begin{bmatrix} V_1 \\ V_2 \end{bmatrix} = Y\begin{bmatrix} V_1 \\ V_2 \end{bmatrix}$$

So:

$$Y = \frac{1}{Z_0}(S+I)^{-1}(I-S) \qquad (16)$$

and $$Z = Y^{-1}. \qquad (17)$$

For the special case of two contacts, the Z and Y parameters are related to each other as follows:

$$Z_{11} = \frac{Y_{22}}{|Y|}, Z_{12} = \frac{-Y_{12}}{|Y|}, Z_{21} = \frac{-Y_{21}}{|Y|}, Z_{22} = \frac{Y_{11}}{|Y|} \qquad (18)$$

Figure 12:
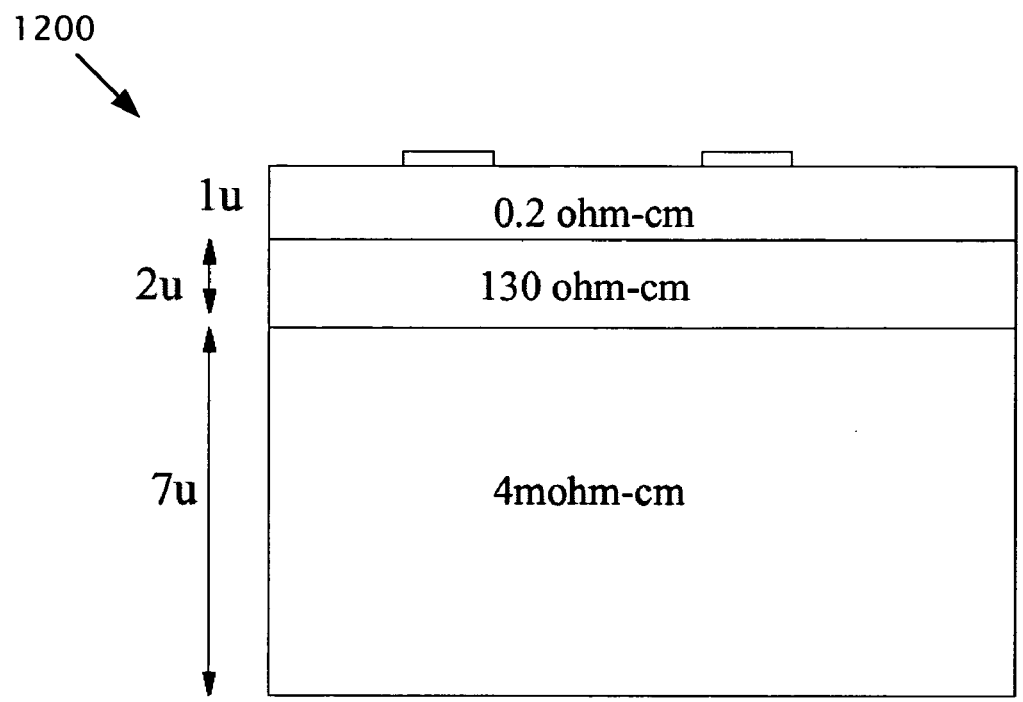
FIG. 12 is a block diagram schematically showing a second exemplary heavily doped substrate.

For purposes of illustrating the three-dimensional model, the substrate shown in FIG. 12 is considered. Substrate 1200 in FIG. 12 is a 0.5 µm MOSIS HP CMOS process. The resistance values used for the examples discussed herein comprise average values for the MOSIS HP CMOS process and differ somewhat from a general heavily doped substrate.

Data obtained from three-dimensional simulations (e.g., MOMENTUM) indicates that $Z_{11}$ is a function of both contact area and contact perimeter. Accordingly, in one exemplary embodiment, the following equation can be used to model $Z_{11}$:

$$Z_{11} = \frac{1}{K_1 \text{Area} + K_2 \text{Perimeter} + K_3} \qquad (19)$$

where $K_1$, $K_2$ and $K_3$ are empirically fit parameters, which are discussed more fully below.

Figure 13:
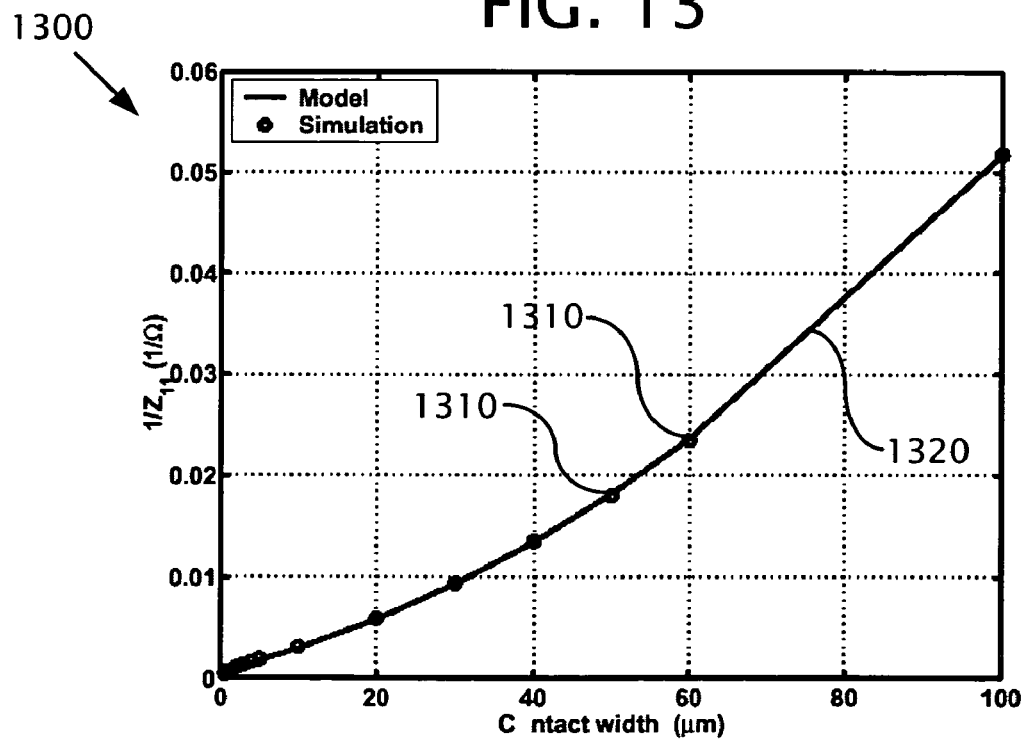
FIG. 13 is a graph of $1/Z_{11}$ as a function of contact width showing values calculated by a three-dimensional simulator and values predicted by an exemplary Z-parameter model.
Figure 14:
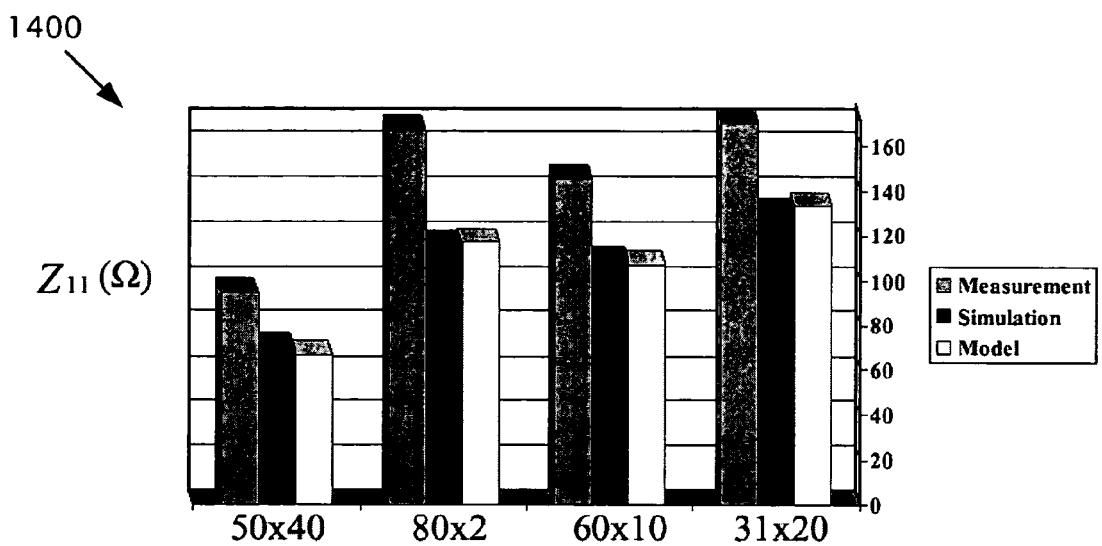
FIG. 14 is a bar graph comparing values of $Z_{11}$ predicted by a three-dimensional simulator and an exemplary Z-parameter model.

FIG. 13 shows a graph 1300 of $1/Z_{11}$ as a function of contact width for square contacts. As can be seen by curve 1320 based on Equation (19), $1/Z_{11}$ increases quadratically with contact width. Further, various data points 1310 calculated by a three-dimensional simulator show that the curve 1320 predicted by Equation (19) is accurate. FIG. 14 shows a bar graph 1400 comparing results from the above Z-parameter model (labeled as "model" in the graph 1400), simulation results (labeled as "simulation"), and results from measurements made in a test chip (labeled as "measurement") for a variety of different contact dimensions. FIG. 14 shows that the predicted results using Equation (19) are superior. Minor deviations between the modeled and simulated $Z_{11}$ values and the measured values are expected due to the uncertainty in the substrate-doping profiles used in the model and the simulations.

The dependence of $Z_{11}$ on nearby contacts can also be examined for three-dimensional geometries. Three-dimensional simulations (in the illustrated graphs, from MOMENTUM) show that for contact separations larger than a certain value, $Z_{11}$ values do not change due to nearby contacts. In particular, simulation results show that for a square 5 µm contact with no surrounding contacts, the $Z_{11}$ value is 535 Ω; for a 5 µm contact surrounded at each side by four identical contacts with a separation of 0.5 µm, the value of $Z_{11}$ drops to 403 Ω; and for a 5 µm contact surrounded by four identical contacts with a separation of 10 µm, the value of $Z_{11}$ is 528 Ω. From these and other simulations, it was determined that for the exemplary substrate shown in FIG. 12, the value of $Z_{11}$ converges to a single contact value at a separation x substantially equal to or larger than 10 µm.

Figure 15:
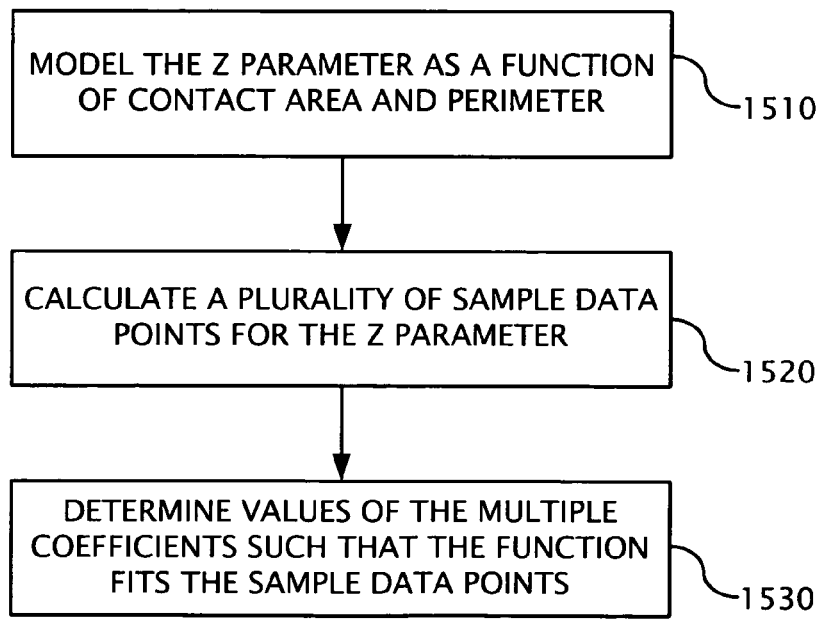
FIG. 15 is a flowchart of an exemplary method for determining a scalable $Z_{11}$ parameter for a pair of contacts in a substrate.

FIG. 15 is a flowchart 1500 showing one exemplary method of determining a $Z_{11}$ parameter for a given contact. At process block 1510, the Z parameter is modeled as a function of the area and perimeter of the contact, where the function also includes multiple coefficients (or parameters), at least some of which are dependent on the properties of the given substrate. For example, the Z parameter can be modeled according to Equation (19) with the multiple coefficients being $K_1$, $K_2$ and $K_3$. At process block 1520, a plurality of different data points (e.g., ten) are calculated for $Z_{11}$ using a single contact (e.g., having a square and/or rectangular geometry). The data points can be obtained, for example, from a three-dimensional simulator or any other suitable method. In one exemplary embodiment, the contact sizes are varied over a range of values. For example, contact sizes can be varied from 2.4 µm to 100 µm, though this range is not limiting in any fashion. At process block 1530, the values of the multiple coefficients in the function (e.g., $K_1$, $K_2$ and $K_3$) are determined by curve-fitting the function with the sampled data points. For example, in one exemplary embodiment, the values of $K_1$, $K_2$ and $K_3$ are determined by curve-fitting Equation (19) to the $Z_{11}$ data. A variety of known curve-fitting techniques can be used to obtain the relevant values. For the MOSIS HP CMOS process illustrated in FIG. 12, for instance, the following values for $K_1$, $K_2$, and $K_3$ were obtained: $K_1=3.1911\times10^6$ (1/$\Omega$m$^2$); $K_2=47.6177$ (1/$\Omega$m); and $K_3=7.0579\times10^{-4}$ (1/$\Omega$).

Figure 16:
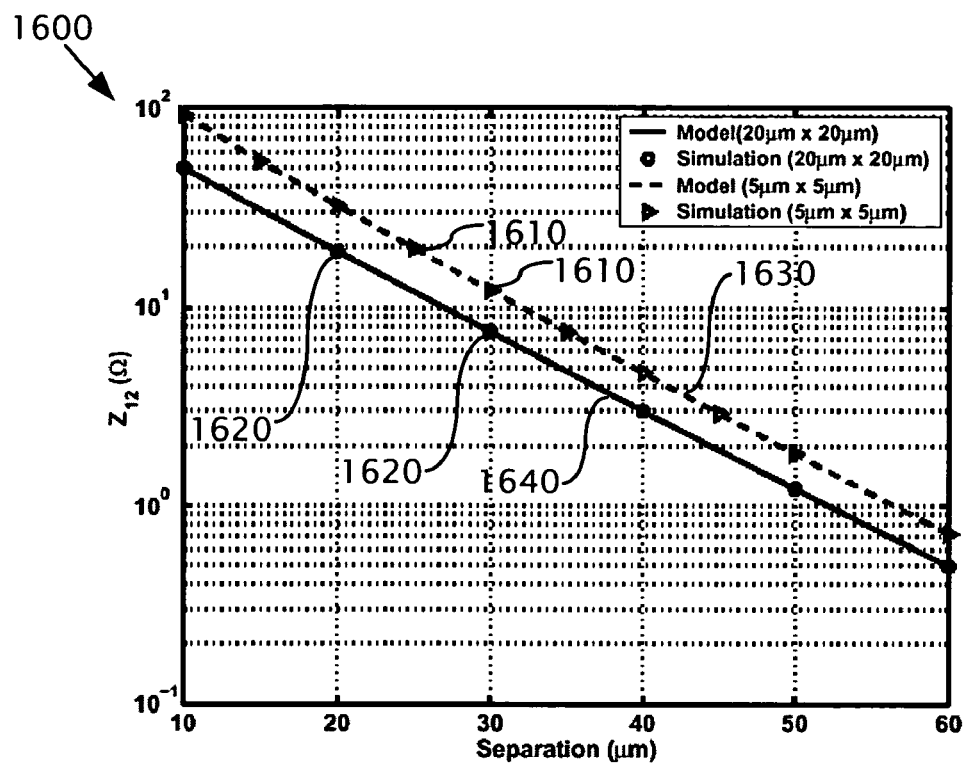
FIG. 16 is a logarithmic graph of $Z_{12}$ as a function of contact separation showing values calculated by a three-dimensional simulator and values predicted by an exemplary Z-parameter model for separations of 20 µm and 5 µm.

In contrast to $Z_{11}$, the value of $Z_{12}$ is typically a function of the contact geometries and spacing. FIG. 16 is a logarithmic graph 1600 showing the value of $Z_{12}$ as a function of separation x. In particular, graph 1600 shows simulated $Z_{12}$ values at data points 1610 for 5 μm square contacts and at data points 1620 for 20 μm square contacts. As can be seen in FIG. 16, the values $Z_{12}$ have an exponentially decaying behavior with increasing separation x. According to one exemplary embodiment, this behavior can be modeled as:

$$Z_{12}=\alpha e^{-\beta x} \quad (20)$$

wherein β is a process-dependent parameter, and a is a value of $Z_{12}$ at x=0. The value of a generally depends on contact dimensions. At zero separation, the two contacts merge into a single contact. The value of α is equal to the $Z_{11}$ value of this single, merged contact. Therefore, the value of α can be calculated using the total area and perimeter of the merged contact. In this model, a introduces the area and perimeter dependence of contacts into the $Z_{12}$ model so that the contact cross-coupling resistances depend on the area, perimeter, and spacing of contacts. In contrast, the previous models completely ignore perimeter dependence for cross-coupling resistances.

From simulations, it has been observed that β is independent of the contact dimensions and is a constant for a given substrate process. For this reason, the value of β can be obtained by curve-fitting the value to simulated or measured data. Predicted values from Equation (20) are also shown in FIG. 16. In particular, curve 1630 shows the predicted values for 5 μm contacts, whereas curve 1640 shows the predicted values for 20 μm contacts. As can be seen in FIG. 16, there is good agreement between the simulated values and the predicted values. It can also be seen that β (the slope of the curves 1630 and 1640) is independent of contact geometry since the slopes of the curves 1630, 1640 for different contact sizes are about the same.

Figure 17:
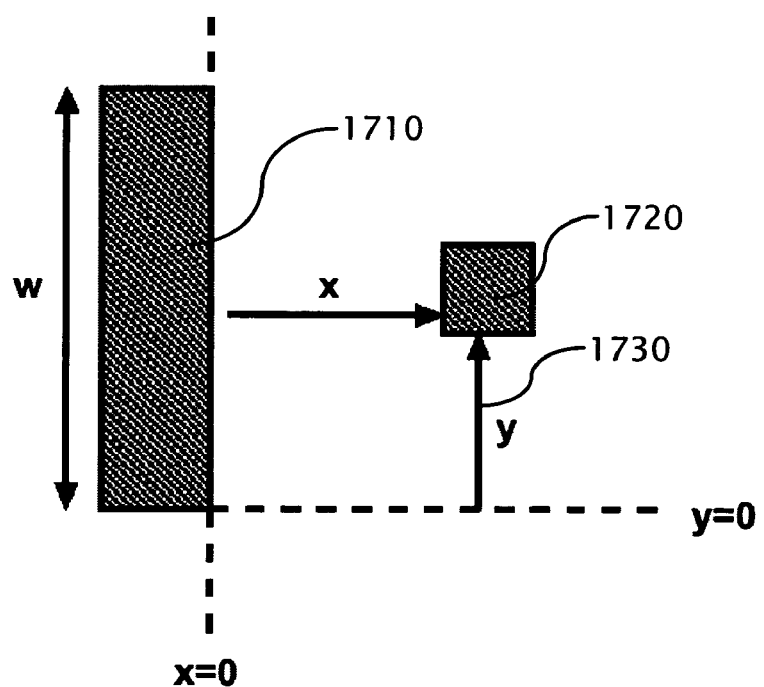
FIG. 17 is a block diagram of a pair of contacts illustrating the relationship of a first contact to a second contact along x and y axes.

The ability to model contacts having various shapes and sizes relative to one another is significant, as most circuits do not have uniform, simple contacts. An example of two contacts with different sizes is shown in FIG. 17. In particular, FIG. 17 shows a first contact 1710 separated from a second contact 1720 by a separation x, wherein x is the distance between inner edges of the two contacts, and a relative position y that is defined to be zero when the bottom edges of two contacts are aligned, and increases in the direction of the arrow 1730. According to the disclosed Z-parameter model, $Z_{12}$ between two contacts decreases exponentially with an increase in the separation x, as was illustrated in FIG. 16, wherein both contacts were assumed to have the same length in they direction.

FIG. 18 is a graph 1800 showing the value of $Z_{12}$ versus relative position y for a fixed separation of 35 μm and a width of 100 μm for the contact 1710 and a width 10 μm for the contact 1720. As seen in FIG. 18, the value of $Z_{12}$ reaches a maximum at y=45 μm, which corresponds to a position at which the center of the smaller contact 1720 coincides with a center of the larger contact 1710 (i.e., when the center coincides with w/2).

According to one exemplary embodiment, the value of $Z_{12}$ can be modeled as a polynomial function of y according to the following equation:

$$Z_{12}=ay^2+by+c \quad (21)$$

wherein coefficients a and b are related to each other since $Z_{12}$ is symmetrical with w/2. Accordingly, $$\frac{w}{2}=\frac{-b}{2a}. \quad (22)$$

In Equation (21), the value of c is equal to the value of $Z_{12}$ at a fixed separation x=$x_a$. The value of c can be found, for example, by:

$$c=Z_{12}|_{x=x_a}=\alpha e^{-\beta x_a}. \quad (23)$$

For Equation (23), $x_a$ is the separation used for curve fitting they dependence of $Z_{12}$. Hence, only one additional parameter is required to model the $Z_{12}$ dependence on the relative contact position.

The coefficients a, b and c are scalable with contact dimensions. Therefore, once the parameters are extracted for a specific contact geometry, they can be scaled for different contact geometries. For instance, FIGS. 19A–19C show two contacts 1910 and 1920 at $x_a=0$ for three different values of y: 100 μm, 80 μm, and 50 μm, respectively. In FIGS. 19A–19C, the first contact 1910 has dimensions of 10 μm×110 μm and the second contact 1920 has dimensions of 10 μm×10 μm. For these three different cases, the maximum deviation in the simulated value of $Z_{11}$ is 1.6%. Thus, the value of $Z_{11}$ is substantially constant for contacts having a fixed area and perimeter. Because the $Z_{11}(\alpha)$ value is independent of y, coefficients a, b, and c are scalable. Further, FIGS. 19A–19C show that the coefficients a, b, and c each have the same dependence on contact dimensions. Thus, the coefficients can be scaled for different geometries using the following relationships:

$$a_{new}=a_{old}\times\frac{\alpha_{new}}{\alpha} \quad b_{new}=b_{old}\times\frac{\alpha_{new}}{\alpha} \quad c_{new}=c_{old}\times\frac{\alpha_{new}}{\alpha} \quad (24)$$

where $a_{old}$ and $a_{new}$ are equal to the $Z_{11}$ value of the merged contacts before and after scaling, respectively.

Figure 20A:
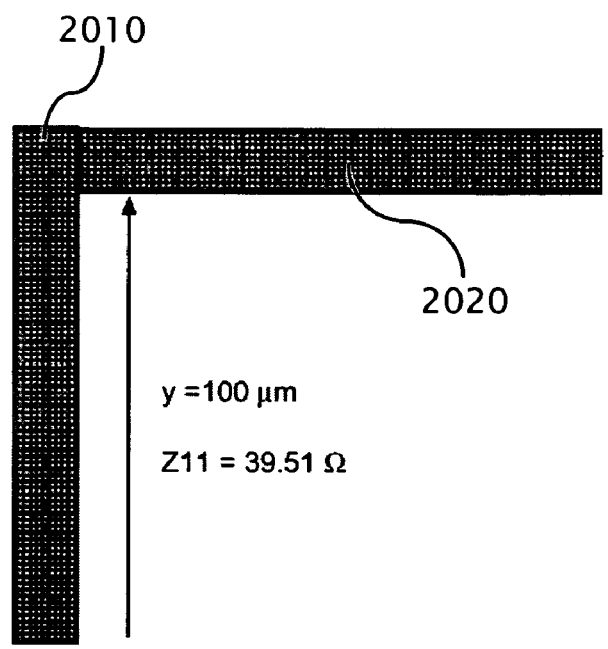
FIG. 20A is block diagram illustrating two exemplary contacts of equal size having a separation x of zero and a relative position y of 100 µm.
Figure 20B:
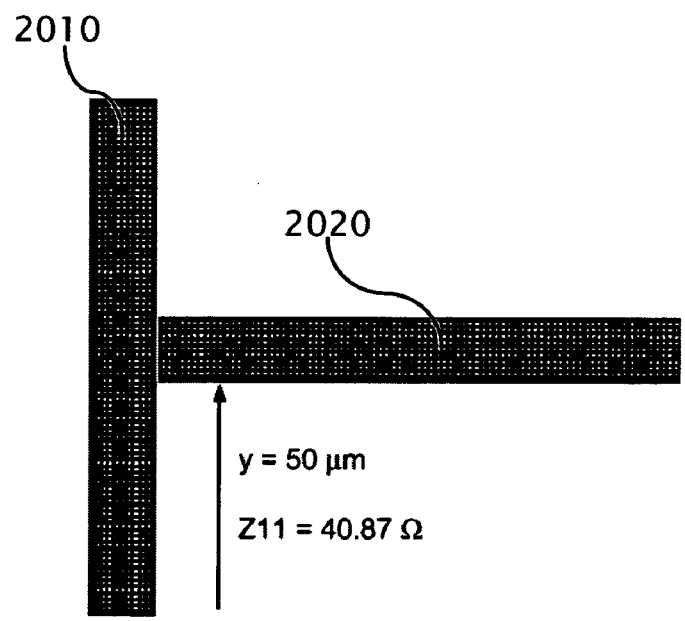
FIG. 20B is a block diagram illustrating the exemplary contacts of FIG. 20A with a relative position of 50 µm.

In FIGS. 19A–19C, the length of the second contact 1920 is small with respect to the first contact 1910. By contrast, FIGS. 20A–20B show two equal-sized contacts 2010, and 2020 for two different y positions. In particular, the first contact 2010 has dimensions of 10 μm×110 μm, and the second contact 2020 has dimensions of 110 μm×10 μm and are shown at y=100 μm and y=500 μm, respectively. As can be seen from the $Z_{11}$ values displayed in FIGS. 19A–19C, the value of $Z_{11}$ is substantially constant for a fixed area and perimeter. In FIG. 20, the illustrated values have a deviation of 3.3%. FIGS. 20A–20B further verify that the coefficients a, b and c are scalable with contact dimensions.

Figure 21:
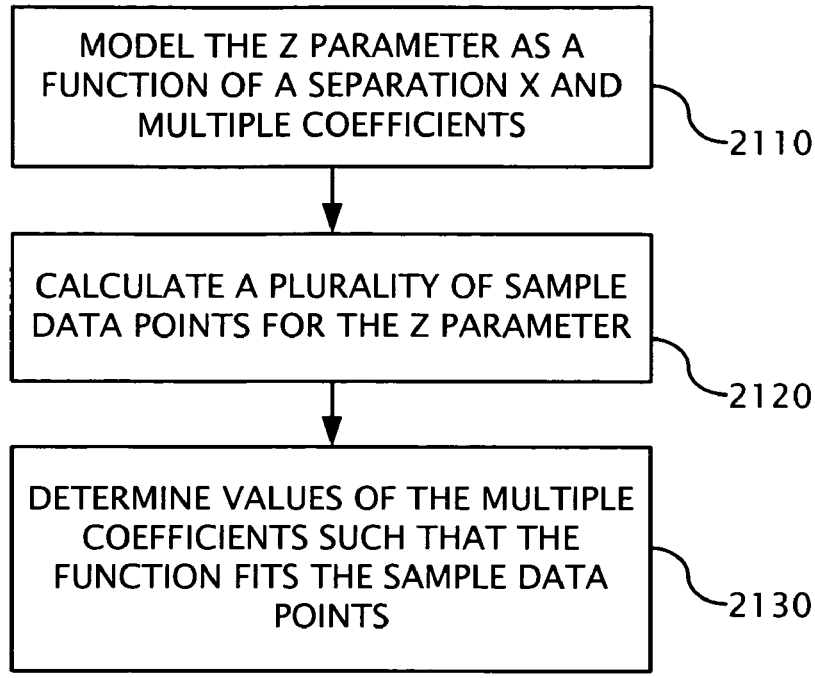
FIG. 21 is a flowchart of an exemplary method for determining a scalable $Z_{12}$ parameter for a pair of contacts in a substrate as a function of a separation x between the contacts.
Figure 22:
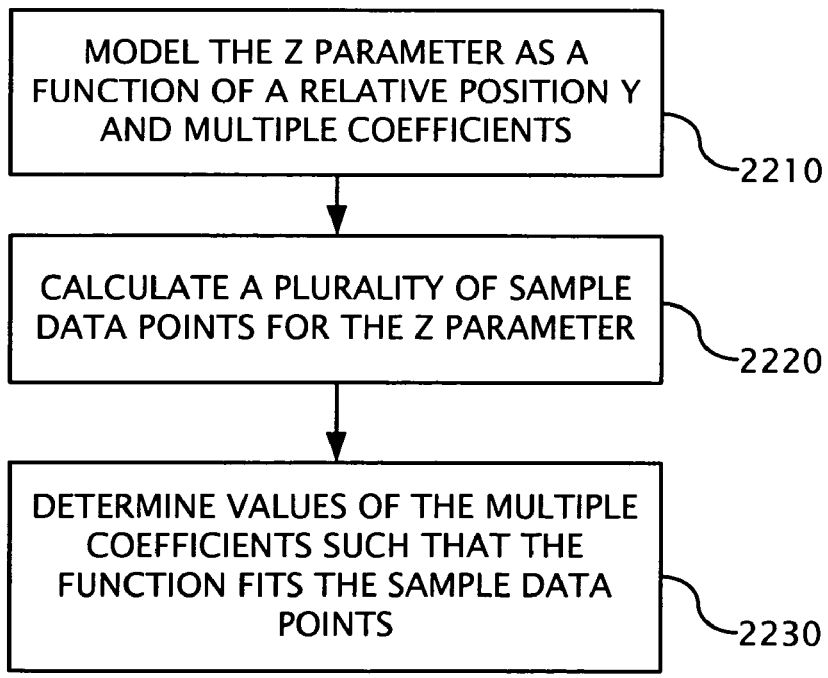
FIG. 22 is a flowchart of an exemplary method for determining a scalable $Z_{12}$ parameter for a pair of contacts in a substrate as a function of a relative position y of the contacts.

FIGS. 21 and 22 are flowcharts showing two exemplary methods for determining $Z_{12}$ as a function of x (FIG. 21) and as a function of y (FIG. 22). As noted above with respect to FIG. 17, $Z_{12}$ is a function of both x and y, where x is the separation between the contacts and y is the relative position of the two contacts. As also noted above, $Z_{12}$ is the ratio of the open-circuit voltage at the first contact to the input current at the second current, with all other contacts as open circuits. Thus, $Z_{12}$ can be written as:

$$Z_{12} = \frac{V_1}{I_2}\bigg|_{I_1=0}. \quad (25)$$

At process block 2110 in FIG. 21, the Z parameter is modeled as a function of the separation x. The function can also include multiple coefficients (or parameter), where at least one of the coefficients is dependent on the properties of the given substrate. For example, the Z parameter can be modeled according to Equation (20):

$$Z_{12} = \alpha e^{-\beta x} \quad (20)$$

where $\beta$ is constant for a given substrate and has units of (1/m), and $\alpha$ depends on the contact dimensions and has units of $\Omega$. At process block 2120, a plurality of different data points (e.g., ten) are calculated for $Z_{12}$ using two contacts (e.g., contacts having a square and/or rectangular geometry). The data points can be obtained, for example, from a three-dimensional simulator or any other suitable method. For each of the data points, the sizes of the contacts and the separations between them can be varied. For example, the separation can be varied over a range of values (e.g., from 10 µm to 120 µm) for multiple contact sizes (e.g., in a range from 2.4 µm to 100 µm). At process block 2130, the values of the multiple coefficients in the function are determined, wherein at least one of the coefficients is determined by curve fitting the function to the sampled data points. In one particular embodiment, for example, the value of $\alpha$ in Equation (20) is determined by solving for the value of the two contacts at zero separation. In particular, the value of $\alpha$ is equal to the $Z_{11}$ value of the two contacts when they are merged into a single contact with zero separation. Thus, the value of $\alpha$ can be obtained from Equation (19), which can be modified as follows:

$$\alpha = \frac{1}{K_1 \text{Area} + K_2 \text{Perim} + K_3} \quad (26)$$

where Area and Perim are the area and the perimeter of the merged contact, respectively. In this particular embodiment, the value of $\beta$ can be determined by curve fitting Equation (20) above with the data points and the value of $\alpha$ obtained according to Equation (26). A variety of known curve-fitting techniques can be used.

FIG. 22 is a flowchart showing an exemplary method for determining $Z_{12}$ as a function of y. At process block 2210, the Z parameter is modeled as a function of the relative position y. The function can further include multiple coefficients (or parameters), where at least one of the coefficients is scalable with the contact dimensions. For example, the Z parameter can be modeled according to Equation (21):

$$Z_{12} = ay^2 + by + c \quad (21)$$

where a, b, and c are scalable with the contact dimensions and have units of $\Omega/m^2$, $\Omega/m$, and $\Omega$, respectively. At process block 2220, a plurality of different data points (e.g., ten) are calculated for $Z_{12}$ using two contacts (e.g., contacts having a square and/or rectangular geometry). The data points can be obtained, for example, from a three-dimensional simulator or any other suitable method. In one particular embodiment, the geometries of the contacts are chosen such that one of the contacts is larger than the other, and the value of y is adjusted for several values from 0 µm to the size of the larger contact for a fixed separation $x_a$. This process can be repeated for contacts having different geometries until the desired number of data points is obtained. Moreover, the geometry of the contacts chosen can also vary. For example, the contact sizes can be in the range from 2.4 µm to 100 µm, though this range is not limiting. At process block 2230, the values of the multiple coefficients in the function are determined, wherein at least one of the coefficients is determined by curve fitting the function to the sampled data points. In one particular embodiment, the value of c in Equation (21) is determined. The value of c can be obtained using the following relationships:

$$Z_{12}|_{y=0} = c \text{ and } Z_{12}|_{y=0} = ay^2 + by + c|_{y=0} = c \quad (27)$$

Thus, $$c = Z_{12}|_{y=0} = \alpha e^{-\beta x_a}. \quad (28)$$

The values of a and b in Equation (21) can be determined by curve fitting to the data points obtained in process block 2220 and the value of c. A variety of known curve-fitting techniques can be used.

In certain embodiments, once the coefficients have been extracted for a specific pair of contacts, new coefficients can be obtained for any contact size. For example, with respect to the model shown in Equation (21), when the contact dimensions change, the new value of $\alpha$ for the contact pair can be calculated by:

$$\alpha_{new} = \frac{1}{K_1 \times \text{Area}_{new} + K_2 \times \text{Perim}_{new} + K_3} \quad (29)$$

where $\text{Area}_{new}$ and $\text{Perim}_{new}$ are the area and the perimeter of the new merged contacts at zero separation, respectively. Likewise, $Z_{12}$ for different contact sizes can be calculated by scaling coefficients a, b and c by $$\frac{\alpha_{new}}{\alpha}.$$

When x and y change at the same time, $Z_{12}$ can be modeled as the product of these two effects according to the following equation:

$$Z_{12} = [ay^2 + by + c]e^{-\beta(x-x_a)}. \quad (30)$$

Any of the methods described above for determining a scalable Z parameter can be modified for use with Equation (30).

Figure 23:
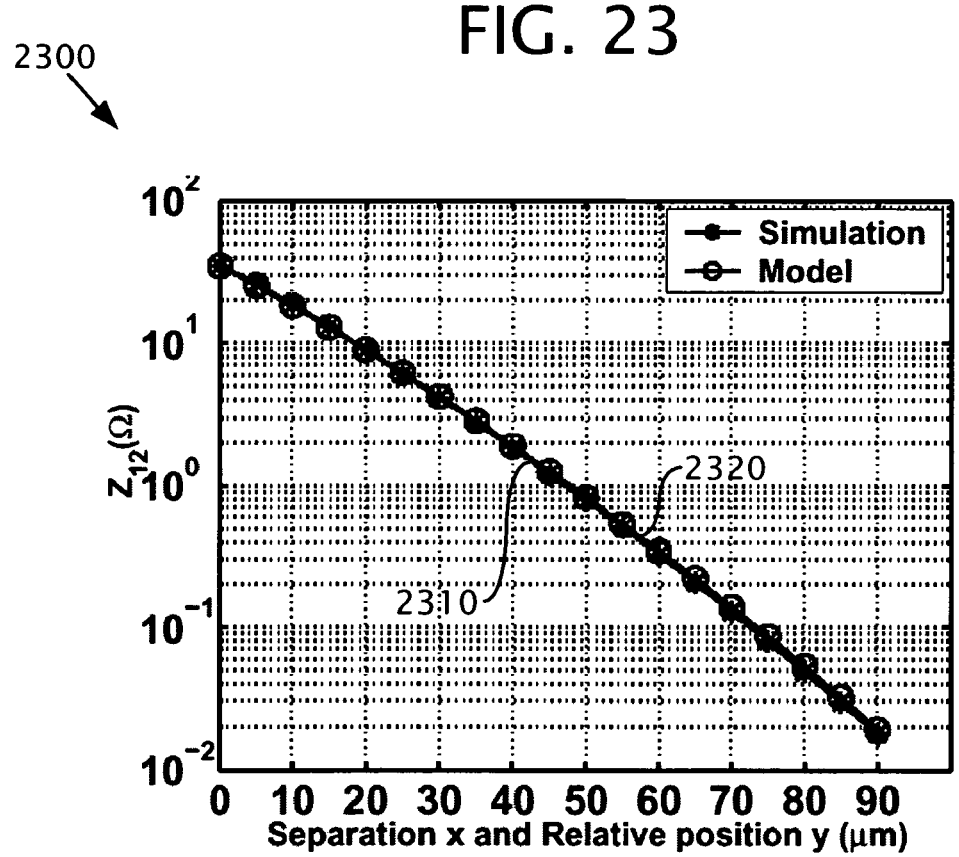
FIG. 23 is a logarithmic graph of $Z_{12}$ as a function of the separation x and the relative position y showing values calculated by a three-dimensional simulator and values predicted by an exemplary Z-parameter model.

FIG. 23 is a logarithmic graph 2300 showing the value of $Z_{12}$ versus the separation x and relative position y as they change simultaneously. In particular, graph 2300 shows two curves 2310, 2320 representing the values of $Z_{12}$ predicted by a three-dimensional simulator and by Equation (30), respectively. Because the two curves 2310, 2320 are in good agreement with one another, they are essentially overlapping in FIG. 23.

Figure 24:
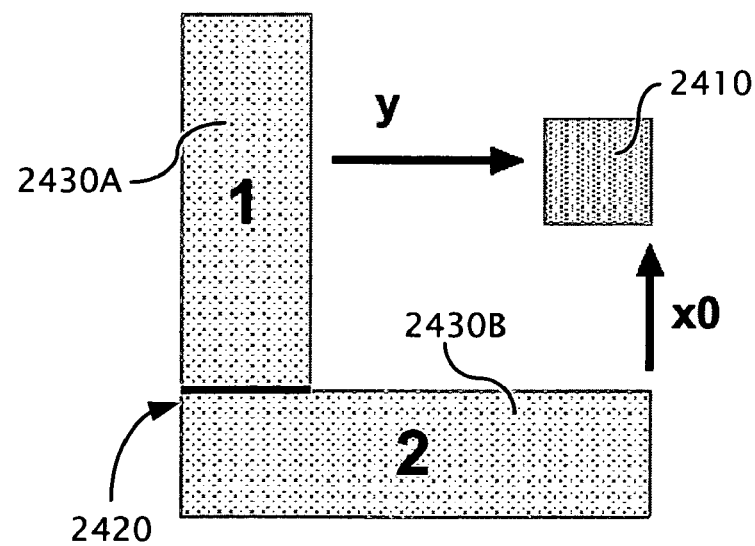
FIG. 24 is a block diagram of an exemplary pair of contacts illustrating the relationship of a first contact to a second contact along x and y axes and showing that the first contact has a complex shape and can be divided into smaller portions.

FIG. 24 shows a first contact 2410 that is partially surrounded by another contact 2420. As shown in FIG. 24, the number of interacting (i.e., coupling) sides to the first contact 2410 is more than one. Consequently, the contact 2420 can be divided into smaller rectangular portions 2430A and 2430B. The coupling of the contact 2410 with portions 2430A and 2430B can be calculated separately using the models presented above. In one embodiment, the overall $Z_{12}$ between the two contacts is found by superposing the $Z_{12}$ values calculated for the smaller portions.

Figure 25:
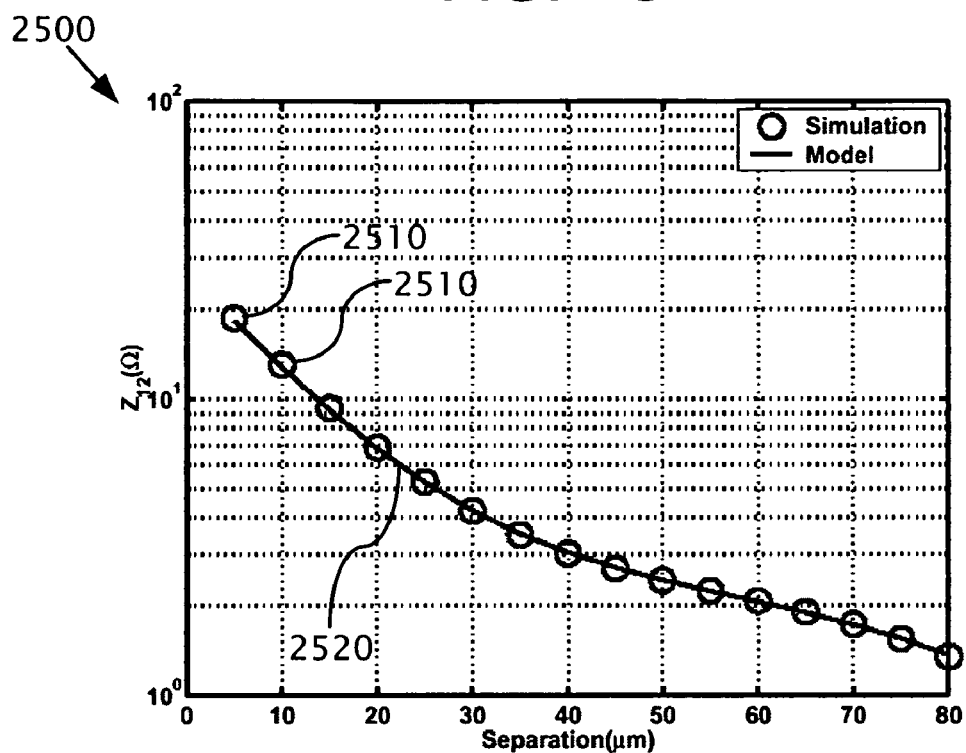
FIG. 25 is a logarithmic graph of $Z_{12}$ as a function of the separation y for the pair of contacts shown in FIG. 24 at a separation x of 30 µm showing values calculated by a three-dimensional simulator and values predicted by an exemplary Z-parameter model.
Figure 26:
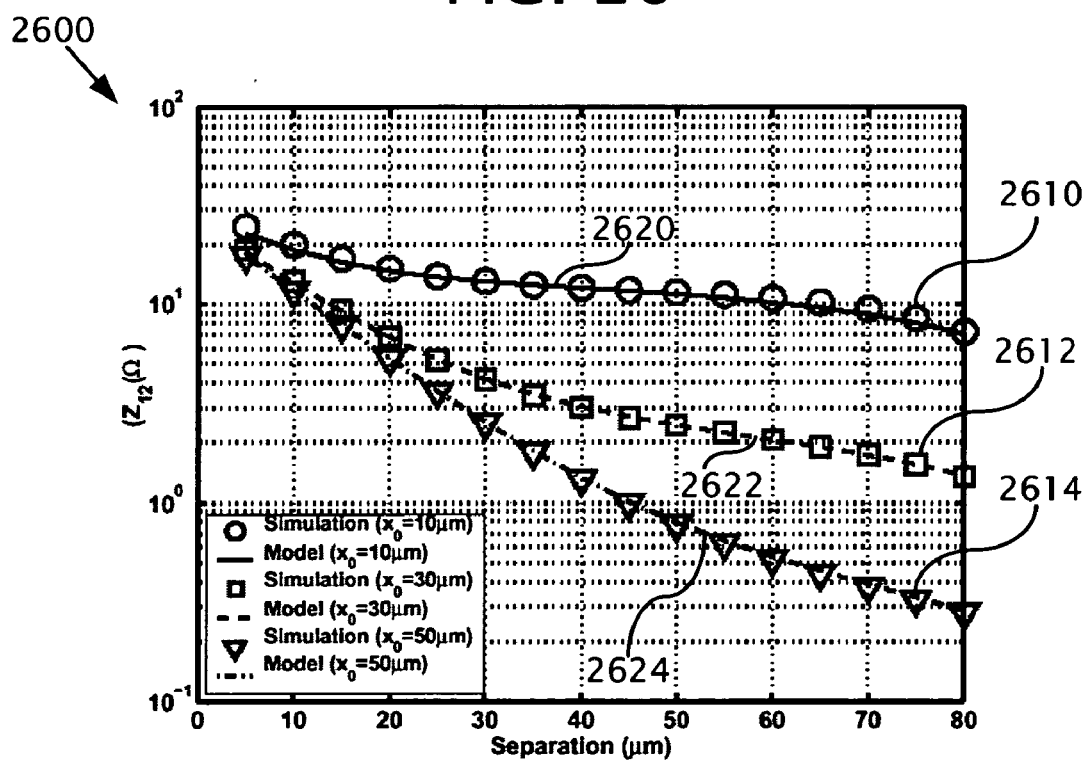
FIG. 26 is a logarithmic graph of $Z_{12}$ as a function of the separation y for the pair of contacts shown in FIG. 24 at separations x of 10 µm, 30 µm, and 50 µm showing values calculated by a three-dimensional simulator and values predicted by an exemplary Z-parameter model.

FIGS. 25 and 26 are logarithmic graphs 2500 and 2600 showing a comparison between the values of $Z_{12}$ and a separation y predicted using Equation (30) and using a three-dimensional simulator for the contact architecture shown in FIG. 24. For both FIGS. 25 and 26, the size of contact 2410 was 10 μm×10 μm and the L-shaped contact 2420 comprised two 10 μm×100 μm rectangles. FIG. 25 shows data points 2510 calculated by a three-dimensional simulator and a curve 2520 predicted by Equation (30) for the architecture shown in FIG. 24 where $x_0$=30 μm. Similarly, FIG. 26 shows data points 2610, 2612, 2614 calculated by a three-dimensional simulator for $x_0$=10, 30, and 50 μm, respectively. FIG. 26 also shows curves 2620, 2622, 2624 predicted by Equation (30) for the same values of $x_0$. As can be seen from FIGS. 25 and 26, there is good agreement between Equation (30) and the simulated results.

Figure 27:
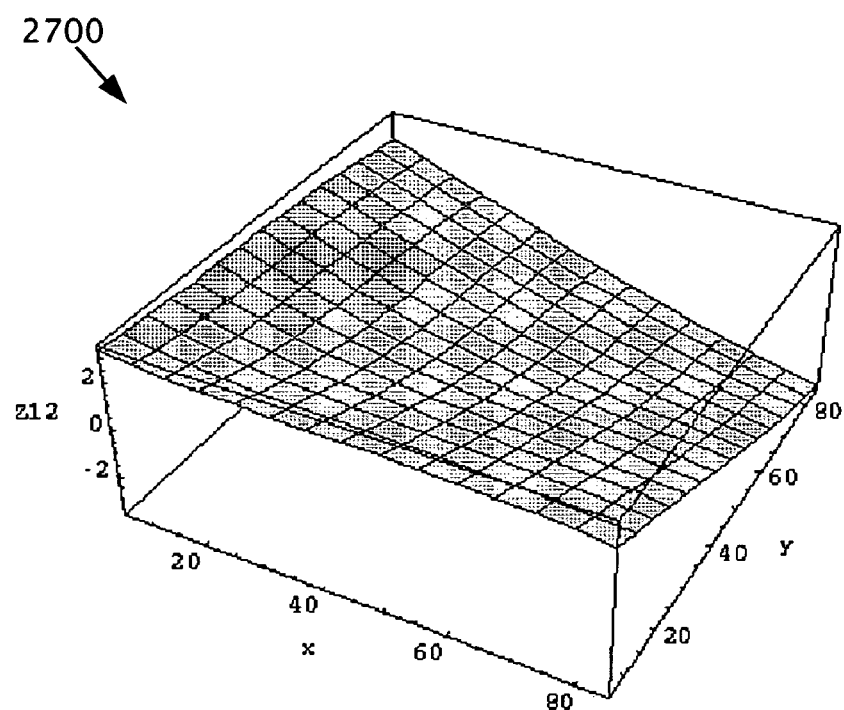
FIG. 27 is a cross section of a three-dimensional plot of $Z_{12}$ values for the contacts shown in FIGS. 24 and 29 at various x and y positions.
Figure 28:
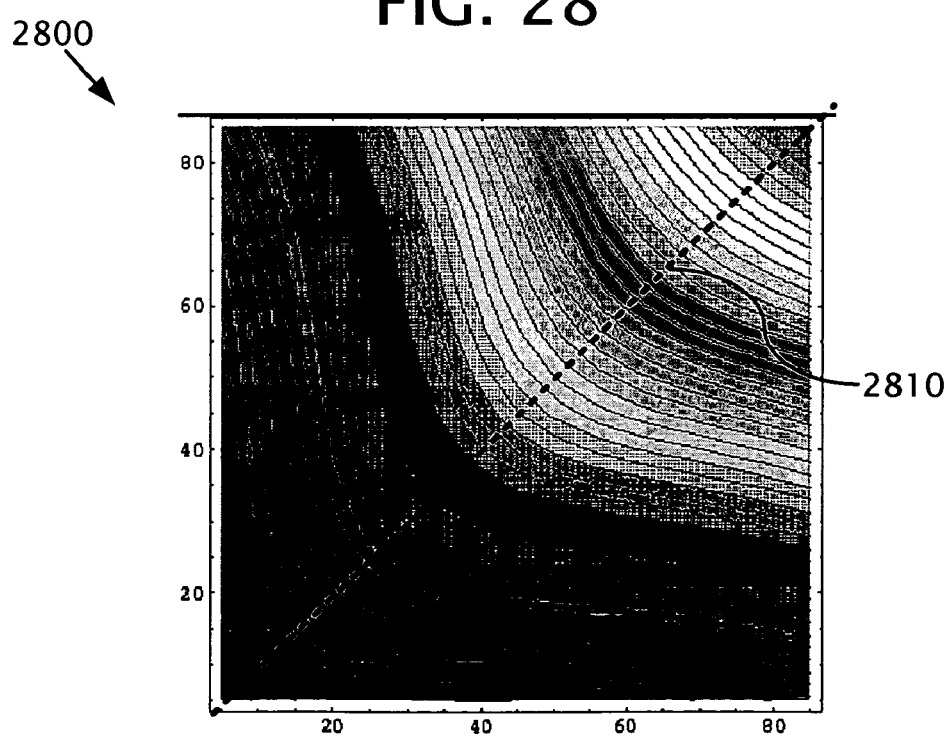
FIG. 28 is a two-dimensional plot along the x and y axes of the three-dimensional plot shown in FIG. 27.
Figure 29:
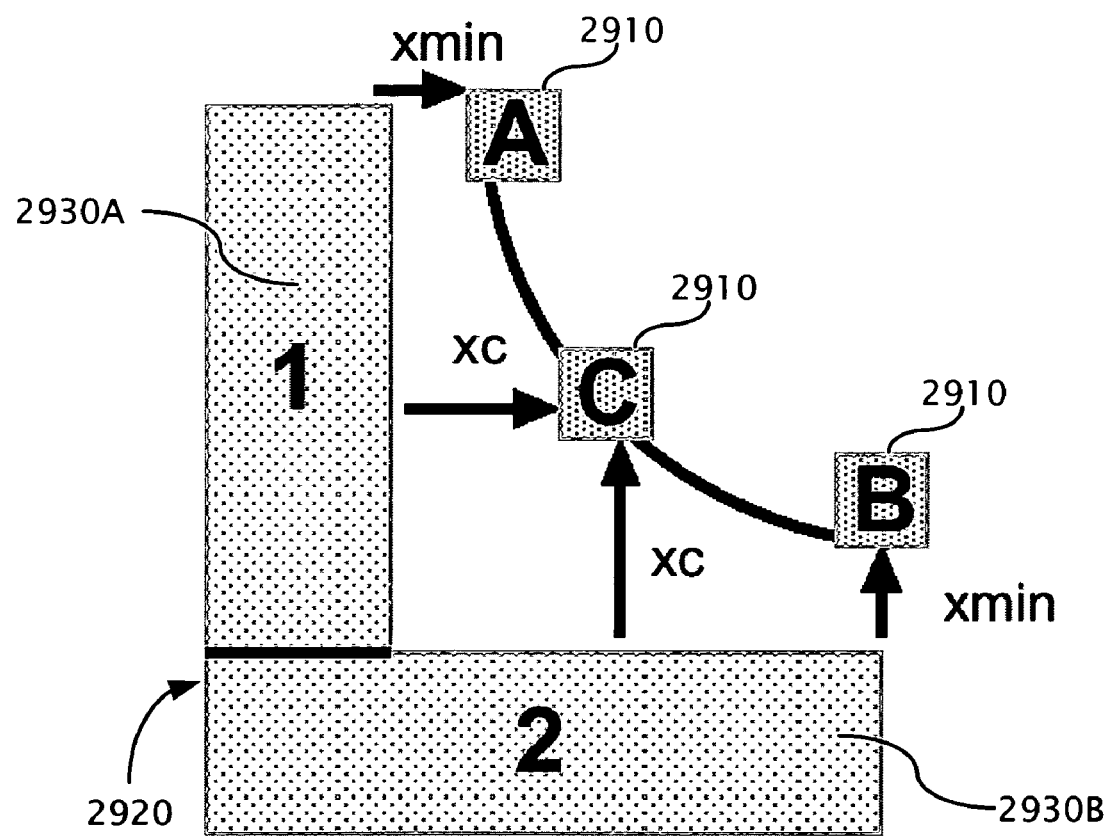
FIG. 29 is a block diagram of the exemplary pair of contacts from FIG. 24 illustrating the relationship of the first contact to the second contact in various relative positions on the x and y axes.

FIG. 27 expands these results into three-dimensions and shows a cross section 2700 of a three-dimensional plot of $Z_{12}$ as a function of x and y. FIG. 28 shows the cross section 2700 as a two-dimensional plot 2800 along only the x and y axes. In FIG. 28, the value of the $Z_{12}$ increases as the contour lines darken. FIG. 29 is a block diagram of the contact architecture used to obtain FIGS. 27 and 28, and illustrates various aspects of the figures. For example, with reference to FIG. 29, consider the movement of the small square contact 2910 along the contour lines shown in FIG. 28. When the small contact 2910 is close to portion 2930A, the major component of the resulting coupling will be from the portion 2930A. This situation is illustrated when the square contact 2910 is located at the point labeled "A" in FIG. 29. By contrast, when the small contact 2910 is at the point labeled "B," the maximum coupling is due to the portion 2930B. At the point labeled "C," the square contact 2910 is equidistant from both the portions 2930A and 2930B. Thus, the coupling from both the portions 2930A, 2930B is equally significant. Because of the contribution from both portions 2930A, 2930B, the $Z_{12}$ value is the same as that at point A or B, even though it is not at a minimum distance from either portion 2930A or 2930B. As shown in FIG. 28, a symmetry axis 2810 exists along the diagonal of the L-shaped contact 2920 due to the symmetry of the contact shape. These models were also tested on asymmetric shapes and a good agreement was found between simulated values and values predicted by the models.

Figure 30:
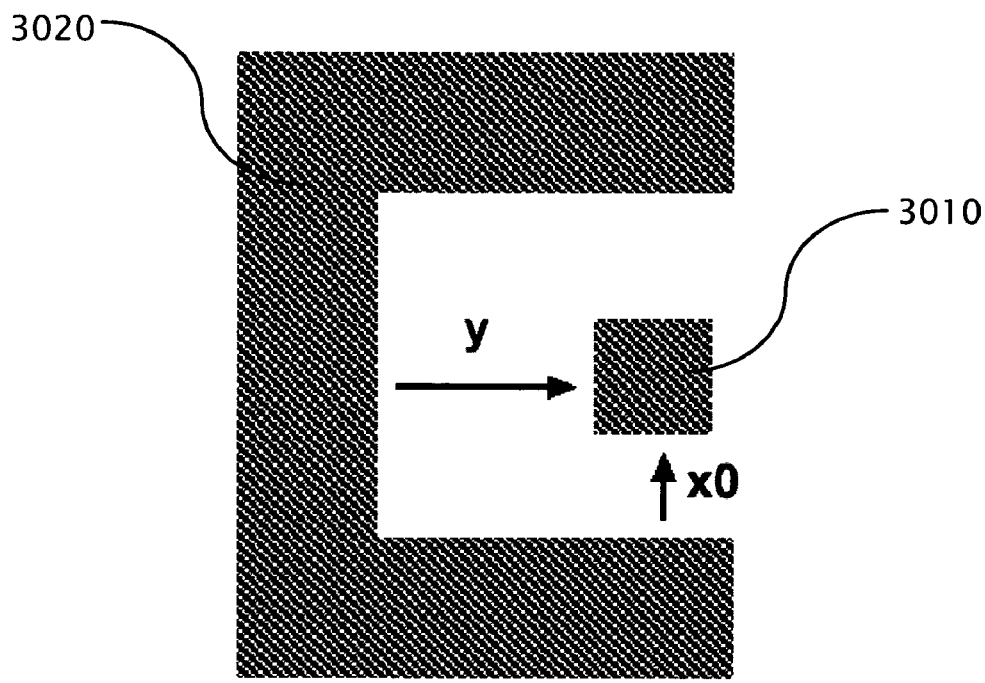
FIG. 30 is a block diagram of an exemplary pair of contacts where one of the contacts is C-shaped.
Figure 31:
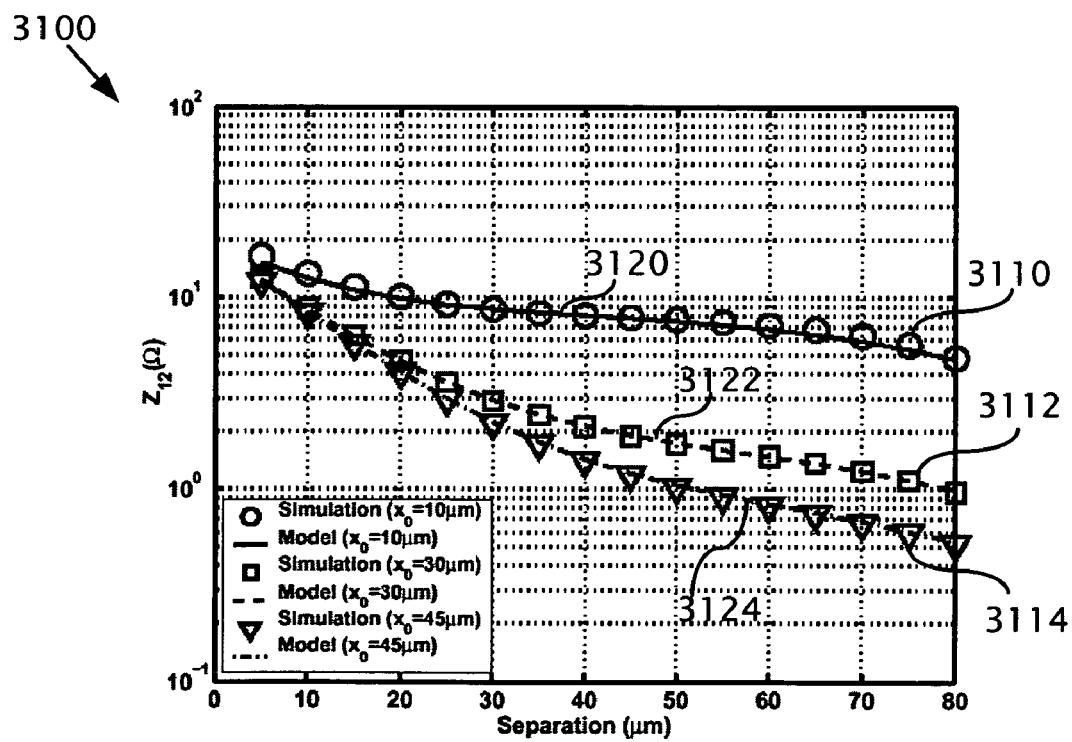
FIG. 31 is a logarithmic graph of $Z_{12}$ as a function of a separation y for the pair of contacts shown in FIG. 30 at separations x of 10 µm, 30 µm, and 45 µm showing values calculated by a three-dimensional simulator and values predicted by an exemplary Z-parameter model.
Figure 32:
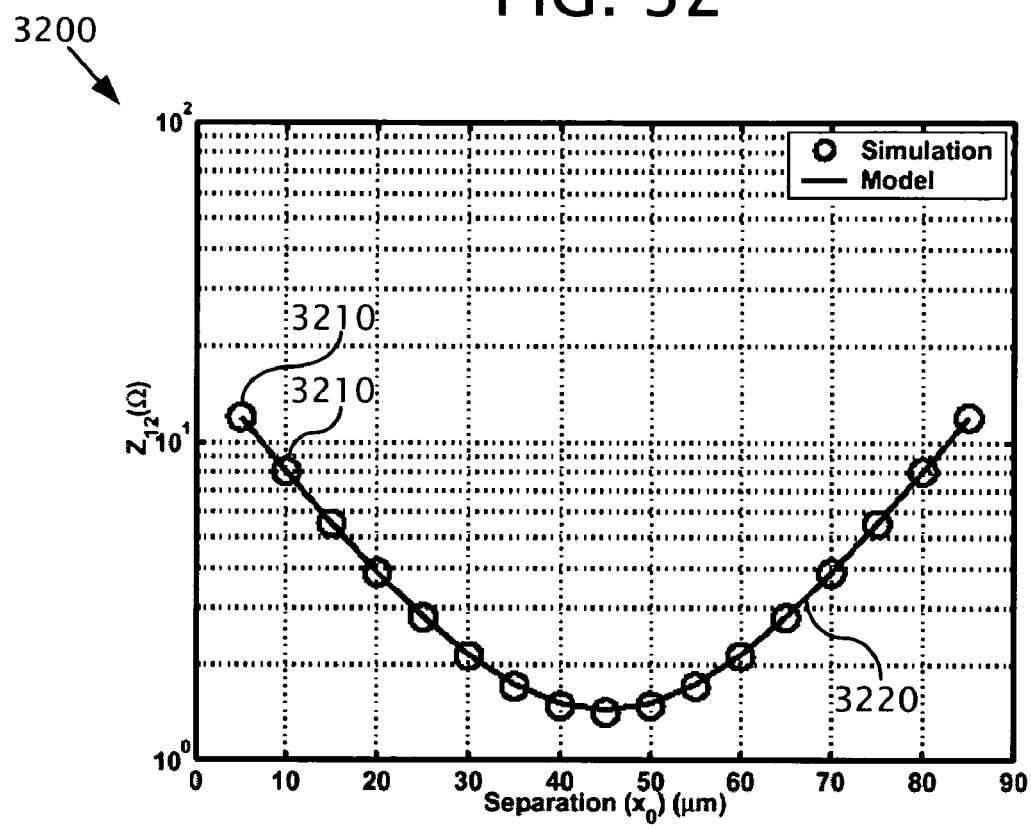
FIG. 32 is a logarithmic graph of $Z_{12}$ as a function of a separation x for the pair of contacts shown in FIG. 30 at a separation y of 30 µm showing values calculated by a three-dimensional simulator and values predicted by an exemplary Z-parameter model.

FIG. 30 illustrates an example of three-sided coupling between a square contact 3010 and a U-shaped contact 3020. FIG. 31 is a logarithmic graph 3100 showing a comparison between the value of $Z_{12}$ and a separation y predicted by the Equation (30) and calculated by a three-dimensional simulator for the contact architecture shown in FIG. 30. FIG. 31 shows data points 3110, 3112, 3114 predicted by a three-dimensional simulator where $x_0$=10, 30 and 45 μm, respectively. FIG. 31 also shows curves 3120, 3122, 3124 predicted by Equation (30) for the same values of $x_0$. FIG. 32 is a similar logarithmic graph 3200 showing a comparison between the value of $Z_{12}$ and a separation x where y has a value of 40 μm. FIG. 32 shows data points 3210 calculated by a three-dimensional simulator and a curve 3220 predicted by Equation (30) for the architecture shown in FIG. 30. For both FIGS. 31 and 32, the contact 3010 was 10 μm×10 μm and the U-shaped contact 3020 comprised three 10 μm×100 μm rectangles. As can be seen by FIGS. 31 and 32, there is good agreement between Equation (30) and the simulated results.

Figure 33:
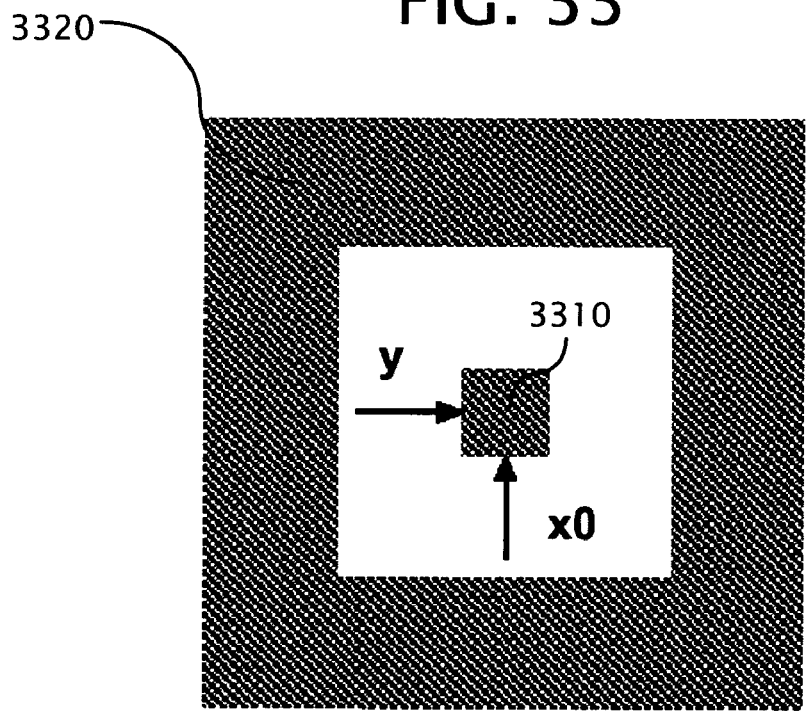
FIG. 33 is a block diagram of an exemplary pair of contacts where one of the contacts is square.
Figure 34:
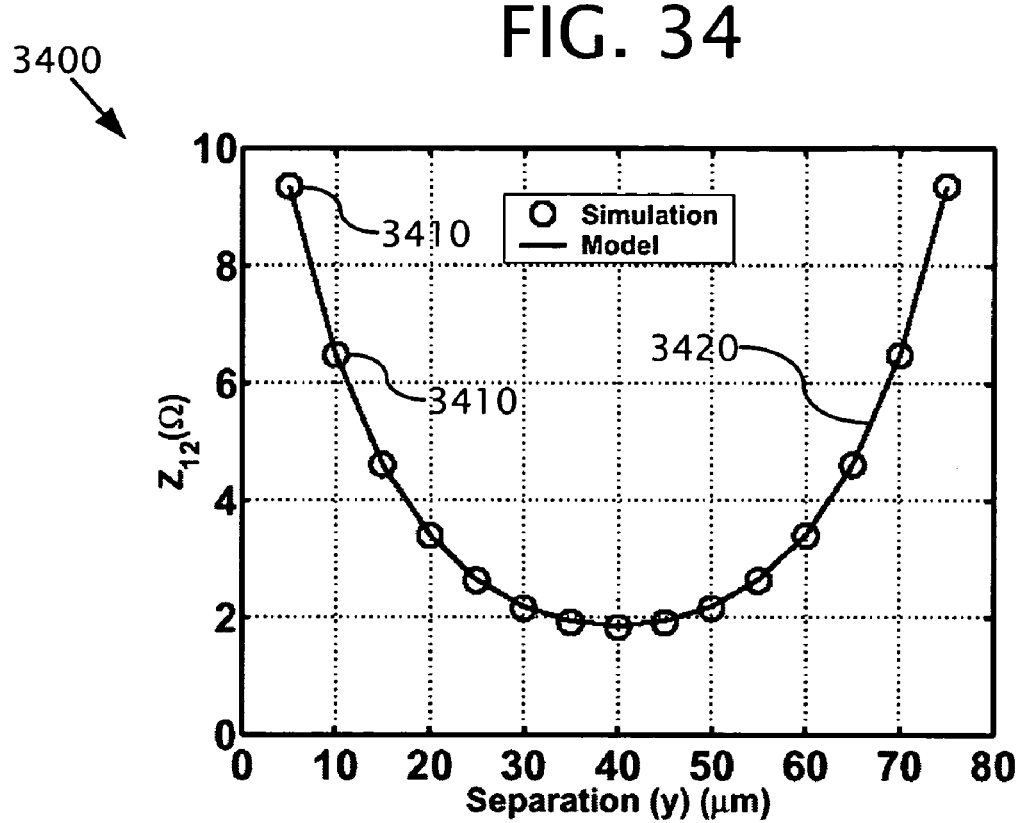
FIG. 34 is a graph of $Z_{12}$ as a function of a separation y for the pair of contacts shown in FIG. 33 at a separation x of 40 µm showing values calculated by a three-dimensional simulator and values predicted by an exemplary Z-parameter model.
Figure 35:
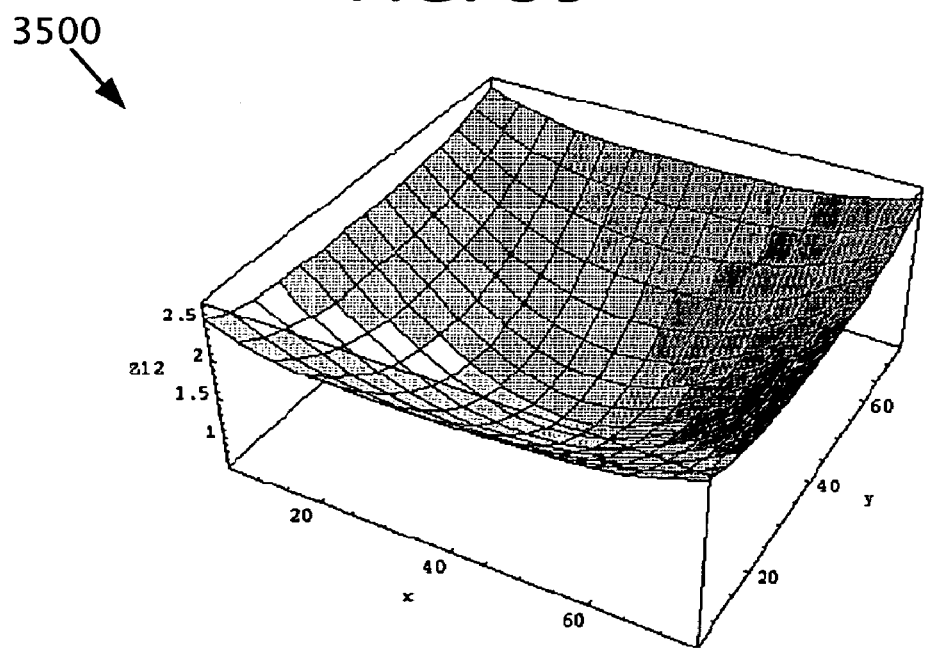
FIG. 35 is a cross section of a three-dimensional plot of $Z_{12}$ values for the contacts shown in FIG. 33 at various x and y positions.

FIG. 33 illustrates an example of four-sided coupling between a square contact 3310 and a surrounding square contact 3320. FIG. 34 is a graph 3400 showing a comparison between the value of $Z_{12}$ and a separation y predicted by Equation (30) and by a three-dimensional simulator for the contact architecture shown in FIG. 33. In particular, FIG. 34 shows data points 3410 that were calculated by a three-dimensional simulator and a curve 3420 predicted by Equation (30) for the architecture shown in FIG. 33. FIG. 35 is a three-dimensional plot of $Z_{12}$ for varying x and y values for the architecture shown in FIG. 33. For both FIGS. 34 and 35, the contact 3310 was 10 μm×10 μm and the square-shaped contact 3320 comprised four 10 μm×100 μm rectangles. As can be seen by FIGS. 34 and 35, there is good agreement between Equation (30) and the simulated results.

Experimental Results

In this section, a comparison of the accuracy of the Z-parameter models for heavily doped substrate with three-dimensional simulations for a wide variety of contact shapes and spacings is presented. These examples demonstrate that the disclosed embodiments are both accurate and efficient in predicting substrate resistances. In previous numerical-based approaches, contacts are divided into smaller panels and a large resistive network extracted. In these panel-based approaches, charge or current distribution is calculated for equipotential contact surfaces. Because the current distribution is not uniform on the surface, each contact needs to be divided into panels. As a result, the resistive arrays become large and require a significant computational effort. By contrast, the disclosed Z-parameter models can be used directly to generate a compact network representation in an efficient manner.

FIG. 36A illustrates a non-scalable approach and shows two contacts 3610, 3620 discretized into panels. By contrast, FIG. 36B shows the same contacts 3610, 3620 as used in certain exemplary embodiments of the disclosed models. Table 2 is a comparison of the resistance values calculated from an exemplary embodiment of the disclosed models versus the resistance values calculated using simulations. As seen in Table 2, the error between the two less than 5%.

TABLE 2

Comparison of simulated and modeled resistance values for FIGS. 36A and 36B

|  | $R_{11}(\Omega)$ | $R_{22}(\Omega)$ | $R_{12}(k\Omega)$ |
| --- | --- | --- | --- |
| Model | 221 | 221 | 21.7 |
| Simulation | 232 | 232 | 22.2 |

The disclosed, Z-parameter models can also be used for contacts of different shapes. For example, consider contacts 3710 and 3720 shown in FIG. 37A. Table 3 shows the resistance values for the contacts in FIG. 37A with a separation of 40 μm as calculated by an exemplary embodiment of the disclosed models and by simulations. As seen in Table 3, the exemplary Z-parameter model accurately computes the substrate resistances within 5% of the simulated values.

TABLE 3

Comparison of simulated and modeled resistance values for FIG. 37A

|  | $R_{11}(\Omega)$ | $R_{22}(\Omega)$ | $R_{12}(k\Omega)$ |
|---|---|---|---|
| Model | 252 | 294 | 10.96 |
| Simulation | 264 | 292 | 11.29 |

Figure 37B:
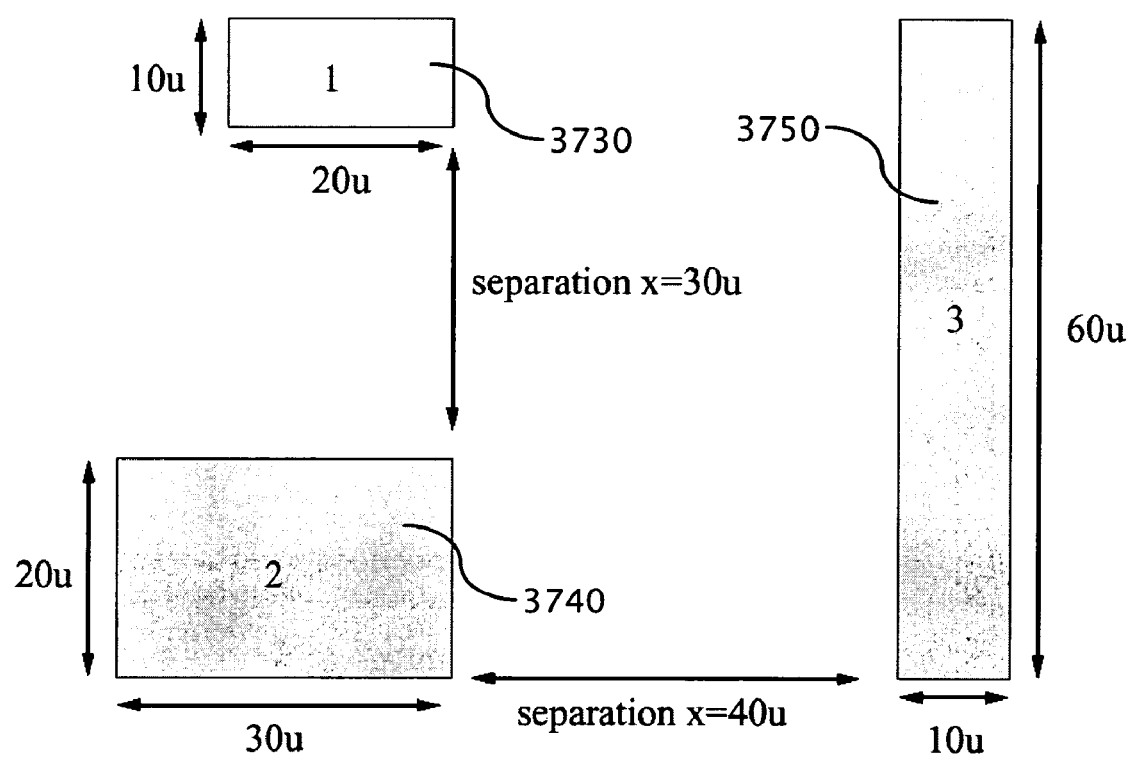
FIG. 37B is a block diagram showing three exemplary contacts used to compare a known method with an exemplary Z-parameter model.

The disclosed, Z-parameter models can also be used for more than two contacts. For example, FIG. 37B shows three contacts 3730, 3740, and 3750. Table 4 shows the computed resistance values for the contacts in FIG. 37B. As seen in Table 4, an exemplary embodiment of the disclosed models accurately computes the substrates resistances within 8% of the simulated values.

TABLE 4

Comparison of simulated and modeled resistance values for FIG. 37B

| Element | Model | Simulation |
|---|---|---|
| $R_{11}$ | 249 Ω | 261 Ω |
| $R_{22}$ | 138 Ω | 141 Ω |
| $R_{33}$ | 109 Ω | 118 Ω |
| $R_{12}$ | 6.9 kΩ | 7.3 kΩ |
| $R_{13}$ | 21.4 kΩ | 22.4 kΩ |
| $R_{23}$ | 14.4 kΩ | 14.2 kΩ |

As can be seen, the traditional approaches divide the contacts into smaller panels before extracting the resistive network for the substrate. With certain embodiments of the Z-parameter models, however, the resistance values can be directly extracted. For example, consider the network shown in FIGS. 36A and 36B. For FIG. 36A, each pair of contacts was discretized into a 20×20 matrix. The resistance values were then determined by inverting this dense matrix, a process that has a complexity of $20^3$ if a direct method is used. Using certain embodiments of the disclosed Z-parameter models, however, only the inverse of a 2×2 matrix needs to be calculated. Next, consider the three contact case shown in FIG. 38. Using the known panel-based method, a first contact 3810 is divided into $n_1$ panels, a second contact 3820 into $n_2$ panels, and a third contact 3830 into $n_3$ panels. As a result of this contact discretization, the Z matrix will be a dense matrix of size $(n_1+n_2+n_3)\times(n_1+n_2+n_3)$. By contrast, certain embodiments of the disclosed Z-parameter model have a matrix size of 3×3 for the three contacts.

In general, the Z matrix for the panel-based approach has a size $Z_{size}$ of:

$$Z_{size} = \left(\sum_{i=1}^{K} n_i\right)\left(\sum_{i=1}^{K} n_i\right) \quad (31)$$

where K is the number of contacts and $n_i$ is the number of panels for the ith contact. By contrast, the size of the matrix for certain embodiments of the disclosed scalable approach have a size of K×K, which is a substantially smaller matrix. On account of this smaller matrix size, the disclosed Z-parameter model is computationally efficient and can handle a large number of contacts.

Figure 38:
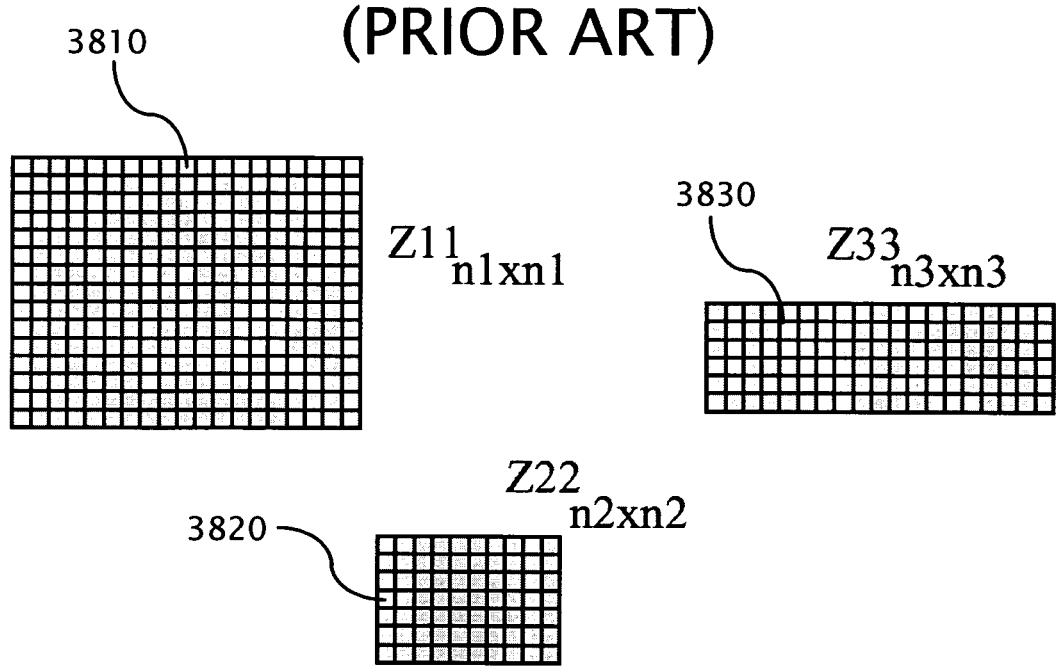
FIG. 38 is a block diagram showing three contacts discretized according to a known method.

Table 5 shows a comparison of the approaches for the examples given in FIGS. 36, 37, and 38.

TABLE 5

Size of simulated and modeled Z matrices for Tables 2–4.

| Example | Model | Simulation |
|---|---|---|
| FIG. 36 | 2 × 2 | 880 × 880 |
| FIG. 37 | 2 × 2 | 395 × 395 |
| FIG. 38 | 3 × 3 | 1267 × 1267 |

The disclosed Z-parameter model has been validated on a test chip. The test chip was fabricated by a 0.35 μm CMOS TSMC process through MOSIS. The chip had several substrate test structures. The test structures that were used for validation of the Z-parameter model had several p[+] contacts of different shapes and sizes. All the contacts were connected to 60 μm×60 μm DC probe pads. The measurement setup consisted of an HP 4156B semiconductor-parameter analyzer and a CASCADE probe station.

The test chip had a downbond that made an electrical connection from the package cavity to the bottom of the chip. This downbond was also connected to one of the chip's pads, making it possible to ground the backplane during the measurements by using a pin. The backplane of the die was contacted to a down-bonding metal plate through the conductive epoxy. The contact between the substrate and the epoxy behaved as a nonlinear element, which had to accounted for in the measurement results. The backplane nonlinearity could be characterized, for example, using the method described in A. Samavedam et al., "A Scalable Substrate Noise Coupling Model for Design of Mixed-Signal ICs," *IEEE Journal of Solid-State Circuits*, vol. 35, pp. 895–903, June 2000.

Figure 39:
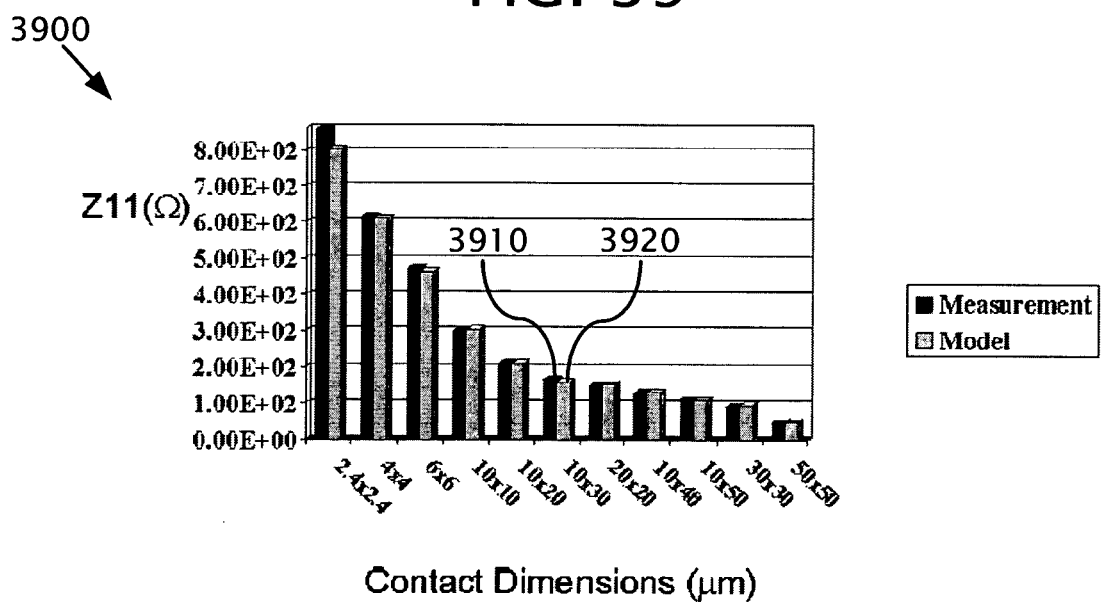
FIG. 39 is a bar graph showing a comparison of $Z_{11}$ measured from a test chip and predicted by an exemplary Z-parameter model.

FIG. 39 is a bar graph 3900 showing measured $Z_{11}$ values 3910 versus predicted $Z_{11}$ values 3920 from an exemplary Z-parameter model for a variety of different-sized rectangular contacts. The curve-fitting parameters (in this case, the parameters from Equation (19)) obtained from the measured $Z_{11}$ values were: $K_1=3.9157\times10^6$ (1/Ωm$^2$), $K_2=55.3087$ (1/Ωm), and $K_3=6.9400\times10^{-4}$ (1/Ω). By comparison, the curve-fitting parameters obtained from the simulated data and used in the Z-parameter model were: $K_1=3.1911\times10^6$ (1/Ωm$^2$), $K_2=47.6177$ (1/Ωm), and $K_3=7.0579\times10^{-4}$ (1/Ω).

Figure 40:
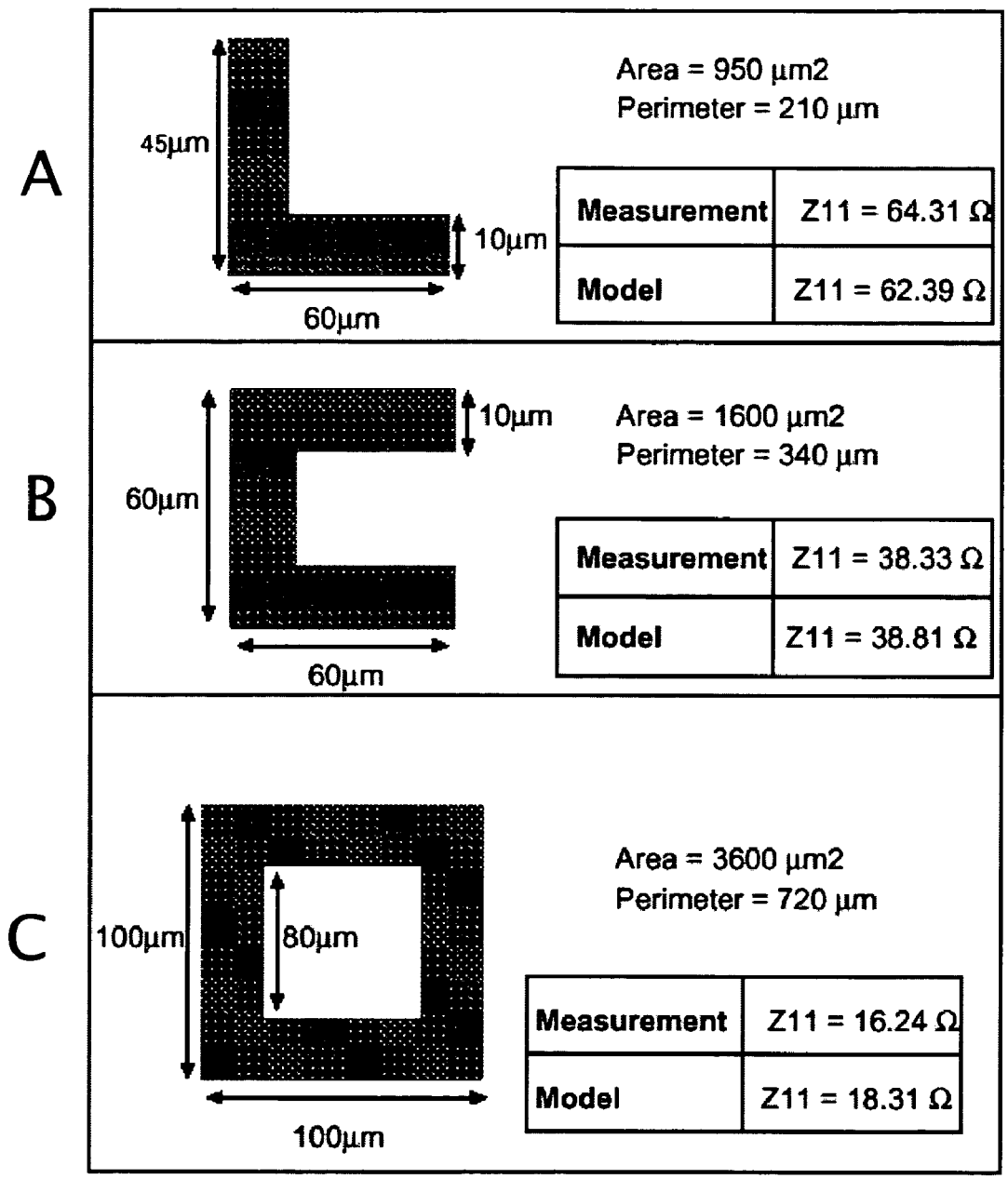
FIG. 40A is a block diagram showing a comparison of a $Z_{11}$ value for an exemplary L-shaped contact as measured in a test chip and as predicted by an exemplary Z-parameter model.
FIG. 40B is a block diagram showing a comparison of a $Z_{11}$ value for an exemplary U-shaped contact as measured in a test chip and as predicted by an exemplary Z-parameter model.
FIG. 40C is a block diagram showing a comparison of a $Z_{11}$ value for an exemplary square-shaped contact as measured in a test chip and as predicted by an exemplary Z-parameter model.

The test chip included many different contact geometries in addition to the standard rectangular contacts. Measurement results show that the exemplary Z-parameter model also predicts $Z_{11}$ values accurately for the different shapes. For example, FIGS. 40A–40C show an exemplary L-shaped contact, a U-shaped contact, and a square-shaped contact, along with the resulting resistances determined by actual measurements and as predicted by the exemplary model. The area and perimeter for each contact is also shown in FIGS. 40A–40C. As can be seen by the values displayed, the exemplary model agrees with the measurements for all three contacts.

Figure 41:
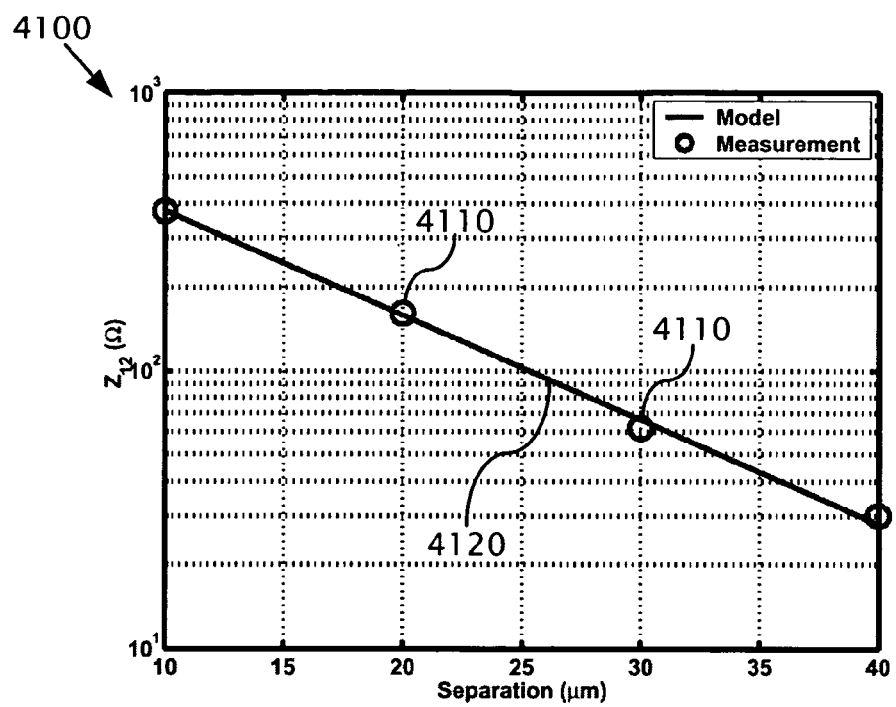
FIG. 41 is a logarithmic graph of $Z_{12}$ as a function of a separation x showing values measured on a test chip and for values predicted by an exemplary Z-parameter model.

In order to measure a variety of $Z_{12}$ values, an array of contacts with different separations in the test chip was used. For example, eight 2.4 μm×2.4 μm contacts having four different separations were considered. FIG. 41 is a logarithmic graph 4100 displaying the value of $Z_{12}$ as a function of separation x between the contacts. In particular, the graph 4100 shows data points 4110 corresponding to the measured values and a curve 4120 corresponding to the predicted values from an exemplary Z-parameter model. The curve-fitting parameters (i.e., the parameters from Equation (20)) obtained from the measured $Z_{12}$ values were α=898.15 Ω and β=8.676×10$^4$ (1/m). By comparison, the value of β obtained from curve-fitting to three-dimensional simulation results for the Z-parameter model was about $8.3 \times 10^4$ (1/m). The $\alpha$ value was calculated by considering the two contacts as having zero separation between them and using Equation (19) to determine the value of $Z_{11}$ for the merged contact. The resulting $\alpha$ value was 824.37 $\Omega$, which is in good agreement with the measured value of 898.15 $\Omega$.

Figure 42:
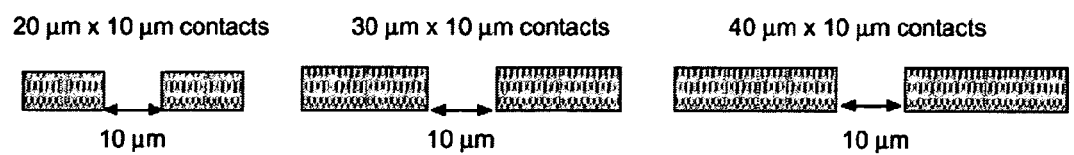
FIG. 42 is a block diagram schematically showing three exemplary pairs of contacts having a constant separation x and different contact sizes.
Figure 43:
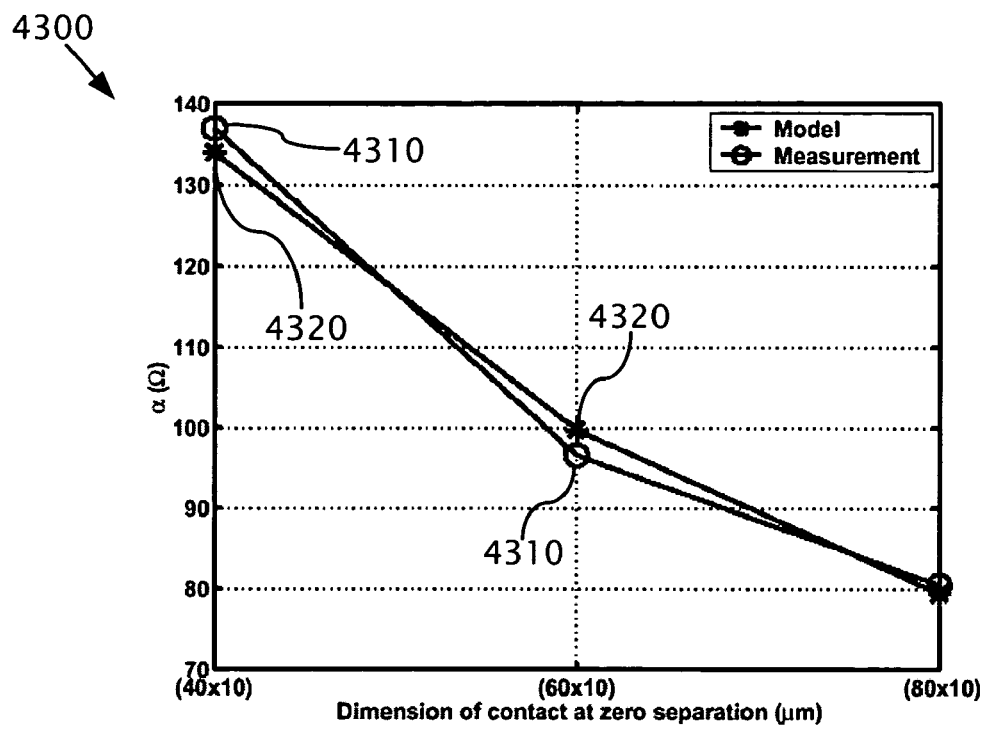
FIG. 43 is a graph of $\alpha$ versus contact dimension for the pairs of contacts shown in FIG. 42 showing values measured on a test chip and values predicted by an exemplary Z-parameter model.

The dependence of $\alpha$ on contact dimensions can also be verified through measurements taken on the test chip. FIG. 42 shows three different-sized pairs of contacts having a 10 µm separation. The values of a can be obtained from the ratio of $$\frac{Z_{12}}{e^{-\beta \times 10\,\mu m}}$$

where $\beta = 8.676 \times 10^4$ (1/m). FIG. 43 is a graph 4300 showing the value of a versus the dimensions of the contact when the separation x is zero. In particular, the graph 4300 shows data points 4310 obtained from measurements from the test chip and data points 4320 obtained using the exemplary Z-parameter model. FIG. 43 also shows that the value of $\alpha$ is equal to the value of $Z_{11}$ when the two contacts are merged.

Modeling Substrate Noise Coupling in Lightly Doped Substrates

Figure 44:
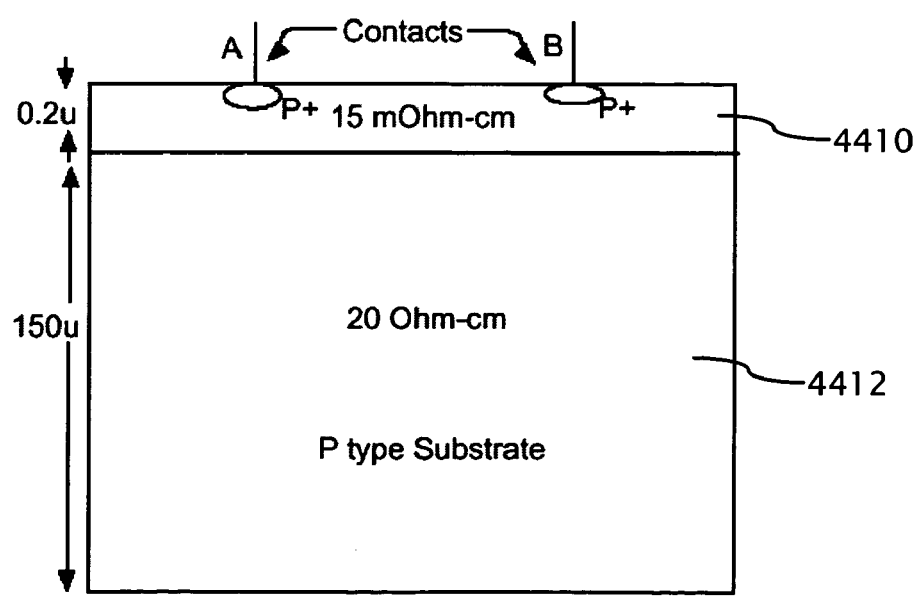
FIG. 44 is a block diagram schematically showing an exemplary lightly doped substrate.

In this section, the disclosed principles are adapted for use in modeling substrate noise coupling in a lightly doped substrate. For purposes of illustrating the disclosed Z-parameter models, reference is made to two exemplary lightly doped substrates. A first exemplary type of lightly doped substrate is illustrated in FIG. 44 and has two layers: a $p^+$ channel-stop implant 4410 and a uniform lightly doped layer 4412. The resistivities and thicknesses for these layers are also shown in FIG. 44. A second exemplary type of lightly doped substrate is similar to the first, but does not have the $p^+$ channel-stop implant layer. These substrate processes are used for illustrative purposes only and should not be construed as limiting in any way. Instead, the disclosed principles and methods can be applied to any lightly doped substrate process.

Figure 45A:
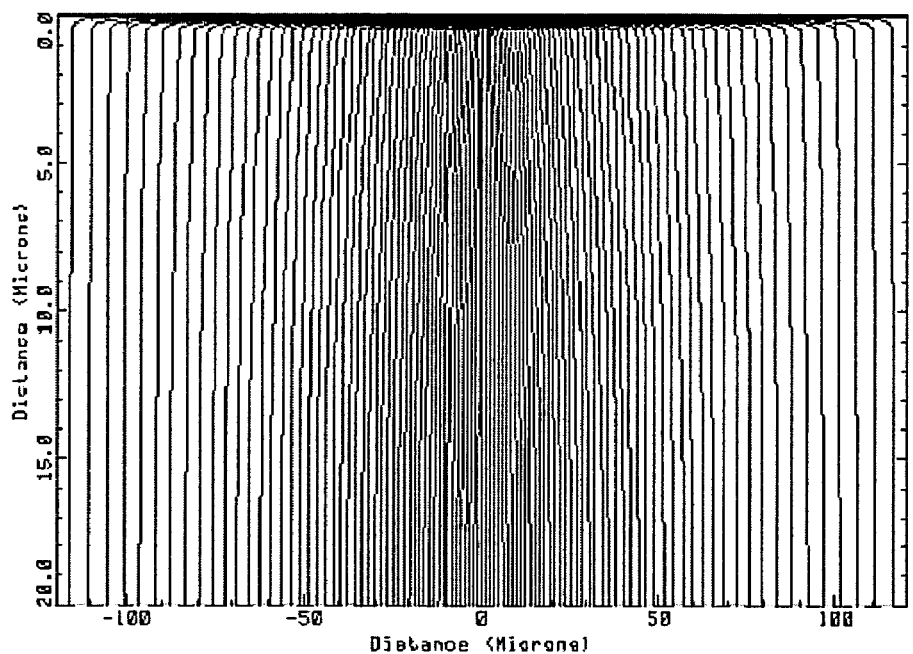
FIG. 45A is a first image showing current-flow lines from a simulator for an exemplary lightly doped substrate having a channel-stop implant layer.
Figure 45B:
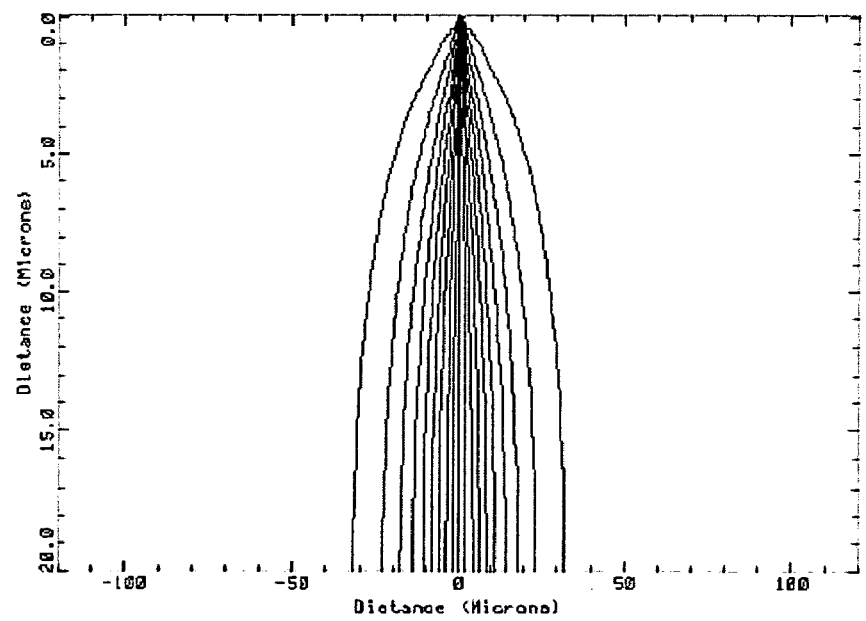
FIG. 45B is a second image showing current-flow lines from a simulator for an exemplary light doped substrate having no channel-stop implant layer.

In order to explain how various three-dimensional geometries influence the calculation of Z parameters for lightly doped substrates, an examination of a two-dimensional model for Z parameters is helpful. FIGS. 45A and 45B show two-dimensional simulated results of current flow from a single contact to a groundplane in the two exemplary substrates discussed above. In particular, FIG. 45A shows a substrate 4500 having a thin $p^+$ channel-stop implant layer followed by a lightly doped layer, and FIG. 45B shows a substrate 4510 having only a homogenous lightly doped layer. (In FIGS. 45A and 45B, a substrate thickness of 20 µm was used instead of 675 µm specified by the process information because of plotting limitations in the two-dimensional simulator.) As can been seen from FIG. 45A, the current-flow lines indicate that the $p^+$ channel-stop implant layer creates a low-resistance path for the current flow. Thus, the injected current first spreads over the surface before it flows to the grounded backplane. In this type of substrate, the resistive path from the contact to the backplane is dependent on the overall chip surface, not just the contact dimensions. By contrast, as can be seen from FIG. 45B, the current does not spread on the surface for a homogeneous lightly doped substrate, and thus $Z_{11}$ changes with contact width.

Figure 46:
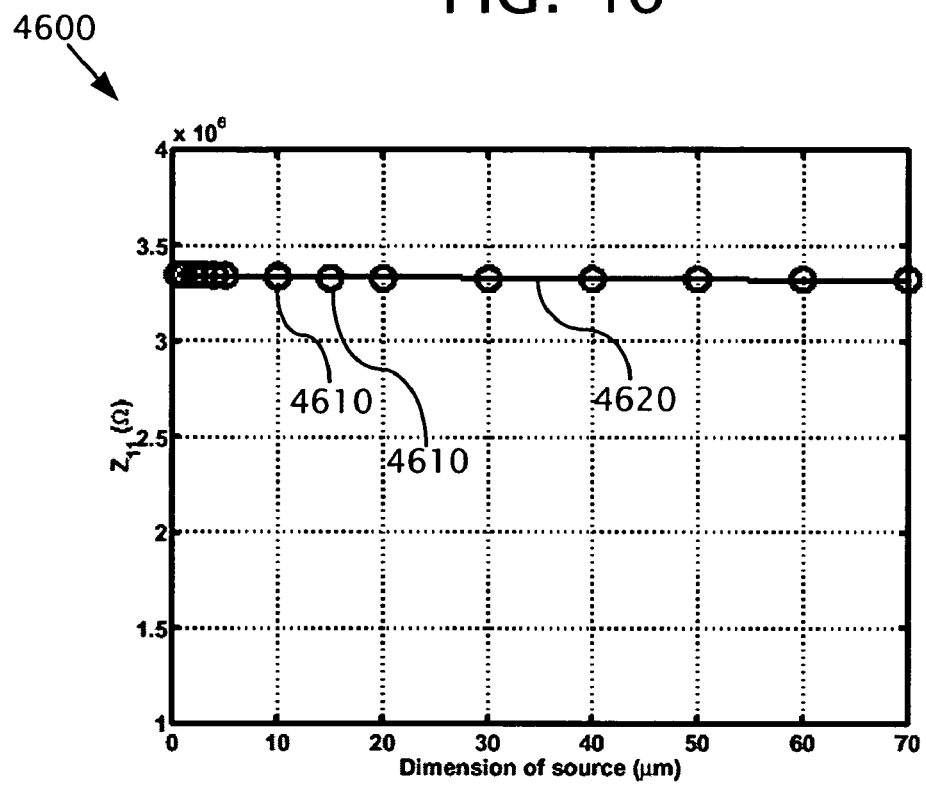
FIG. 46 is a graph of $Z_{11}$ as a function of contact dimensions showing values simulated in a two-dimensional simulator and values predicted by an exemplary Z-parameter model.
Figure 47:
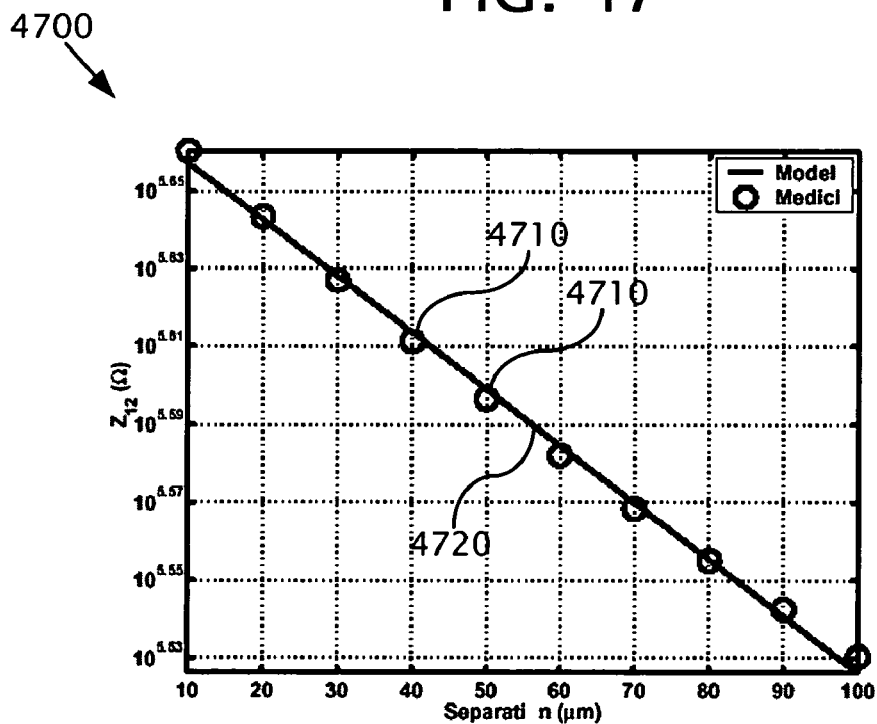
FIG. 47 is a logarithmic graph of $Z_{12}$ as a function of contact separation showing values simulated in a two-dimensional simulator and values predicted by an exemplary Z-parameter model.

To further illustrate this point, FIG. 46 is a graph 4600 of $Z_{11}$ as a function of the contact width for the lightly doped substrate having a channel-stop implant layer and obtained using a two-dimensional simulator. In particular, data points 4610 show values of $Z_{11}$ extracted from simulations. As can be seen from curve 4620, which is interpolated from the data points 4610, $Z_{11}$ stays constant with contact width. FIG. 47 is a logarithmic graph 4700 of $Z_{12}$ as a function of the separation x between an injecting and a sensing contact. As can be seen in FIG. 47, data points 4710 decrease linearly with the separation x. This linear behavior indicates that, in the two-dimensional environment, $Z_{12}$ in lightly doped substrates decreases exponentially with the separation as it does in heavily doped substrates. Thus, the data points 4710 from FIG. 47 can be represented as an exponential function of the separation x. For example, a curve fit on the data from FIGS. 46 and 47 shows that $Z_{12}$ in lightly doped substrates can be modeled as:

$$Z_{12} = \alpha e^{-\beta x} \tag{32}$$

where $\alpha$ and $\beta$ are process-dependent parameters that can be extracted using a simulator. FIG. 47 also shows a curve 4720, which was modeled using Equation (32), and which shows good agreement with the data points 4710. FIG. 47 also illustrates that the value of $Z_{12}$ changes at a small rate with separation. Consequently, the value of $\beta$ is smaller for lightly doped substrates than for heavily doped substrates.

Figure 48:
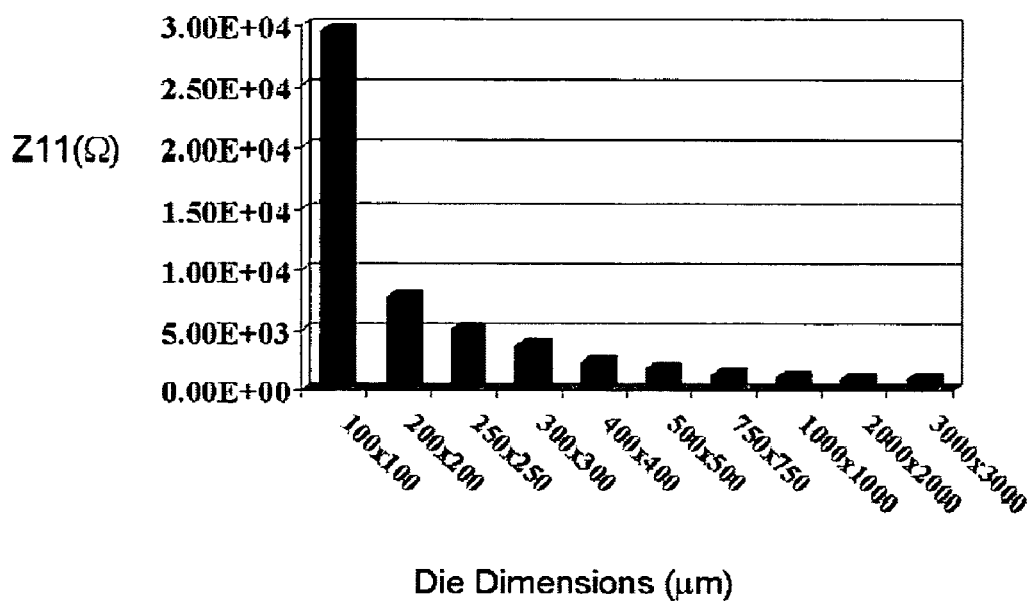
FIG. 48 is a bar graph illustrating the dependence of $Z_{11}$ on die dimension in an exemplary lightly doped substrate.
Figure 49:
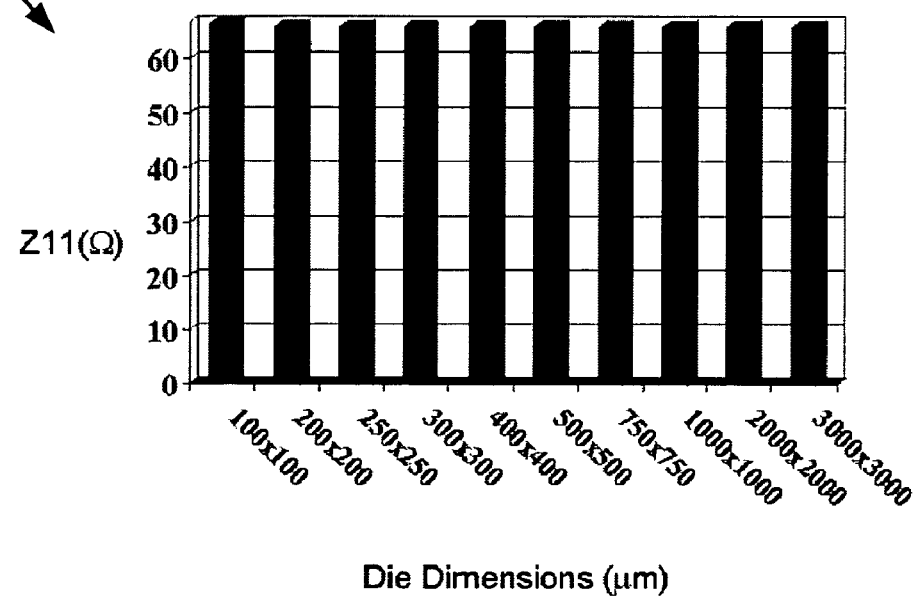
FIG. 49 is a bar graph illustrating the dependence of $Z_{11}$ on die dimension in an exemplary heavily doped substrate.

As shown in FIG. 45A, the $p^+$ channel-stop implant layer in a lightly doped substrate causes current spreading on the chip surface. Consequently, $Z_{11}$ can also be a function of the chip area in certain lightly doped substrates. Discontinuities in the channel-stop implant layer due to n-well structures can prevent the current flow on the chip surface. Thus, the effective chip area for a contact can be smaller than the overall chip area. FIG. 48 is a bar graph 4800 illustrating the simulated dependence of $Z_{11}$ on die area in lightly doped substrates when the contact size is kept constant at 50 µm×50 µm. By contrast, FIG. 49 is a bar graph 4900 illustrating that there is no dependence of $Z_{11}$ on die area in heavily doped substrates.

One of the shortcomings of a two-dimensional device simulator (e.g., MEDICI) is that only the width of the contacts is taken into account during simulations. In a typical two-dimensional simulator, the third dimension of the contact is assumed to be infinitely long for a given contact width. As was seen in FIG. 49, differences in die area do not create a significant impact for heavily doped substrates. As was seen in FIG. 48, however, chip area can have a significant impact for lightly doped substrates.

Figure 50:
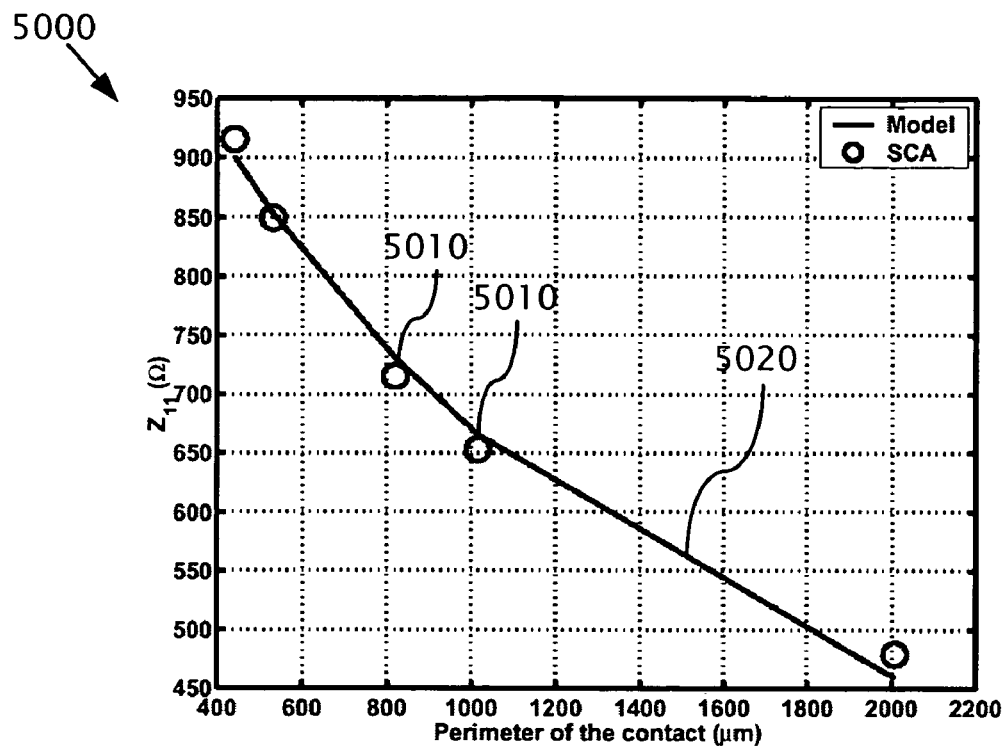
FIG. 50 is a graph of $Z_{11}$ as a function of contact dimensions showing values simulated in a three-dimensional simulator and values predicted by an exemplary Z-parameter model.

FIG. 50 is a graph 5000 illustrating the value of $Z_{11}$ as a function of contact perimeter for a constant die area. As can be seen by curve 5020, which passes through simulated data points 5010, the value of $Z_{11}$ does have a dependence on contact size, a result that was not predicted by the two-dimensional simulators.

A curve fit to the simulated results shows that $Z_{11}$ in a lightly doped substrate can be modeled as:

$$Z_{11} = \frac{1}{K_1 \text{Perimeter} + K_2}. \tag{33}$$

Moreover, in certain embodiments, die-area and contact-area dependence can be incorporated into the $Z_{11}$ model.

Figure 51:
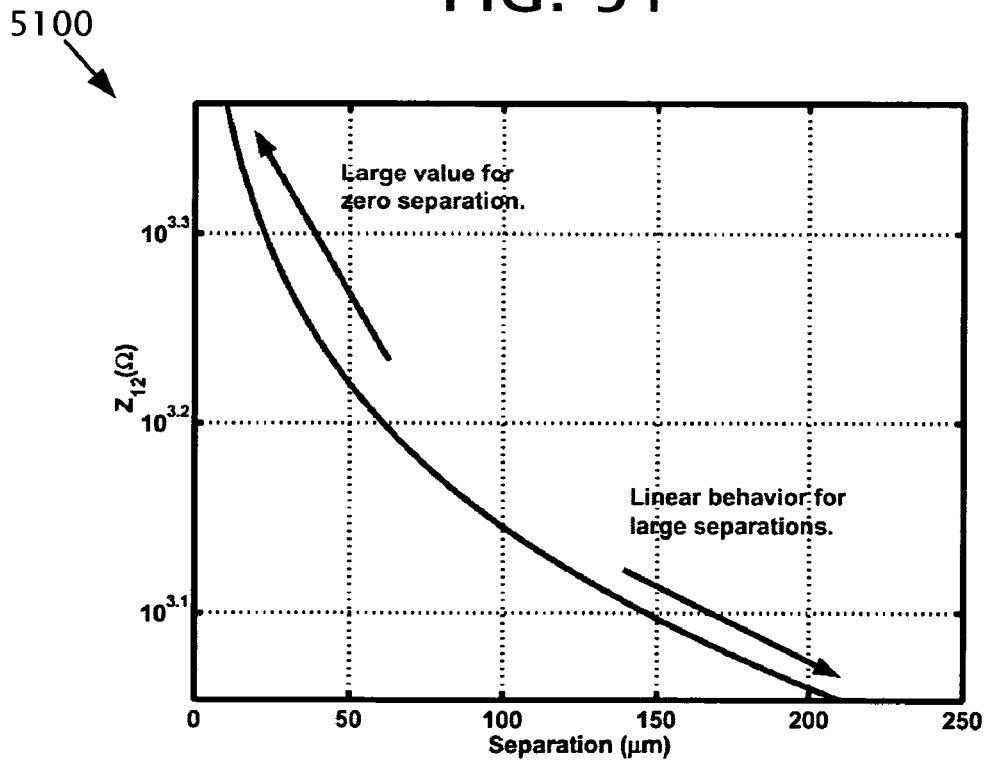
FIG. 51 is a logarithmic graph of $Z_{12}$ as a function of contact separation showing values simulated in a three-dimensional simulator.

Three-dimensional simulations for lightly doped substrates also show a different behavior for $Z_{12}$ than that predicted by the two-dimensional simulations. FIG. 51 is a logarithmic graph 5100 showing the value of $Z_{12}$ as a function of separation x for a lightly doped substrate. FIG. 51 indicates that $Z_{12}$ should be modeled such that $\log(Z_{12})$ is linear for larger separations and has asymptotic-like behavior for separations approaching zero. In one embodiment, for instance, a 0th order modified Bessel function of second kind, $K_0(x)$, is used to model $Z_{12}$. In this embodiment, the leading term in the asymptotic expansion of $K_0(x)$ for large x is:

$$\sqrt{\frac{\pi}{2x}} e^{-x}. \tag{34}$$

The logarithm of Equation (34) is equal to:

$$\log(K_0(x)) = -x + \log\left(\sqrt{\frac{\pi}{2}}\right) - \frac{1}{2}\log(x). \tag{35}$$

And for large x, $$\frac{\log(x)}{x} \ll 1. \tag{36}$$

Figure 52:
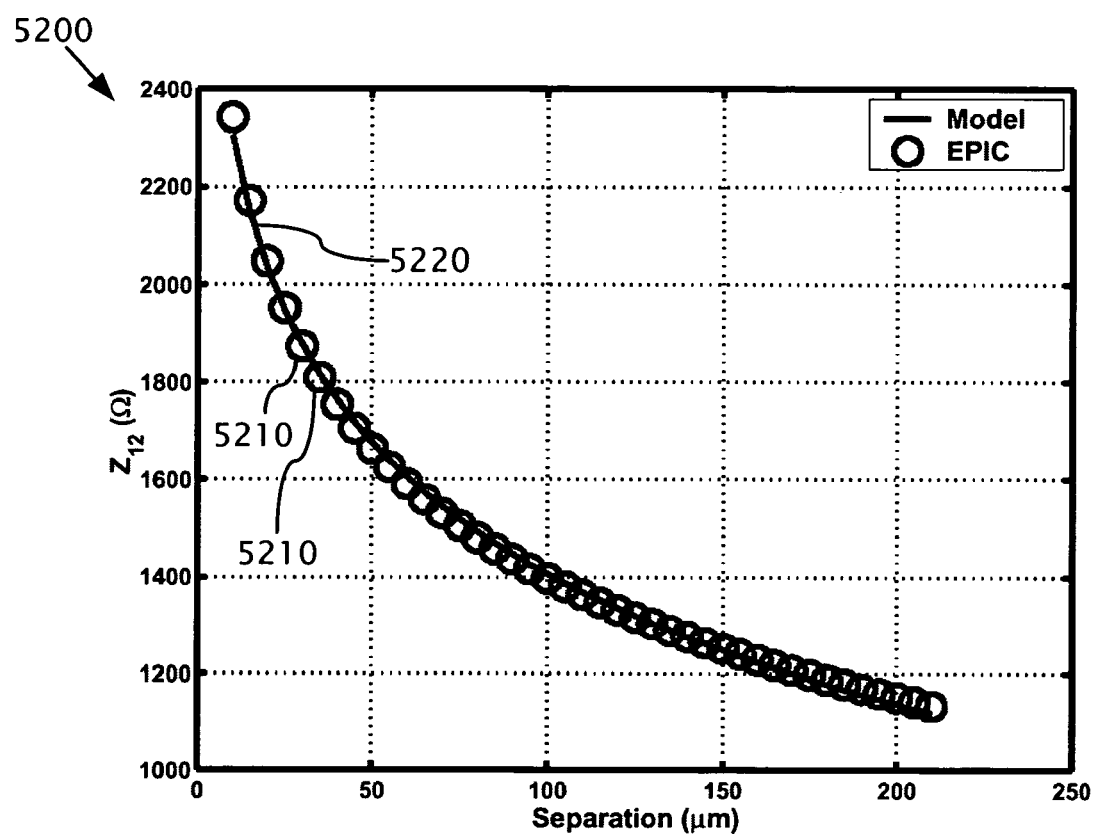
FIG. 52 is a graph of $Z_{12}$ as a function of contact separation showing values simulated in a two-dimensional simulator and values predicted by an exemplary Z-parameter model.

Hence, in Equation (34), log(x) can be neglected with respect to x and log $$\left(\sqrt{\frac{\pi}{2}}\right)$$

is a constant term. Therefore, the logarithm of $K_0(x)$ changes linearly with the separation for large separations. Based on these observations, in one exemplary embodiment, $Z_{12}$ in lightly doped substrates can be modeled as:

$$Z_{12}(x) = \alpha K_0(\beta x) \tag{37}$$

where α and β are process-dependent parameters. These parameters can be extracted, for example, from a three-dimensional simulator or any other suitable method. FIG. 52 is a graph 5200 showing $Z_{12}$ as a function of separation x for a lightly doped substrate. Data points 5210 were found using a three-dimensional simulator, whereas curve 5220 was modeled by Equation (37). As can be seen from FIG. 52, the disclosed model is in good agreement with the simulated results.

Having illustrated and described the principles of the illustrated embodiments, it will be apparent to those skilled in the art that the embodiments can be modified in arrangement and detail without departing from such principles. For example, the disclosed methods for substrate modeling are not limited to using Z parameters, but can be modified to use other network parameters instead (e.g., S parameters). In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. A method of substrate modeling, comprising:
   determining scalable Z parameters associated with at least two substrate contacts;
   constructing a matrix of the scalable Z parameters for the at least two substrate contacts;
   calculating an inverse of the matrix to determine resistance values associated with the at least two substrate contacts; and
   storing the resistance values as part of a representation of a substrate-coupling resistance network.

2. The method of claim 1, wherein the number of contacts is N, and the matrix is an N×N matrix.

3. The method of claim 1, wherein the substrate is a doped substrate.

4. The method of claim 1, wherein, for a first contact and a second contact of the at least two contacts, the determining comprises:
   dividing the first contact into smaller portions; and
   determining respective Z parameters between the smaller portions and the second contact.

5. The method of claim 4, wherein the smaller portions are rectangular or square portions.

6. The method of claim 1, wherein, for a first contact and a second contact of the at least two contacts, three scalable Z parameters are determined.

7. The method of claim 6, wherein a first of the scalable Z parameters is a ratio of an open-circuit voltage at the first contact to an input current at the first contact, a second of the scalable Z parameters is a ratio of an open-circuit voltage at the second contact to an input current at the second contact, and a third of the scalable Z parameters is a ratio of an open-circuit voltage at the first contact to a source current at the second contact.

8. The method of claim 1, wherein at least one of the scalable Z parameters is a function of contact area and contact perimeter.

9. The method of claim 1, wherein at least one of the scalable Z parameters is a function of contact geometry and contact separation.

10. The method of claim 1, wherein the scalable Z parameters comprise a first set of scalable Z parameters associated with resistances between the at least two substrate contacts and a groundplane and a second set of scalable Z parameters associated with cross-coupling resistances between the at least two substrate contacts.

11. The method of claim 10, wherein the scalable Z parameters of the first set are based on a first model equation and the scalable Z parameters of the second set are based on a second model equation.

12. The method of claim 11, wherein the first model equation is $$Z = \frac{1}{K_1 \text{Area} + K_2 \text{Perimeter} + K_3},$$

wherein Z is a ratio of an open-circuit voltage to input current for a selected contact with other contacts being open circuits, Area is an area of the selected contact, Perimeter is a perimeter of the selected contact, and $K_1$, $K_2$, and $K_3$ are parameters that are dependent on substrate properties.

13. The method of claim 12, wherein $K_1$, $K_2$, and $K_3$ are determined by curve fitting to data points obtained from a simulation or measurements of a test chip.

14. The method of claim 11, wherein the substrate is a doped substrate, and the first model equation is $$Z = \frac{1}{K_1 \text{Perimeter} + K_2},$$

wherein Z is a ratio of an open-circuit voltage to an input current for a selected contact with other contacts being open circuits, Perimeter is a perimeter of the selected contact, and $K_1$ and $K_2$ are parameters that are dependent on substrate properties.

15. The method of claim 14, wherein $K_1$ and $K_2$ are determined by curve fitting to data points obtained from a simulation or measurements of a test chip.

16. The method of claim 11, wherein the second model equation for a selected pair of contacts having a fixed relative position y is $$Z = \alpha e^{-\beta x},$$

wherein Z is a ratio of an open-circuit voltage at a first contact to a source current at a second contact, x is a separation between the first contact and the second contact, $\alpha$ is a value of Z when x is zero, and $\beta$ is a parameter that is dependent on substrate properties.

17. The method of claim 16, wherein the first contact and the second contact of the selected pair of contacts have a same contact size.

18. The method of claim 16, wherein $\beta$ is determined by curve fitting to data points obtained from a simulation or measurements of a test chip.

19. The method of claim 11, wherein the second model equation for a selected pair of contacts having a fixed separation x is $$Z = ay^2 + by + c,$$

wherein Z is a ratio of an open-circuit voltage at a first contact to a source current at a second contact, y is a relative position between the first contact and the second contact, and a, b, and c are scalable parameters that substantially depend on contact dimensions.

20. The method of claim 19, wherein a size of the first contact is different than a size of the second contact.

21. The method of claim 19, wherein at least one of the parameters a, b, or c is determined by curve fitting to data points obtained from a simulation or measurements of a test chip.

22. The method of claim 11, wherein the second model equation for a selected pair of contacts is $$Z = [ay^2 + by + c] e^{-\beta(x - x_a)},$$

wherein Z is a ratio of an open-circuit voltage at a first contact to a source current at a second contact, y is a relative position between the first contact and the second contact, a, b, and c are scalable parameters for the substrate that depend on contact dimensions, x is a separation between the first contact and the second contact, $x_a$ is a value of x used in determining a, b, and c, and $\beta$ is a parameter that is dependent on substrate properties.

23. The method of claim 22, wherein a size of the first contact is different than a size of the second contact.

24. The method of claim 22, wherein at least one of the parameters a, b, c or $\beta$ is determined by curve fitting to data points obtained from a simulation or measurements of a test chip.

25. The method of claim 11, wherein the substrate is a doped substrate, and the second model equation for a selected pair of contacts having a fixed relative position y is $$Z = \alpha K_0(\beta x),$$

wherein Z is a ratio of an open-circuit voltage at a first contact to a source current at a second contact, $K_0$ is a 0th-order Bessel function of the second kind, x is a separation between the first contact and the second contact, and $\alpha$ and $\beta$ are parameters that are dependent on substrate properties.

26. The method of claim 11, wherein the substrate is a doped substrate and the second model equation for a selected pair of contacts predicts a value Z as a function of a separation x between the first contact and the second contact, wherein Z is a ratio of an open-circuit voltage at a first contact to a source current at a second contact, and log(Z) has a linear behavior when x is greater than a certain value and an asymptotic-like behavior when x is less than the certain value.

27. A computer-readable medium storing computer-executable instructions for causing a computer system to perform the method of claim 1.

28. The method of claim 1, further comprising:
determining substrate noise coupling in the substrate network design using the resistance values; and
modifying a substrate network design in response to the substrate noise coupling determined.

29. A method of substrate modeling, comprising:
determining scalable parameters associated with at least two substrate contacts, at least one of the scalable parameters being scalable with a contact perimeter;
constructing a matrix of the scalable parameters for the at least two substrate contacts;
calculating an inverse of the matrix to determine resistance values associated with the at least two substrate; and
storing the resistance values as part of a representation of a substrate-coupling resistance network.

30. The method of claim 29, wherein the scalable parameters are Z parameters.

31. The method of claim 29, wherein at least one of the scalable parameters is scalable with a contact separation.

32. The method of claim 29, wherein the scalable parameters comprise a first set of scalable parameters associated with resistances between the at least two substrate contacts and a groundplane and a second set of scalable parameters associated with cross-coupling resistances between the at least two substrate contacts.

33. The method of claim 29, wherein the number of contacts is N, and the matrix is an N×N matrix.

34. A computer-readable medium storing computer-executable instructions for causing a computer system to perform the method of claim 29.

35. The method of claim 29, further comprising:
determining substrate noise coupling in the substrate network design using the resistance values; and
modifying a substrate network in response to the substrate noise coupling determined.

36. A method of substrate modeling, comprising:
determining scalable parameters associated with at least three substrate contacts;

constructing a matrix of the scalable parameters representative of the at least three substrate contacts;
calculating resistance values associated with the at least three substrate contacts from the matrix; and
storing the resistance values as part of a representation of a substrate-coupling resistance network.

37. The method of claim 36, wherein the scalable parameters are Z parameters.

38. A computer-readable medium storing computer-executable instructions for causing a computer system to perform the method of claim 36.

39. The method of claim 36, further comprising:
determining substrate noise coupling in the substrate network design using the resistance values; and
modifying the substrate design in response to the substrate noise coupling determined.

40. A method, comprising:
determining a scalable Z parameter for a contact in a substrate network design, the scalable Z parameter being associated with a resistance between the contact and a groundplane, the act of determining the scalable Z parameter including,
modeling the Z parameter as a function of contact area and contact perimeter, the function comprising at least one coefficient that is dependent on properties of the substrate,
obtaining a plurality of sample data points for the Z parameter in the substrate, the sample data points being obtained for a range of contact sizes,
determining values of the multiple coefficients such that the function produces a curve that fits the sample data points; and
storing the scalable Z parameter.

41. The method of claim 40, wherein the range of contact sizes is from about 2.4 $\mu m^2$ to about 100 $\mu m^2$.

42. The method of claim 40, wherein the contacts are square or rectangular.

43. The method of claim 40, wherein at least a portion of the sample data points are obtained from a simulation or a measurement.

44. The method of claim 40, wherein the function is $$Z = \frac{1}{K_1 \text{Area} + K_2 \text{Perimeter} + K_3},$$

wherein Z is a ratio of an open-circuit voltage to input current for the contact with all other contacts in the substrate being open circuits, Area is the contact area, Perimeter is the contact perimeter, and $K_1$, $K_2$, and $K_3$ are coefficients that are dependent on the properties of the substrate.

45. A computer-readable medium storing computer-executable instructions for causing a computer system to perform the method of claim 40.

46. The method of claim 40, further comprising:
determining substrate noise coupling in the substrate network design using the Z parameter; and
modifying the substrate design in response to the substrate noise coupling determined.

47. A method, comprising:
determining a sealable Z parameter for a pair of contacts in a substrate network design, the scalable Z parameter being associated with a cross-coupling resistance between a first contact and a second contact of the pair of contacts, the act of determining the sealable Z parameter comprising,
modeling the Z parameter as a function of a separation x between the first contact and the second contact, the function comprising multiple coefficients, at least one of the multiple coefficients being dependent on properties of the substrate,
obtaining a plurality of sample data points for the Z parameter, the sample data points being obtained for a range of separations x between the first contact and the second contact, and
determining values of the multiple coefficients such that the function produces a curve that fits the sample data; and
storing the scalable Z parameter.

48. The method of claim 47, wherein the first contact and the second contact have a same contact size.

49. The method of claim 47, wherein the range of separations x comprises values of x equal to or greater than 10 $\mu m$.

50. The method of claim 47, wherein the range of separations x is from 10 $\mu m$ to 120 $\mu m$.

51. The method of claim 47, wherein at least a portion of the sample data points are obtained from a simulation or a measurement.

52. The method of claim 47, wherein the function is $$Z = \alpha e^{-\beta x},$$

wherein Z is a ratio of an open-circuit voltage at the first contact to a source current at the second contact, $\alpha$ is a value of Z for $x_0$, and $\beta$ is a coefficient that is dependent on the properties of the substrate.

53. The method of claim 52, wherein $\alpha$ is determined from $$\alpha = \frac{1}{K_1 \text{Area} + K_2 \text{Perimeter} + K_3},$$

wherein Area is a combined contact area, Perimeter is a perimeter of the combined contact, and $K_1$, $K_2$, and $K_3$ are coefficients that are dependent on the properties of the substrate.

54. The method of claim 53, wherein $K_1$, $K_2$, and $K_3$ are determined by curve fitting $\alpha$ to a plurality of data points obtained for a range of different Area and Perimeter values.

55. A computer-readable medium storing computer-executable instructions for causing a computer system to perform the method of claim 47.

56. The method of claim 47, further comprising:
determining substrate noise coupling in the substrate network design using the Z parameter; and
modifying the substrate design in response to the substrate noise coupling determined.

57. A method, comprising:
determining a scalable Z parameter for a pair of contacts in a substrate network design, the scalable Z parameter being associated with a cross-coupling resistance between a first contact and a second contact of the pair of contacts, the act of determining the scalable Z parameter comprising,
modeling the Z parameter as a function of a relative position y between the first contact and the second contact, the first contact having a greater dimension than the second contact along a y axis, the function comprising multiple coefficients, at least one of the multiple coefficients being scalable with dimensions of the first contact, obtaining a plurality of sample data points for the Z parameter, the sample data points being calculated for a range of positions y of the second contact relative to the first contact, and determining values of the multiple coefficients such that the function produces a curve that fits the sample data points; and storing the scalable Z parameter.

58. The method of claim 57, wherein the range of positions y is from zero to a length of the first contact along its y axis.

59. The method of claim 58, wherein the plurality of data points are obtained for a contact having an area between about 2.4 $\mu m^2$ and 100 $\mu m^2$.

60. The method of claim 57, wherein at least a portion of the sample data points are obtained from a simulation or a measurement.

61. The method of claim 57, wherein the function is $$Z=ay^2+by+c,$$

wherein Z is a ratio of an open-circuit voltage at the first contact to a source current at the second contact, y is a relative position between the first contact and the second contact, and a, b, and c are scalable coefficients for the substrate that depend on contact dimensions.

62. The method of claim 61, wherein c is found by:

$$c=\alpha e^{-\beta x_a}$$

wherein $\alpha$ is a value of Z for $x_0$, $\beta$ is a coefficient that is dependent on substrate properties, and $x_a$ is a separation between the first contact and the second contact.

63. The method of claim 61, wherein the pair of contacts is an original pair of contacts, and a, b, and c are scaleable for a new pair of contacts by a ratio of $\alpha_{new}/\alpha$, where $\alpha_{new}$ is a value of $\alpha$ for the new pair of contacts and $\alpha$ is a value of $\alpha$ for the original pair of contacts.

64. A computer-readable medium storing computer-executable instructions for causing a computer system to perform the method of claim 57.

65. The method of claim 57, further comprising:
determining substrate noise coupling in the substrate network design using the Z parameter; and
modifying the substrate design in response to the substrate noise coupling determined.

66. A method, comprising:
determining a scalable Z parameter for a pair of contacts in a substrate network design, the Z parameter being associated with a cross-coupling resistance between a first contact and a second contact of the pair of contacts, the act of determining the scalable Z parameter comprising, modeling the scalable Z parameter as a function of a separation x between the first contact and the second contact and as a function of a relative position y between the first contact and the second contact, the first contact having a greater dimension than the second contact along a y axis, the function comprising multiple coefficients, at least one of the multiple coefficients being scalable with dimensions of the first contact, and at least one of the multiple coefficients being dependent on substrate properties, obtaining a first set of sample data points for the Z parameter, the first set of sample data points being obtained for a range of relative positions y of the second contact relative to the first contact for a fixed separation x, obtaining a second set of sample data points for the Z parameter, the second set of sample data points being obtained for a range of separations x for a fixed relative position y of the second contact, and determining values of the multiple coefficients such that the function produces a curve that fits the sample data points; and storing the scalable Z parameter.

67. The method of claim 61, wherein the function is $$Z=[ay^2+by+c]e^{-\beta(x-x_a)},$$

wherein Z is a ratio of the op en-circuit voltage at the first contact to the source current at the second contact, y is a relative position between the first contact and the second contact, a, b, and c are scalable parameters for the substrate that depend on contact dimensions, x is a separation between the first contact and the second contact, $x_a$ is a value of x used in determining a, b, and c, and $\beta$ is a coefficient that is dependent on the properties of the substrate.

68. A computer-readable medium storing computer-executable instructions for causing a computer system to perform the method of claim 66.

69. The method of claim 61, further comprising:
determining substrate noise coupling in the substrate network design using the Z parameter; and
modifying the substrate network design in response to the substrate noise coupling determined.

* * * * *